US012610196B2

(12) United States Patent
Sung et al.

(10) Patent No.: US 12,610,196 B2
(45) Date of Patent: Apr. 21, 2026

(54) VIBRATION DEVICE AND APPARATUS COMPRISING SAME

(71) Applicant: LG Display Co., Ltd., Seoul (KR)

(72) Inventors: Seunghyun Sung, Paju-si (KR); YongWoo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 846 days.

(21) Appl. No.: 17/975,760

(22) Filed: Oct. 28, 2022

(65) Prior Publication Data

US 2023/0158546 A1 May 25, 2023

(30) Foreign Application Priority Data

Nov. 25, 2021 (KR) ........................ 10-2021-0164145

(51) Int. Cl.

| | |
|---|---|
| ***H04R 17/00*** | (2006.01) |
| ***B06B 1/06*** | (2006.01) |
| ***H04R 17/10*** | (2006.01) |
| ***H10N 30/20*** | (2023.01) |
| ***H10N 30/50*** | (2023.01) |
| ***H10N 30/87*** | (2023.01) |

(52) U.S. Cl.

CPC ........... *H04R 17/00* (2013.01); *B06B 1/0629* (2013.01); *H04R 17/10* (2013.01); *H10N 30/2023* (2023.02); *H10N 30/50* (2023.02); *H10N 30/874* (2023.02); *H04R 2499/15* (2013.01)

(58) Field of Classification Search

CPC .... H04R 17/00; H04R 17/10; H04R 2499/15; H04R 7/04; H04R 17/005; H04R 2440/05; H04R 2499/13; H04R 9/06; H04R 9/02; H04R 2400/11; H04R 1/028; H04R 7/045; H04R 2307/023; H04R 2307/025; B06B 1/0629; B06B 1/0622; B06B 1/0607; H10N 30/2023; H10N 30/50; H10N 30/874; H10N 30/088; H10N 30/852

USPC .......................................................... 310/328

See application file for complete search history.

(56) References Cited

U.S. PATENT DOCUMENTS

| | | | | |
|---|---|---|---|---|
| 11,776,519 B2 * | 10/2023 | Kho | ...................... | H04R 7/045 381/152 |
| 12,314,628 B2 * | 5/2025 | Ham | ...................... | G10K 9/125 |
| 2020/0314556 A1 | 10/2020 | Lee et al. | | |

(Continued)

FOREIGN PATENT DOCUMENTS

| | | |
|---|---|---|
| CN | 113126340 A | 7/2021 |
| CN | 113471356 A | 10/2021 |

(Continued)

OTHER PUBLICATIONS

Office Action dated Jun. 24, 2024 issued in corresponding Japanese Patent Application No. 2022-176769. (Note: JP 2021-163765 A, JP H04-097700 A and JP 2020-167655 A were previously cited).

(Continued)

*Primary Examiner* — Jorge L Salazar, Jr.

(74) *Attorney, Agent, or Firm* — Morgan, Lewis & Bockius LLP

(57) ABSTRACT

An apparatus may include a vibration member and a vibration device configured to vibrate the vibration member. The vibration device may be configured to comprise a first vibration portion and a second vibration portion which is different from the first vibration portion.

33 Claims, 28 Drawing Sheets

(56) References Cited

U.S. PATENT DOCUMENTS

| | | | |
|---|---|---|---|
| 2021/0200503 | A1 | 7/2021 | Lee et al. |
| 2021/0304722 | A1 | 9/2021 | Kho et al. |
| 2021/0304920 | A1 | 9/2021 | Ko et al. |
| 2021/0352390 | A1 | 11/2021 | Lee et al. |

FOREIGN PATENT DOCUMENTS

| | | | |
|---|---|---|---|
| CN | 113473338 | A | 10/2021 |
| EP | 3890349 | A1 | 10/2021 |
| JP | H04-097700 | A | 3/1992 |
| JP | 2020-167655 | A | 10/2020 |
| JP | 2021-159917 | A | 10/2021 |
| JP | 2021-163765 | A | 10/2021 |
| JP | 2021-180486 | A | 11/2021 |

OTHER PUBLICATIONS

Office Action dated Dec. 27, 2023 for Japanese Patent Application No. 2022-176769.

Office Action of GB Application No. 2215934.7, dated Mar. 9, 2023, 6 pages.

Office Action issued in corresponding Chinese Patent Application No. 202211349726.7, dated May 23, 2025. (Note: JP H04-097700 A was previously cited.).

* cited by examiner

30: 30-1, 30-2, 30-3
30-2: 31H ~ 31L

32: 32A ~ 32L
30-3: 31M ~ 31P

34: 34A ~ 34D
32B: 32B1 ~ 32B3

30-1: 31A ~ 31G
32D: 32D1 ~ 32D4

⬤ : WS

30: 30-1, 30-2, 30-3　30-1: 31A, 31B, 31D. 31F, 31D1　30-2: 31H, 31I, 31K, 31L 30-3: 31M, 31N　32: 32A, 32B, 32F, 32H, 32K, 32L　32B: 32B1, 32B2

32L: 32L1, 32L2　34: 34B　34B: 34B1, 34B2

30: 30-1, 30-3 30-1: 31D, 31D1 32: 32D 30-3: 31N 34: 34B

30: 30-1, 30-2, 30-3 30-1: 31C 30-2: 31I, 31L 30-3: 31P

32: 32C, 32I, 32L 32L: 32L1, 32L2 34: 34B, 34D

30: 30-1, 30-3 30-1: 31C, 31E 31C: 31C1 30-3: 31N

32: 32C, 32E 32E: 32E2, 32E3 34: 34B 34B: 34B3, 34B4:

VIBRATION DEVICE AND APPARATUS COMPRISING SAME

CROSS-REFERENCE TO RELATED APPLICATIONS

This application claims the benefit of and priority to Korean Patent Application No. 10-2021-0164145 filed on Nov. 25, 2021, the entirety of which is incorporated herein by reference for all purposes.

BACKGROUND

1. Technical Field

The present disclosure relates to an apparatus and particularly to, for example, without limitation, a vibration apparatus.

2. Discussion of the Related Art

Apparatuses may include a separate speaker or a sound apparatus for providing a sound. When a speaker is disposed in an apparatus, the speaker occupies a space, and consequently, the design and spatial disposition of the apparatus are limited.

A speaker applied to the apparatus may be, for example, an actuator, including a magnet and a coil. However, when an actuator is applied to the apparatus, a thickness thereof is thickened. Therefore, piezoelectric elements for realizing a thin thickness are attracting much attention.

Because piezoelectric elements have a fragile characteristic, the piezoelectric elements are easily damaged due to an external impact, and consequently, have a problem where reliability is low in sound reproduction. Further, when a speaker such as a piezoelectric element or the like is applied to a flexible apparatus, there is a problem where damages may occur due to a fragile characteristic.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

The inventors of the present disclosure have recognized the problems and disadvantages of the related art and have performed extensive research and experiments for implementing a vibration device for enhancing the quality of a sound and a sound pressure level characteristic. Through the extensive research and experiments, the inventors of the present disclosure have invented an apparatus having a new structure, which includes a vibration device for enhancing the quality of a sound and a sound pressure level characteristic. Accordingly, embodiments of the present disclosure are directed to providing an apparatus that substantially obviates one or more problems due to limitations and disadvantages of the related art.

One or more aspects of the present disclosure are directed to providing an apparatus which vibrates a vibration member to generate a sound or a vibration and have enhanced a sound characteristic and/or a sound pressure level characteristic.

Additional features, advantages, and aspects of the present disclosure are set forth in the present disclosure and will also be apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the appended drawings.

To achieve these and other advantages and aspects of the present disclosure, as embodied and broadly described herein, in one or more aspects, an apparatus according to one or more embodiments of the present disclosure may comprise a vibration member and a vibration device configured to vibrate the vibration member. The vibration device may be configured to comprise a first vibration portion and a second vibration portion which is different from the first vibration portion.

In one or more aspects, an apparatus according to one or more example embodiments of the present disclosure may comprise a vibration member, including first to $n^{th}$ regions, where n of the first to $n^{th}$ regions is a natural number of 2 or more. The apparatus may further comprise a vibration generating apparatus disposed on or at a rear surface of the vibration member to vibrate the vibration member. The vibration generating apparatus may comprise first to $n^{th}$ vibration devices connected to the first to $n^{th}$ regions of the vibration member, respectively, where n of the first to $n^{th}$ vibration devices is a natural number of 2 or more. Each of the first to $n^{th}$ vibration devices may comprise a first vibration portion and a second vibration portion which is different from the first vibration portion. One or more of the first to $n^{th}$ regions of the vibration member may be configured to output a sound having a pitched sound band which is different from a pitched sound band of a sound output from other one or more regions of the first to $n^{th}$ regions of the vibration member.

In one or more aspects, an apparatus according to one or more example embodiments of the present disclosure may comprise an exterior material covering a main structure of a vehicular apparatus, an interior material covering one or more of the main structure and the exterior material, and one or more vibration generating apparatuses disposed at one or more among a region between the main structure and the exterior material, a region between the main structure and the interior material, the exterior material, and the interior material. The one or more vibration generating apparatuses may comprise a first vibration portion and a second vibration portion which is different from the first vibration portion. The apparatus may further comprise a vibration member, which may be one or more of the exterior material and the interior material. One or more of the exterior material and the interior material may be configured to output sound based on vibrations of the one or more vibration generating apparatuses.

An apparatus according to one or more example embodiments of the present disclosure may include a vibration device which vibrates a display panel or a vibration member, and thus, may generate a sound so that a traveling direction of the sound of the apparatus is a direction toward a forward region in front of the display panel or the vibration member.

An apparatus according to one or more example embodiments of the present disclosure may be configured as a vibration device including a single crystal and a polycrystal, and thus, a sound characteristic and/or a sound pressure level characteristic of a low-pitched sound band may be complemented by a single crystal, thereby providing an apparatus having a sound characteristic and/or a sound pressure level characteristic of a uniform pitched sound band.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles of the disclosure.

Figure 1:
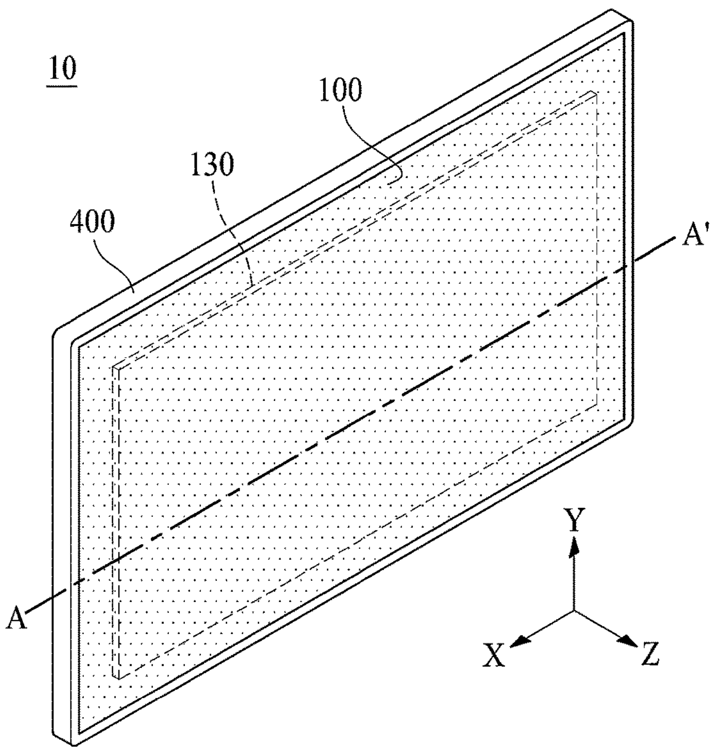
FIG. 1 illustrates an apparatus according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

The shapes, sizes, areas, ratios, angles, numbers, and the like disclosed in the drawings for describing embodiments of the present disclosure are merely examples, and thus, the present disclosure is not limited to the illustrated details.

When the term “comprise,” “have,” “include,” “contain,” “constitute,” “make up of,” “formed of,” or the like is used, one or more other elements may be added unless a term such as “only” or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word “exemplary” is used to mean serving as an example or illustration. Embodiments are example embodiments. Aspects are example aspects. Any implementation described herein as an “example” is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term “may” encompasses all the meanings of the term “can.”

In describing a positional relationship, where the positional relationship between two parts is described, for example, using “on,” “over,” “under,” “above,” “below,” “beneath,” “near,” “close to,” or “adjacent to,” “beside,” “next to,” or the like, one or more other parts may be located between the two parts unless a more limiting term, such as “immediate(ly),” “direct(ly),” or “close(ly),” is used. For example, when a structure is described as being positioned “on,” “over,” “under,” “above,” “below,” “beneath,” “near,” “close to,” or “adjacent to,” “beside,” or “next to” another structure, this description should be construed as including a case in which the structures contact each other as well as a case in which one or more additional structures are disposed or interposed therebetween. Furthermore, the terms “front,” “rear,” “back,” “left,” “right,” “top,” “bottom,” “downward,” “upward,” “upper,” “lower,” “up,” “down,” “column,” “row,” “vertical,” “horizontal,” and the like refer to an arbitrary frame of reference.

In describing a temporal relationship, when the temporal order is described as, for example, “after,” “subsequent,” “next,” “before,” “preceding,” “prior to,” or the like, a case that is not consecutive or not sequential may be included unless a more limiting term, such as “just,” “immediate(ly),” or “direct(ly),” is used.

It is understood that, although the term “first,” “second,” or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms “first,” “second,” and the like may be used to distinguish components from each other, but the functions or structures of the components are not limited by ordinal numbers or component names in front of the components.

In describing elements of the present disclosure, the terms “first,” “second,” “A,” “B,” “(a),” “(b),” or the like may be used. These terms are intended to identify the corresponding element(s) from the other element(s), and these are not used to define the essence, basis, order, or number of the elements.

For the expression that an element or layer is “connected,” “coupled,” or “adhered” to another element or layer, the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer “contacts,” “overlaps,” or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The terms such as a “line” or “direction” should not be interpreted only based on a geometrical relationship in which the respective lines or directions are parallel or perpendicular to each other, and may be meant as lines or directions having wider directivities within the range within which the components of the present disclosure can operate functionally.

The term “at least one” should be understood as including any and all combinations of one or more of the associated listed items. For example, the meaning of “at least one of a first item, a second item, and a third item” denotes the combination of items proposed from two or more of the first item, the second item, and the third item as well as only one of the first item, the second item, or the third item.

The expression of a first element, a second elements “and/or” a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression “element A/element B” may be understood as element A and/or element B.

In one or more aspects, the terms “between” and “among” may be used interchangeably simply for convenience unless stated otherwise. For example, an expression “between a plurality of elements” may be understood as among a plurality of elements. In another example, an expression “among a plurality of elements” may be understood as between a plurality of elements. In one or more examples, the number of elements may be two. In one or more examples, the number of elements may be more than two.

In one or more aspects, the phrases “each other” and “one another” may be used interchangeably simply for convenience unless stated otherwise. For example, an expression “different from each other” may be understood as being different from one another. In another example, an expression “different from one another” may be understood as being different from each other. In one or more examples, the number of elements involved in the foregoing expression may be two. In one or more examples, the number of elements involved in the foregoing expression may be more than two.

In one or more aspects, the phrases “one or more among” and “one or more of” may be used interchangeably simply for convenience unless stated otherwise. In one or more aspects, unless stated otherwise, the term “nth” or “$n^{th}$” may refer to "nnd" or "$n^{nd}$", (e.g., 2nd where n is 2), or "nrd" or "$n^{rd}$" (e.g., 3rd where n is 3), and n may be a natural number.

In the present disclosure, an apparatus may include a display apparatus such as an organic light emitting display (OLED) module, a liquid crystal module (LCM), or the like including a display panel and a driver for driving the display panel. In addition, the apparatus may include a set device (or a set apparatus) or a set electronic device such as a notebook computer, a TV, a computer monitor, an equipment apparatus including an automotive apparatus or another type of apparatus for vehicles, or a mobile electronic device such as a smartphone or an electronic pad, which is a complete product (or a final product) including an LCM, an OLED module, or the like.

Therefore, in the present disclosure, examples of the apparatus may include a display apparatus itself, such as an LCM, an OLED module, or the like, and a set device which is a final consumer device or an application product including the LCM, the OLED module, or the like.

In one or more example embodiments, an LCM or an OLED module including a display panel and a driver, or the like may be referred to as a display apparatus, and an electronic device which is a final product including an LCM or an OLED module may be referred to as a set device. For example, the display apparatus may include a display panel, such as an LCD or an OLED, and a source printed circuit board (PCB) which is a controller for driving the display panel. The set device may further include a set PCB which is a set controller electrically connected to the source PCB to control the set device.

A display panel applied to an embodiment of the present disclosure may use all types of display panels such as a liquid crystal display panel, an organic light emitting diode (OLED) display panel, and an electroluminescent display panel, or the like, but embodiments of the present disclosure are not limited. For example, the display panel may be a display panel capable of generating a sound by being vibrated by a vibration device according to an example embodiment of the present disclosure. A display panel applied to an apparatus or a display apparatus according to an example embodiment of the present disclosure is not limited a shape or a size of the display panel.

For example, when the display panel is the liquid crystal display panel, the display panel may include a plurality of gate lines, a plurality of data lines, and a plurality of pixels respectively provided in a plurality of pixel areas defined by intersections of the gate lines and the data lines. In addition, the display panel may include an array substrate including a thin film transistor (TFT) which is a switching element for adjusting a light transmittance of each of the plurality of pixels, an upper substrate including a color filter and/or a black matrix or the like, and a liquid crystal layer between the array substrate and the upper substrate.

When the display panel is the organic light emitting display panel (OLED), the display panel may include a plurality of gate lines, a plurality of data lines, and a plurality of pixels respectively provided in a plurality of pixel areas defined by intersections of the gate lines and the data lines. In addition, the display panel may include an array substrate including a TFT which is an element for selectively applying a voltage to each of the pixels, an organic light emitting device layer on the array substrate, and an encapsulation substrate disposed at the array substrate to cover the organic light emitting device layer, or the like. The encapsulation substrate may protect the TFT and the organic light emitting device layer from an external impact and may prevent water or oxygen from penetrating into the organic light emitting device layer. In addition, a layer provided on the array substrate may include an inorganic light emitting layer, for example, a nano-sized material layer, a quantum dot, a light emitting layer, or the like. As another example embodiment of the present disclosure, the layer provided on the array substrate may include a micro light emitting diode.

The display panel may further include a backing such as a metal plate attached at the display panel. However, embodiments of the present disclosure are not limited to the metal plate, and the display panel may further include another structure made of different material.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. In addition, for convenience of description, a scale, dimension, size, and thickness of each of the elements illustrated in the accompanying drawings may differ from an actual scale, dimension, size, and thickness, and thus, embodiments of the present disclosure are not limited to a scale, dimension, size, and thickness illustrated in the drawings.

Figure 2:
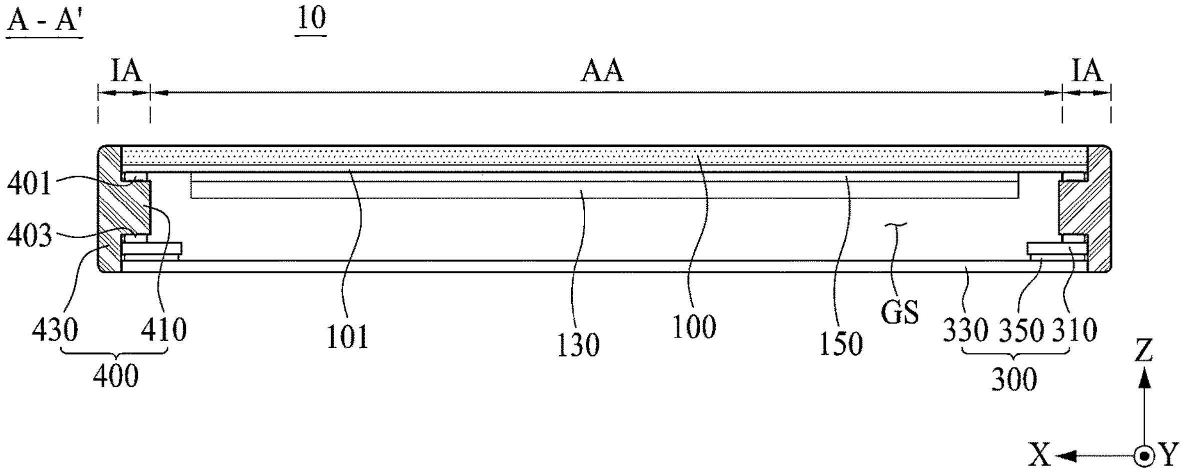
FIG. 2 is an example of a cross-sectional view taken along line A-A' of FIG. 1.

FIG. 1 illustrates an apparatus according to an example embodiment of the present disclosure. FIG. 2 is an example of a cross-sectional view taken along line A-A' illustrated in FIG. 1.

With reference to FIGS. 1 and 2, an apparatus 10 according to an example embodiment of the present disclosure may include a vibration member 100 and a vibration device 130 disposed at a rear surface (or a backside surface) of the vibration member 100. For example, the vibration member 100 may be (or may include) a vibration object, a display panel, a vibration plate, or a front member, but embodiments of the present disclosure are not limited thereto. Hereinafter, an example where the vibration member is a display panel will be described.

The vibration member 100 according to an example embodiment of the present disclosure may be a display panel to display an image. For example, the display panel may display an image, for example, an electronic image or a digital image. For example, the display panel may display an image by outputting light. The display panel may be a curved display panel, or may be any type of display panel, such as a liquid crystal display panel, an organic light-emitting display panel, a quantum dot light-emitting display panel, a micro light-emitting diode display panel, and an electrophoresis display panel. The display panel may be a flexible display panel. For example, the display panel may a flexible light emitting display panel, a flexible electrophoretic display panel, a flexible electro-wetting display panel, a flexible micro light emitting diode display panel, or a flexible quantum dot light emitting display panel, but embodiments of the present disclosure are not limited thereto.

The display panel according to an example embodiment of the present disclosure may include a display area AA for displaying an image according to driving of the plurality of pixels. In addition, the display panel may include a non-display area IA surrounding the display area AA, but embodiments of the present disclosure are not limited thereto.

The display panel according to an example embodiment of the present disclosure may be configured to display an image of a type such as a top emission type, a bottom emission type, a dual emission type, or the like according to a structure of the pixel array layer including an anode electrode, a cathode electrode, and a light emitting device. For the top emission type, an image may be displayed by outputting visible light generated from the pixel array layer to the forward region of a base substrate. For the bottom emission type, an image may be displayed by outputting visible light generated from the pixel array layer to the backward region of the base substrate.

The display panel according to an example embodiment of the present disclosure may include a pixel array part (or portion) disposed in a pixel area configured by a plurality of gate lines and/or a plurality of data lines. The pixel array part may include a plurality of pixels which display an image based on a signal supplied through the signal lines. The signal lines may include a gate line, a data line, a pixel driving power line, or the like, but embodiments of the present disclosure are not limited thereto.

Each of the plurality of pixels may include a pixel circuit layer including a driving thin film transistor (TFT) provided at the pixel area, an anode electrode electrically connected to the driving TFT, a light emitting device formed over the anode electrode, and a cathode electrode electrically connected to the light emitting device.

The driving TFT may be configured at a transistor region of each pixel area provided at a substrate. The driving TFT may include a gate electrode, a gate insulation layer, a semiconductor layer, a source electrode, and a drain electrode. The semiconductor layer of the driving TFT may include silicon such as amorphous silicon (a-Si), polysilicon (poly-Si), or low temperature poly-Si or may include oxide such as indium-gallium-zinc-oxide (IGZO), or the like, but embodiments of the present disclosure are not limited thereto.

The anode electrode may be provided at an opening region disposed at each pixel area and may be electrically connected to the driving TFT.

The light emitting device according to an example embodiment may include a light emitting device layer formed on an anode electrode. The light emitting device layer may be implemented to emit light having the same color (for example, white light) for each pixel, or may be implemented to emit light having a different color (for example, red light, green light, or blue light) for each pixel. The cathode electrode (or a common electrode) may be connected to the light emitting device layer provided in each pixel area in common. For example, the light emitting device layer may have a single structure including the same color for each pixel or a stack structure including two or more structures including the same color for each pixel. As another example embodiment of the present disclosure, the light emitting device layer may have a stack structure including two or more structures including one or more different colors for each pixel. The two or more structures including the one or more different colors may be configured with one or more of blue, red, yellow-green, and green or a combination thereof, but embodiments of the present disclosure are not limited thereto. An example of the combination may include blue and red, red and yellow-green, red and green, red/yellow-green/green, or the like, but embodiments of the present disclosure are not limited thereto. Further, regardless of a stack order thereof, the present disclosure may be applied. The stack structure including two or more structures having the same color or one or more different colors may further include a charge generating layer between the two or more structures. The charge generating layer may have a PN junction structure and may include an N-type charge generating layer and a P-type charge generating layer.

The light emitting device according to another example embodiment of the present disclosure may include a micro light emitting diode device electrically connected to each of an anode electrode and a cathode electrode. The micro light emitting diode device may be a light emitting diode implemented as an integrated circuit (IC) or chip type. The micro light emitting diode device may include a first terminal electrically connected to the anode electrode and a second terminal electrically connected to the cathode electrode. The cathode electrode may be connected to the second terminal of the micro light emitting diode device provided in each pixel area in common.

An encapsulation part (or portion) may be formed on the substrate to surround the pixel array part, thereby preventing oxygen or water from penetrating into the light emitting device of the pixel array part. The encapsulation part according to an example embodiment of the present disclosure may be formed in a multi-layer structure where an organic material layer and an inorganic material layer are alternately stacked, but embodiments of the present disclosure are not limited thereto. The inorganic material layer may prevent oxygen or water from penetrating into the light emitting device of the pixel array part. The organic material layer may be formed to have a thickness which is relatively thicker than the inorganic material layer so as to cover particles occurring in a manufacturing process, but embodiments of the present disclosure are not limited thereto. For example, the encapsulation part may include a first inorganic layer, an organic layer over the first inorganic layer, and a second inorganic layer over the organic layer. The organic layer may be a particle cover layer, but embodiments of the present disclosure are not limited thereto. The touch panel may be disposed over the encapsulation part, or may be disposed at a rear surface of the pixel array part.

The display panel according to an example embodiment of the present disclosure may include a first substrate, a second substrate, and a liquid crystal layer. The first substrate may be an upper substrate or a thin film transistor (TFT) array substrate. For example, the first substrate may include a pixel array part (or a display part or a display area) including a plurality of pixels which are respectively provided in a plurality of pixel areas defined by intersections between a plurality of gate lines and/or a plurality of data lines. Each of the plurality of pixels may include a TFT connected to a gate line and/or a data line, a pixel electrode connected to the TFT, and a common electrode which is provided adjacent to the pixel electrode and is supplied with a common voltage.

The first substrate may further include a pad part (or portion) provided at a first periphery (or a first non-display part) and a gate driving circuit provided at a second periphery (or a second non-display part).

The pad part may supply a signal, supplied from the outside, to the pixel array part and/or the gate driving circuit. For example, the pad part may include a plurality of data pads connected to a plurality of data lines through a plurality of data link lines and/or a plurality of gate input pads connected to the gate driving circuit through a gate control signal line. For example, a size of the first substrate may be greater than the second substrate, but embodiments of the present disclosure are not limited thereto.

The gate driving circuit may be embedded (or integrated) into a second periphery of the first substrate so as to be connected to the plurality of gate lines. For example, the gate driving circuit may be implemented as a shift register including a transistor, which is formed through the same process as the TFT provided at the pixel area. The gate driving circuit according to another example embodiment of the present disclosure may not be embedded into the first substrate and may be included a panel driving circuit as an integrated circuit (IC) type.

The second substrate may be a lower substrate or a color filter array substrate. For example, the second substrate may include a pixel opening pattern including an opening area overlapping with the pixel area formed in the first substrate, and a color filter layer formed at the opening area. The second substrate may have a size which is smaller than the first substrate, but embodiments of the present disclosure are not limited thereto. For example, the second substrate may overlap a remaining portion, other than the first periphery, of the upper substrate. The second substrate may be attached to a remaining portion, other than the first periphery, of the first substrate with a liquid crystal layer therebetween using a sealant.

The liquid crystal layer may be disposed between the first substrate and the second substrate. The liquid crystal layer may include a liquid crystal including liquid crystal molecules where an alignment direction thereof is changed based on an electric field generated by the common voltage and a data voltage applied to a pixel electrode for each pixel.

A second polarization member may be disposed at a lower surface of the second substrate and may polarize light which is incident from the backlight and travels to the liquid crystal layer. A first polarization member may be disposed at an upper surface of the first substrate and may polarize light which passes through the first substrate and is output to the outside.

The display panel according to an example embodiment of the present disclosure may drive the liquid crystal layer based on an electric field which is generated in each pixel by the data voltage and the common voltage applied to each pixel, and thus, may display an image based on light passing through the liquid crystal layer.

In a display panel according to another example embodiment of the present disclosure, the first substrate may be implemented as the color filter array substrate, and the second substrate may be implemented as the TFT array substrate. For example, the display panel according to another example embodiment of the present disclosure may be of a type where an upper portion and a lower portion of the display panel according to an example embodiment of the present disclosure are reversed therebetween. For example, a pad part of the display panel according to another example embodiment of the present disclosure may be covered by a separate mechanism or a separate structure.

The display panel according to another example embodiment of the present disclosure may include a bending portion that may be bent or curved to have a curved shape or a certain curvature radius.

The bending portion of the display panel may be implemented in at least one or more of one periphery and the other periphery of the display panel, which are parallel to each other. The one periphery and/or the other periphery, where the bending portion is implemented, of the display panel 100 may include only the non-display area IA, or may include a periphery of the display area AA and the non-display area IA. The display panel including the bending portion implemented by bending of the non-display area IA may have a one-side bezel bending structure or a both-side bezel bending structure. Moreover, the display panel 100 including the bending portion implemented by bending of the periphery of the display area AA and the non-display area IA may have a one-side active bending structure or a both-side active bending structure.

According to another example embodiment of the present disclosure, the vibration member 100 may include one or more of metal, wood, rubber, plastic, glass, cloth, fiber, paper, carbon, a mirror, and leather, but embodiments of the present disclosure are not limited thereto. For example, the paper may be conge for speakers. For example, the conge may be pulp or foamed plastic, or the like, but embodiments of the present disclosure are not limited thereto.

According to another example embodiment of the present disclosure, the vibration member 100 may include a display panel including a pixel displaying an image, and/or may include one or more of a vehicle interior material, a vehicle glass window, a building indoor ceiling, a building glass window, a building interior material, an aircraft interior material, an aircraft glass window, or the like, but embodiments of the present disclosure are not limited thereto. For example, the vibration member 100 may include one or more of a display panel including a plurality of pixels configured to display an image, a screen panel on which an image is projected from a display apparatus, a lighting panel, a signage panel, a vehicular interior material, a vehicular glass window, a vehicular exterior material, a building ceiling material, a building interior material, a building glass window, and a mirror, but embodiments of the present disclosure are not limited thereto. For example, the display panel may be a curved display panel, or may be any type of display panel, such as a liquid crystal display panel, an organic light-emitting display panel, a quantum dot light-emitting display panel, a micro light-emitting diode display panel, and an electrophoresis display panel. The display panel may be a flexible display panel. For example, the display panel may a flexible light emitting display panel, a flexible electrophoretic display panel, a flexible electro-wetting display panel, a flexible micro light emitting diode display panel, or a flexible quantum dot light emitting display panel, but embodiments of the present disclosure are not limited thereto. For example, the non-display panel may be a light emitting diode lighting panel (or apparatus), an organic light emitting lighting panel (or apparatus), an inorganic light emitting lighting panel (or apparatus), and the like, but embodiments of the present disclosure are not limited thereto. For example, the vibration member 100 may include a display panel including a plurality of pixels displaying an image, and/or may include one or more of a light emitting diode lighting panel (or apparatus), an organic light emitting lighting panel (or apparatus), an inorganic light emitting lighting panel (or apparatus), but embodiments of the present disclosure are not limited thereto.

The vibration device 130 may vibrate the vibration member 100. For example, the vibration device 130 may be implemented at the rear surface of the vibration member 100 to directly vibrate the vibration member 100. For example, the vibration device 130 may vibrate the vibration member 100 at the rear surface of the vibration member 100, thereby providing a sound and/or a haptic feedback based on the vibration of the vibration member 100 to a user. For example, the vibration member 100 may output sound according to the vibration of the vibration device 130. The vibration device 130 may use the vibration member 100 as a vibration plate to output sound. For example, the vibration device 130 may use the vibration member 100 as a vibration plate to output sound to a front surface of the vibration member 100. For example, the vibration device 130 may generate a sound so that a traveling direction of the sound is a direction toward a forward region in front of the display panel or the vibration member 100. The vibration device 130 may vibrate the vibration member 100 to output sound. For example, the vibration device 130 may directly vibrate the vibration member 100 to output a sound. For example, the vibration member 100 may be (or may include) a vibration object, a vibration plate, or a front member, but embodiments of the present disclosure are not limited thereto.

According to an example embodiment of the present disclosure, the vibration device 130 may vibrate according to a voice signal synchronized with an image displayed on the display panel that is the vibration member 100 to vibrate the display panel. As another example embodiment of the present disclosure, the vibration device 130 may vibrate according to a haptic feedback signal (or a tactile feedback signal) synchronized with a user touch applied to a touch panel (or a touch sensor layer) which is disposed at the display panel or embedded into the display panel and may vibrate the display panel. Accordingly, the display panel may vibrate based on a vibration of the vibration device 130 to provide a user (or a viewer) with at least one or more of a sound and a haptic feedback.

The vibration device 130 according to an example embodiment of the present disclosure may be implemented to have a size corresponding to the vibration member 100 or the display area AA of the display panel 100. A size of the vibration device 130 may be 0.9 to 1.1 times a size of the vibration member 100 or the display area AA, but embodiments of the present disclosure are not limited thereto. For example, a size of the vibration device 130 may be the same as or smaller than the size of the vibration member 100 or the display area AA. For example, a size of the vibration device 130 may be the same as or approximately same as the vibration member 100 or the display area AA of the display panel, and thus, the vibration device 130 may cover a most region of the vibration member 100 or the display panel and a vibration generated by the vibration device 130 may vibrate a whole portion of the vibration member 100 or the display panel, and thus, localization of a sound may be high, and satisfaction of a user may be improved. Further, a contact area (or panel coverage) between the vibration member 100 or the display panel and the vibration device 130 may increase, and thus, a vibration region of the vibration member 100 or the display panel may increase, thereby improving a sound of a middle-low-pitched sound band generated based on a vibration of the vibration member 100 or the display panel. Further, a vibration device 130 applied to a large-sized display apparatus may vibrate the whole vibration member 100 (or display panel) having a large size (or a large area), and thus, localization of a sound based on a vibration of the display panel may be further enhanced, thereby realizing an improved sound effect. Therefore, the vibration device 130 according to an example embodiment of the present disclosure may be disposed at the rear surface of the vibration member 100 or the display panel to sufficiently vibrate the vibration member 100 or the display panel in a vertical direction (or front-to-rear direction), thereby outputting a desired sound to a forward region in front of the apparatus.

The vibration device 130 according to an example embodiment of the present disclosure may be implemented as a film-type. Since the vibration device 130 may be implemented as a film-type, it may have a thickness which is thinner than the vibration member 100 or the display panel, and thus, an increase in the thickness of the display apparatus may be minimized due to the arrangement of the vibration device 130. For example, the vibration device 130 may use the vibration member 100 or the display panel as a sound vibration plate. For example, the vibration device 130 may be referred to as a vibration generating apparatus, a displacement apparatus, a sound apparatus, a sound generating module, a sound generating apparatus, a film actuator, a film-type piezoelectric composite actuator, a film speaker, a film-type piezoelectric speaker, a film-type piezoelectric composite speaker, or the like, but embodiments of the present disclosure are not limited thereto. As another example embodiment of the present disclosure, the vibration device 130 may not be disposed at the rear surface of the display panel and may be applied to a non-display panel instead of the display panel. For example, the vibration device 130 may include one or more of wood, plastic, glass, metal, cloth, fiber, rubber, paper, leather, a vehicle interior material, a building indoor ceiling, an aircraft interior material, and the like, but embodiments of the present disclosure are not limited thereto. In this case, the non-display panel may be applied as a vibration plate, and the vibration device 130 may vibrate the non-display panel to output a sound.

The vibration device 130 according to an example embodiment of the present disclosure may be disposed at the rear surface of the vibration member 100 or the display panel to overlap the vibration member 100 or the display area of the display panel. For example, the vibration device 130 may overlap half or more of the vibration member 100 or half or more of the display area of the display panel. As another example embodiment of the present disclosure, the vibration device 130 may overlap the whole vibration member 100 or the whole display area AA of the display panel.

According to another example embodiment of the present disclosure, the vibration member 100 may include a plate 101. For example, the plate 101 is configured to have a same size as a size of the vibration member 100. The plate 101 may include a metal material, or may include a single nonmetal material or a composite nonmetal material of any one or more of wood, plastic, glass, cloth, fiber, rubber, paper, carbon, a mirror, and leather, but embodiments of the present disclosure are not limited thereto.

The vibration device 130 according to an example embodiment of the present disclosure may vibrate by alternately and repeatedly contract and expand based on an inverse piezoelectric effect when an alternating current (AC) voltage is applied, thereby directly vibrating the vibration member 100 or the display panel through the vibration thereof. For example, the vibration device 130 may vibrate according to a voice signal synchronized with an image displayed on the display panel to vibrate the display panel.

As another example embodiment of the present disclosure, the vibration device 130 may vibrate according to a haptic feedback signal (or a tactile feedback signal) synchronized with a user touch applied to a touch panel (or a touch sensor layer) which is disposed over the display panel or embedded into the display panel and may vibrate the display panel. Accordingly, the display panel may vibrate based on a vibration of the vibration device 130 to provide a user (or a viewer) with at least one or more of a sound and a haptic feedback.

Therefore, the apparatus according to an example embodiment of the present disclosure may output a sound, generated by a vibration of the vibration member 100 or the display panel based on a vibration of the vibration device 130, in a forward region in front of the vibration member 100 or the display panel. Moreover, in the apparatus according to an example embodiment of the present disclosure, a most region of the vibration member 100 (or the display panel) may be vibrated by the vibration device 130 having a film-type, thereby further enhancing a sense of sound localization and a sound pressure level characteristic of a sound based on the vibration of the vibration member 100 (or the display panel).

The apparatus according to an example embodiment of the present disclosure may further include a connection member (or a first connection member) 150 between the vibration member 100 and the vibration device 130.

According to an example embodiment of the present disclosure, the connection member 150 may be disposed between the rear surface (or a backside surface) of the vibration member 100 and the vibration device 130, and may connect or couple the vibration device 130 to the rear surface of the vibration member 100. For example, the vibration device 130 may be connected or coupled to the rear surface of the vibration member 100 by the connection member 150, and thus, may be supported by or disposed at the rear surface of the vibration member 100.

The connection member 150 according to an example embodiment of the present disclosure may include a material including an adhesive layer which has a relatively strong adhesive force or attaching force with respect to each of the rear surface of the vibration member 100 and the vibration device 130. For example, the connection member 150 may include a foam pad, a double-sided tape, an adhesive, or the like, but embodiments of the present disclosure are not limited thereto. For example, the adhesive layer of the connection member 150 may include epoxy, acrylic, silicone, or urethane, but embodiments of the present disclosure are not limited thereto. For example, the adhesive layer of the connection member 150 may include an acrylic-based material which has a relatively strong adhesive force and a relatively high hardness compared to a urethane-based material. Accordingly, a vibration of the vibration device 130 may be transferred to the vibration member 100 effectively.

The adhesive layer of the connection member 150 may further include an additive, such as a tackifier or an adhesion enhancing agent, a wax component, an anti-oxidation agent, or the like. The additive may prevent or reduce the connection member 150 from being detached (stripped) from the vibration member 100 by a vibration of the vibration device 130. For example, the tackifier may be a rosin derivative or the like, and the wax component may be paraffin wax or the like, and the anti-oxidation agent may be a phenol-based anti-oxidation agent, such as thioester, but embodiments of the present disclosure are not limited thereto.

The connection member 150 according to another example embodiment of the present disclosure may further include a hollow portion provided between the vibration member 100 and the vibration device 130. The hollow portion of the connection member 150 may provide an air gap between the vibration member 100 and the vibration device 130. Due to the air gap, a sound wave (or a sound pressure) based on a vibration of the vibration device 130 may not be dispersed by the connection member 150, and may concentrate on the vibration member 100. Thus, the loss of a vibration caused by the connection member 150 may be minimized, thereby increasing a sound pressure level characteristic of a sound generated based on a vibration of the vibration member 100.

The apparatus 10 according to an example embodiment of the present disclosure may further include a supporting member 300 disposed at a rear surface (or a backside surface) of the vibration member 100.

The supporting member 300 may be disposed at the rear surface of the vibration member 100 or the display panel. For example, the supporting member 300 may cover a rear surface of the vibration member 100 or the display panel. For example, the supporting member 300 may cover a whole rear surface of the vibration member 100 or the display panel 100 with a gap space GS therebetween. The supporting member 300 may be spaced apart from a rearmost surface of the vibration member 100 or the display panel or the vibration device 130 with a gap space GS therebetween. For example, the gap space GS may be referred to as an air gap, a vibration space, a sound resonance box, or the like, but embodiments of the present disclosure are not limited thereto.

For example, the supporting member 300 may include at least one or more of a glass material, a metal material, and a plastic material. For example, the supporting member 300 may be a rear surface structure, a set structure, a supporting structure, a supporting cover, a rear member, a case, or a housing, but embodiments of the present disclosure are not limited thereto. For example, the supporting member 300 may be referred to as the other term such as a cover bottom, a plate bottom, a back cover, a base frame, a metal frame, a metal chassis, a chassis base, m-chassis, or the like. For example, the supporting member 300 may be implemented as an arbitrary type of frame or a plate-shaped structure disposed at a rear surface of the display panel.

A periphery or a sharp corner of the supporting member 300 may have an inclined shape or a curved shape through a chamfer process or a corner rounding process. For example, the supporting member 300 of the glass material may be sapphire glass. As another example embodiment of the present disclosure, the supporting member 300 of the metal material may be implemented as one or more materials of aluminum (Al), an Al alloy, a magnesium (Mg), a Mg alloy, and an iron (Fe)-nickel (Ni) alloy.

The supporting member 300 according to an example embodiment of the present disclosure may include a first supporting member 310 and a second supporting member 330.

The first supporting member 310 may be disposed between a rear surface of the vibration member 100 or the display panel and the second supporting member 330. For example, the first supporting member 310 may be disposed between a rear periphery portion of the vibration member 100 or the display panel and a front periphery portion of the supporting member 300. The first supporting member 310 may support one or more of a periphery portion of the vibration member 100 or the display panel and the periphery portion of the supporting member 300. As another example embodiment of present disclosure, the first supporting member 310 may cover the rear surface of the vibration member 100 or the display panel. For example, the first supporting member 310 may cover the whole (or entire) rear surface of the vibration member 100 or the display panel. For example, the first supporting member 310 may be a member which covers a whole rear surface of the vibration member 100 or the display panel. For example, the first supporting member 310 may include at least one or more materials of a glass material, a metal material, and a plastic material. For example, the first supporting member 310 may be an inner plate, a first rear structure, a first supporting structure, a first supporting cover, a first back cover, a first rear member, an internal plate, or an internal cover, but embodiments of the present disclosure are not limited thereto. For example, the first supporting member 310 may be omitted.

The first supporting member 310 may be spaced apart from a rearmost surface of the vibration member 100 or the vibration device 130 with a gap space GS therebetween. For example, the gap space GS may be referred to as an air gap, a vibration space, a sound resonance box, or the like, but embodiments of the present disclosure are not limited thereto.

The second supporting member 330 may be disposed at a rear surface of the first supporting member 310. The second supporting member 330 may be a member which covers the whole rear surface of the vibration member 100 or the display panel. For example, the second supporting member 330 may include at least one or more of a glass material, a metal material, and a plastic material. For example, the second supporting member 330 may be an outer plate, a rear plate, a back plate, a back cover, a rear cover, a second rear structure, a second supporting structure, a second supporting cover, a second back cover, a second rear member, an external plate, an external cover, but embodiments of the present disclosure are not limited thereto.

The supporting member 300 according to an example embodiment of the present disclosure may further include a connection member (or a second connection member) 350.

The connection member 350 may be disposed between the first supporting member 310 and the second supporting member 330. For example, the first supporting member 310 and the second supporting member 330 may be coupled or connected to each other by the connection member 350. For example, the connection member 350 may be an adhesive resin, a double-sided tape, or a double-sided adhesive foam pad, but embodiments of the present disclosure are not limited thereto. For example, the connection member 350 may have elasticity for absorbing an impact, but embodiments of the present disclosure are not limited thereto. For example, the connection member 350 may be disposed at a whole region between the first supporting member 310 and the second supporting member 330. As another example embodiment of the present disclosure, the connection member 350 may be provided in a mesh structure including an air gap between the first supporting member 310 and the second supporting member 330.

The apparatus 10 according to an example embodiment of the present disclosure may further include a middle frame 400. The middle frame 400 may be disposed between a rear periphery of vibration member 100 or the display panel and a front periphery of the supporting member 300. The middle frame 400 may support one or more of the rear periphery of the display panel and the front periphery of the supporting member 300. The middle frame 400 may surround one or more of side surfaces of each of the display panel and the supporting member 300. The middle frame 400 may provide a gap space GS between the display panel and the supporting member 300. The middle frame 400 may be referred to as a middle cabinet, a middle cover, a middle chassis, a connection member, a frame, a frame member, an intermediate member, a side cover member, or the like, but embodiments of the present disclosure are not limited thereto.

The middle frame 400 according to an example embodiment of the present disclosure may include a first supporting portion 410 and a second supporting portion 430. For example, the first supporting portion 410 may be a supporting part, but embodiments of the present disclosure are not limited thereto. For example, the second supporting portion 430 may be a sidewall part, but embodiments of the present disclosure are not limited thereto.

The first supporting portion 410 may be disposed between the rear periphery of the vibration member 100 or the display panel and the front periphery of the supporting member 300, and thus, may provide a gap space GS between the vibration member 100 or the display panel and the supporting member 300. A front surface of the first supporting portion 410 may be coupled or connected to the rear periphery of the vibration member 100 or the display panel by a first connection member 401. A rear surface of the first supporting portion 410 may be coupled or connected to the front periphery of the supporting member 300 by a second connection member 403. For example, the first supporting portion 710 may have a single picture frame structure having a square shape or a frame structure having a plurality of divided bar shapes, but embodiments of the present disclosure are not limited thereto.

The second supporting portion 430 may be disposed in parallel with a thickness direction Z of the apparatus. For example, the second supporting portion 430 may be vertically coupled to an outer surface of the first supporting portion 410 in parallel with a thickness direction Z of the apparatus. The second supporting portion 430 may surround one or more of an outer surface of the vibration member 100 and an outer surface of the supporting member 300, thereby protecting the outer surface of each of the vibration member 100 and the supporting member 300. The first supporting portion 410 may protrude from an inner surface of the second supporting portion 430 toward the gap space GS between the vibration member 100 and the support member 300.

The apparatus according to an example embodiment of the present disclosure may include a panel connection member (or connection member) instead of the middle frame 400.

The panel connection member may be disposed between the rear periphery of the vibration member 100 and the front periphery of the supporting member 300 and may provide the gap space GS between the vibration member 100 and the supporting member 300. The panel connection member may be disposed between the rear periphery of the vibration member 100 and the front periphery of the supporting member 300 to adhere the vibration member 100 and the support member 300. For example, the panel connection member may be implemented as a double-sided tape, a single-sided tape, or a double-sided adhesive foam pad, but embodiments of the present disclosure are not limited thereto. For example, an adhesive layer of the panel connection member may include epoxy, acrylic, silicone, or urethane, but embodiments of the present disclosure are not limited thereto. For example, in order to minimize the vibration of the vibration member 100 from being transmitted to the support member 300, an adhesive layer of the panel connection member may include a urethane-based material which has a relatively ductile characteristic compared to an acrylic-based material. Accordingly, a vibration of the vibration member 100 transmitted to the support member 300 may be minimized.

In the apparatus according to an example embodiment of the present disclosure, when the apparatus includes a panel connection member instead of a middle frame 400, the supporting member 300 may include a bending sidewall which is bent from an end (or an end portion) of the second supporting member 330 and surrounds one or more of an outer surface (or an outer sidewall) of each of the first supporting member 310, the panel connection member, and the vibration member 100. The bending sidewall according to an example embodiment of the present disclosure may have a single sidewall structure or a hemming structure. The hemming structure may be a structure where end portions of an arbitrary member are bent in a curve shape and overlap each other or are spaced apart from each other in parallel. For example, in order to enhance a sense of beauty in design, the bending sidewall may include a first bending sidewall, bent from one side (or an end or one portion) of the second supporting member 330, and a second bending sidewall bent from the first bending sidewall to a region between the first bending sidewall and an outer surface of the vibration member 100. The second bending sidewall may be spaced apart from an inner surface of the first bending sidewall to prevent (or minimize) contact with the inner surface of the first bending sidewall or external impact in a lateral direction from being transmitted to the outer surface of the display panel 100. Therefore, the second bending sidewall may prevent (or minimize) the outer surface of the vibration member 100 from contacting an inner surface of the first bending sidewall or may prevent a lateral-direction external impact from being transferred to the outer surface of the vibration member 100.

In the apparatus according to another example embodiment of the present disclosure, the middle frame 400 may be omitted. The apparatus according to another example embodiment of the present disclosure may include the panel connection member or adhesive member instead of the middle frame 400. The apparatus according to another example embodiment of the present disclosure may include a partition instead of the middle frame 400.

Because a sound characteristic and/or a sound pressure level characteristic of a low-pitched sound band are/is reduced when the vibration device 130 is configured as a film-type vibration device, the inventors have performed extensive research and experiments for improving a sound characteristic of the low-pitched sound band. Through the extensive research and experiments, the inventors have invented an apparatus having a new structure for enhancing a sound characteristic and/or a sound pressure level characteristic of the low-pitched sound band. This will be described below.

FIGS. 3A to 3F illustrate a vibration portion according to an example embodiment of the present disclosure.

With reference to FIGS. 3A to 3F, a vibration device 130 according to an example embodiment of the present disclosure may include a vibration portion 130*a*. The vibration portion 130*a* according to an example embodiment of the present disclosure may include a first vibration portion 131 and a second vibration portion 132.

The first vibration portion 131 may include a first portion 131*a* and a second portion 131*b*. For example, the first portion 131*a* may include an inorganic material, and the second portion 131*b* may include an organic material. For example, the first portion 131*a* may have a piezoelectric characteristic, and the second portion 131*b* may have a ductile characteristic or flexibility. For example, the inorganic material of the first portion 131*a* may have a piezoelectric characteristic, and the organic material of the second portion 131*b* may have a ductile characteristic or flexibility. The first vibration portion 131 may include a plurality of first portions 131*a* and a plurality of second portions 131*b*. For example, the plurality of first portions 131*a* and the plurality of second portions 131*b* may be alternately and repeatedly arranged along a second direction Y.

The second vibration portion 132 may include a first portion 132*a* and a second portion 132*b*. For example, the first portion 132*a* may include an inorganic material, and the second portion 132*b* may include an organic material. For example, the first portion 132*a* may have a piezoelectric characteristic, and the second portion 132*b* may have a ductile characteristic or flexibility. For example, the inorganic material of the first portion 132*a* may have a piezoelectric characteristic, and the organic material of the second portion 132*b* may have a ductile characteristic or flexibility. The second vibration portion 132 may include a plurality of first portions 132*a* and a plurality of second portions 132*b*. For example, the plurality of first portions 132*a* and the plurality of second portions 132*b* may be alternately and repeatedly arranged along a second direction Y.

According to an example embodiment of the present disclosure, each of the first vibration portion 131 and the second vibration portion 132 may include a material (or an inorganic material or a piezoelectric material) having a crystalline structure. For example, the first vibration portion 131 and the second vibration portion 132 may include a material having different crystalline structures. For example, the first vibration portion 131 may include a material having a single-crystalline structure, and the second vibration portion 132 may include a material having a polycrystalline structure. For example, the first vibration portion 131 may include single-crystalline ceramic, and the second vibration portion 132 may include polycrystalline ceramic.

According to an example embodiment of the present disclosure, the first vibration portion 131 may be a single-crystalline vibration portion, and the second vibration portion 132 may be a polycrystalline vibration portion 132. For example, the first vibration portion 131 may have a structure where particles having a single crystal domain having a constant structure are regularly arranged. For example, the second vibration portion 132 may include irregular particles having various crystal domains. The first vibration portion 131 may be manufactured as a vibration device having a vibration characteristic (for example, a piezoelectric deformation constant $d_{33}$) which is about two or three times greater than a vibration characteristic of the second vibration portion 132, and thus, may have a high sound pressure level characteristic (or sound characteristic) in the low-pitched sound band. The second vibration portion 132 may have a vibration characteristic which is about two or three times less than a vibration characteristic of the first vibration portion 131, and consequently, may have a problem where a sound pressure level characteristic of the low-pitched sound band is reduced. However, the second vibration portion 132 may be manufactured to have a large area, and thus, may be implemented as a large vibration device or sound apparatus. Therefore, the inventors have performed extensive research and experiments for applying the first vibration portion 131 so as to improve a sound pressure level characteristic of the low-pitched sound band which occurs when a vibration device is implemented with the second vibration portion 132. Through the extensive research and experiments, the inventors have invented a vibration device including the first vibration portion 131 and the second vibration portion 132. This will be described below.

The vibration device 130 according to an example embodiment of the present disclosure may alternately and repeatedly contract and expand based on a piezoelectric effect (or a piezoelectric characteristic) to vibrate. The vibration device 130 according to an example embodiment of the present disclosure may alternately and repeatedly contract and expand based on an inverse piezoelectric effect to vibrate in a thickness direction Z, thereby directly vibrating the vibration member 100 or the display panel. The vibration device 130 may be referred to as a vibration film, a displacement generator, a displacement film, a sound generator, a vibration array, a vibration array part, a vibration structure array part, or a vibration array structure, but embodiments of the present disclosure are not limited thereto.

Each of the first vibration portion 131 and the second vibration portion 132 may include a piezoelectric material, a composite piezoelectric material, or an electroactive material, and the piezoelectric material, the composite piezoelectric material and the electroactive material may have a piezoelectric effect. Each of the first vibration portion 131 and the second vibration portion 132 may be referred to as a piezoelectric vibration portion, a piezoelectric vibration layer, a displacement portion, a piezoelectric displacement portion, a piezoelectric displacement layer, a sound wave generating portion, a vibration layer, a piezoelectric material layer, a piezoelectric composite layer, an electroactive layer, a piezoelectric material portion, a piezoelectric composite portion, an electroactive portion, a piezoelectric structure, a piezoelectric composite, a piezoelectric ceramic composite, or the like, but embodiments of the present disclosure are not limited thereto. Each of the first vibration portion 131 and the second vibration portion 132 according to an example embodiment of the present disclosure may have a 2-2 composite structure.

The first portion 131*a* of the first vibration portion 131 and the first portion 132*a* of the second vibration portion 132 according to an example embodiment of the present disclosure may be configured with an inorganic material. For example, the first portion 131*a* of the first vibration portion 131 and the first portion 132*a* of the second vibration portion 132 may be referred to as a piezoelectric portion, a piezoelectric element, an inorganic portion, an inorganic material, a piezoelectric layer, a vibration layer, a displacement layer, a displacement element, or the like, but embodiments of the present disclosure are not limited thereto.

For example, the first portion 131*a* of the first vibration portion 131 and the first portion 132*a* of the second vibration portion 132 may include a ceramic-based material for generating a relatively high vibration, and/or may include a piezoelectric ceramic having a perovskite-based crystalline structure. The perovskite crystalline structure may have a piezoelectric effect and an inverse piezoelectric effect, and may be a plate-shaped structure having orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A", and "B" may be cations, and "O" may be anions. For example, the chemical formula "$ABO_3$" may include one of lead(II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but embodiments of the present disclosure are not limited thereto.

When the perovskite crystalline structure includes a center ion (for example, lead(II) titanate ($PbTiO_3$)), a position of a titanium (Ti) ion may be changed by an external stress or a magnetic field, and thus, polarization may be changed, thereby generating a piezoelectric effect. For example, in the perovskite crystalline structure, a cubic shape corresponding to a symmetric structure may be changed to a tetragonal (or quadrilateral), orthorhombic, or rhombohedral structure corresponding to an unsymmetric structure, and thus, a piezoelectric effect may be generated. In a tetragonal (or quadrilateral), orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

According to an example embodiment of the present disclosure, the inorganic material portion included in each of the plurality of first portions 131*a* and 132*a* may include one or more materials of lead (Pb), zirconium (Zr), titanium (Ti), zinc (Zn), nickel (Ni), niobium (Nb), magnesium (Mg), manganese (Mn), and indium (In), but embodiments of the present disclosure are not limited thereto.

According to another example embodiment of the present disclosure, the inorganic material portion included in each of the plurality of first portions 131*a* and 132*a* may include a lead zirconate titanate (PZT)-based material including lead (Pb), zirconium (Zr), and titanium (Ti) or may include a lead zirconate nickel niobate (PZNN)-based material including lead (Pb), zirconium (Zr), nickel (Ni), and niobium (Nb), but embodiments of the present disclosure are not limited thereto. According to another example embodiment of the present disclosure, the inorganic material portion included in each of the plurality of first portions 131*a* and 132*a* may include a lead magnesium niobate (PMN)-based material, a lead nickel niobate (PNN)-based material, a lead zirconate niobate (PZN)-based material, or a lead indium niobate (PIN)-based material, but embodiments of the present disclosure are not limited thereto. The PMN-based material may include Pb, Mg, and Nb, and for example, may include $Pb(Mg, Nb)O_3$. The PNN-based material may include Pb, Ni, and Nb, and for example, may include $Pb(Ni, Nb)O_3$. The PIN-based material may include Pb, In, and Nb, and for example, may include $Pb(In, Nb)O_3$. According to another example embodiment of the present disclosure, the inorganic material portion included in each of the plurality of first portions 131*a* and 132*a* may include at least one or more of $CaTiO_3$, $BaTiO_3$, and $SrTiO_3$ without Pb, but embodiments of the present disclosure are not limited thereto.

According to another example embodiment of the present disclosure, the inorganic material portion included in each of the plurality of first portions 131*a* and 132*a* may have a piezoelectric deformation coefficient "$d_{33}$" of 1,000 pC/N or more in a thickness direction Z. The vibration device may be applied to a display panel or a vibration member (or a vibration object) having a large size and may need to have a high piezoelectric deformation coefficient "$d_{33}$", for having a sufficient vibration characteristic or piezoelectric characteristic. For example, in order to have the high piezoelectric deformation coefficient "$d_{33}$", the inorganic material portion may include a PZT-based material ($PbZrTiO_3$) as a main component and may include a softener dopant material doped into A site (Pb) and a relaxor ferroelectric material doped into B site (ZrTi).

The softener dopant material may enhance a piezoelectric characteristic and a dielectric characteristic of the inorganic material portion, and for example, may increase the piezoelectric deformation coefficient "$d_{33}$" of the inorganic material portion. The softener dopant material according to an example embodiment of the present disclosure may include a dyad element "+2" to a triad element "+3". Morphotropic phase boundary (MPB) may be configured by adding the softener dopant material to the PZT-based material ($PbZrTiO_3$), and thus, a piezoelectric characteristic and a dielectric characteristic may be enhanced. For example, the softener dopant material may include strontium (Sr), barium (Ba), lanthanum (La), neodymium (Nd), calcium (Ca), yttrium (Y), erbium (Er), or ytterbium (Yb). For example, ions ($Sr^{2+}$, $Ba^{2+}$, $La^{2+}$, $Nd^{3+}$, $Ca^{2+}$, $Y^{3+}$, $Er^{3+}$, $Yb^{3+}$) of the softener dopant material doped into the PZT-based material ($PbZrTiO_3$) may substitute a portion of lead (Pb) in the PZT-based material ($PbZrTiO_3$), and a substitution rate thereof may be about 2 mol % to about 20 mol %. For example, when the substitution rate is less than 2 mol % or greater than 20 mol %, a perovskite crystal structure may be broken, and thus, an electromechanical coupling coefficient "kP" and the piezoelectric deformation coefficient "$d_{33}$" may decrease. When the softener dopant material is substituted, the MPB may be configured, and a piezoelectric characteristic and a dielectric characteristic may be high in the MPB, thereby implementing a vibration device having a high piezoelectric characteristic and a high dielectric characteristic.

According to an example embodiment of the present disclosure, the relaxor ferroelectric material doped into the PZT-based material ($PbZrTiO_3$) may enhance an electric deformation characteristic of the inorganic material portion. The relaxor ferroelectric material according to an example embodiment of the present disclosure may include a lead magnesium niobate (PMN)-based material, a lead nickel niobate (PNN)-based material, a lead zirconate niobate (PZN)-based material, or a lead indium niobate (PIZ)-based material, but embodiments of the present disclosure are not limited thereto. The PMN-based material may include Pb, Mg, and Nb, and for example, may include $Pb(Mg, Nb)O_3$. The PNN-based material may include Pb, Ni, and Nb, and for example, may include $Pb(Ni, Nb)O_3$. The PZN-based material may include Pb, Zr, and Nb, and for example, may include $Pb(Zr, Nb)O_3$. The PIN-based material may include Pb, In, and Nb, and for example, may include $Pb(In, Nb)O_3$. For example, the relaxor ferroelectric material doped into the PZT-based material ($PbZrTiO_3$) may substitute a portion of each of zirconium (Zr) and titanium (Ti) in the PZT-based material ($PbZrTiO_3$), and a substitution rate thereof may be about 5 mol % to about 25 mol %. For example, when the substitution rate is smaller than 5 mol % or greater than 25 mol %, a perovskite crystal structure may be broken, and thus, the electromechanical coupling coefficient "kP" and the piezoelectric deformation coefficient "$d_{33}$" may decrease.

According to an example embodiment of the present disclosure, the inorganic material portion included in each of the plurality of first portions 131*a* and 132*a* may further include a donor material doped into B site (ZrTi) of the PZT-based material ($PbZrTiO_3$), in order to further enhance a piezoelectric coefficient. For example, the donor material doped into the B site (ZrTi) may include a tetrad element "+4" or a hexad element "+6". For example, the donor material doped into the B site (ZrTi) may include tellurium (Te), germanium (Ge), uranium (U), bismuth (Bi), niobium (Nb), tantalum (Ta), antimony (Sb), or tungsten (W).

The inorganic material portion included in each of the plurality of first portions 131*a* and 132*a* according to an example embodiment of the present disclosure may have a piezoelectric deformation coefficient "$d_{33}$" of 1,000 pC/N or more in a thickness direction Z, thereby implementing a vibration device having an enhanced vibration characteristic. For example, a vibration device having an enhanced vibration characteristic may be implemented in a large-area apparatus or a large-area vibration member (or a large-area vibration object).

The second portion 131*b* of the first vibration portion 131 and the second portion 132*b* of the second vibration portion 132 according to an example embodiment of the present disclosure may be configured with an organic material portion. For example, the organic material portion may be disposed between the inorganic material portions and may absorb an impact applied to the inorganic material portion (or the first portion), may release a stress concentrating on the inorganic material portion to enhance the total durability of the first and second vibration portions 131 and 132 or the vibration device 130, and may provide flexibility to the first and second vibration portions 131 and 132 or the vibration device 130.

Each of the second portion 131*b* of the first vibration portion 131 and the second portion 132*b* of the second vibration portion 132 according to an example embodiment of the present disclosure may have a modulus (or a young's modulus) and viscoelasticity that are lower than those of each the first portion 131*a* of the first vibration portion 131 and the first portion 132*a* of the second vibration portion 132. Thus, the second portions 131*b* and 132*b* may enhance the reliability of each of the first portion 131*a* of the first vibration portion 131 and the first portion 132*a* of the second vibration portion 132 vulnerable to an impact due to a fragile characteristic of each of the first portion 131*a* of the first vibration portion 131 and the first portion 132*a* of the second vibration portion 132. For example, the second portion 131*b* of the first vibration portion 131 and the second portion 132*b* of the second vibration portion 132 may include a material having a loss coefficient of about 0.01 to about 1.0 and a modulus of about 0.1 GPa to about 10 GPa.

The organic material portion included in the second portion 131*b* of the first vibration portion 131 and the second portion 132*b* of the second vibration portion 132 may include one or more of an organic material, an organic polymer, an organic piezoelectric material, or an organic non-piezoelectric material that has a flexible characteristic or a ductile characteristic in comparison with the inorganic material portion of the first portion 131*a* of the first vibration portion 131 and the first portion 132*a* of the second vibration portion 132. For example, the second portion 131*b* of the first vibration portion 131 and the second portion 132*b* of the second vibration portion 132 may be referred to as an organic portion, an organic material, an adhesive portion, a stretch portion, a bending portion, a damping portion, a flexible portion, an elastic portion, or an elasticity portion, or the like, but embodiments of the present disclosure are not limited thereto.

The second portion 131*b* of the first vibration portion 131 according to an example embodiment of the present disclosure may include an organic material portion having a modulus which is different from that of the second portion 132*b* of the second vibration portion 132. For example, a modulus may be a Young's modulus. For example, when the second portion 131*b* of the first vibration portion 131 and the second portion 132*b* of the second vibration portion 132 are configured with materials having the same modulus, the inventors have recognized a problem where the first vibration portion 131 is unable to output a desired sound.

For example, the second portion 132*b* of the second vibration portion 132 may be configured with an epoxy material having a high modulus (for example, 0.1 to 10 GPa). When the second portion 131*b* of the first vibration portion 131 is configured with an epoxy material having a high modulus (for example, 0.1 to 10 GPa) which is the same as the second portion 132*b* of the second vibration portion 132, the inventors have recognized that a desired sound may not be output because a displacement of the first vibration portion 131 may not be maximized. Accordingly, in order to maximize a displacement of the first vibration portion 131, the second portion 131*b* of the first vibration portion 131 may be configured with a material which is softer than the second portion 132*b* of the second vibration portion 132.

For example, the second portion 131*b* of the first vibration portion 131 may be configured with a material having a modulus which is different from that of the second portion 132*b* of the second vibration portion 132. For example, the second portion 131*b* of the first vibration portion 131 may be configured with a material having a modulus which is smaller (or lower) than that of the second portion 132*b* of the second vibration portion 132. A modulus of the second portion 131*b* of the first vibration portion 131 may be 0.1 to 100 MPa, but embodiments of the present disclosure are not limited thereto. For example, the second portion 131*b* of the first vibration portion 131 may be configured with a resin material which is different from that of the second portion 132*b* of the second vibration portion 132. For example, the second portion 131*b* of the first vibration portion 131 may be configured with a material which is softer than epoxy resin.

ing the first vibration portion 131 and the second vibration portion 132 is configured, a sound characteristic and/or a sound pressure level characteristic of the low-pitched sound band may be complemented by the first vibration portion 131, and a sound characteristic and/or a sound pressure level characteristic of the high-pitched sound band may be complemented by the second vibration portion 132, thereby providing the vibration device 130 for outputting a uniform sound in a total pitched sound band from the low-pitched sound band to the high-pitched sound band.

Moreover, according to an example embodiment of the present disclosure, the second portion 131*b* of the first vibration portion 131 and the second portion 132*b* of the second vibration portion 132 are configured with materials having different modulus, thereby enhancing a sound characteristic and/or a sound pressure level characteristic of the low-pitched sound band of the first vibration portion 131.

For example, the second portion 131*b* of the first vibration portion 131 may be expressed as the following Equation 1.

[Equation 1]

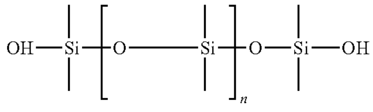

For example, the second portion 132*b* of the second vibration portion 132 may be expressed as the following Equation 2.

[Equation 2]

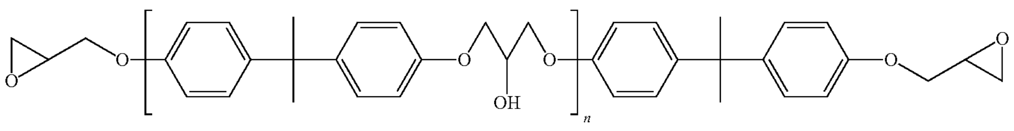

For example, the second portion 131*b* of the first vibration portion 131 may be configured with silicone resin, but embodiments of the present disclosure are not limited thereto. For example, a modulus of the second portion 132*b* of the second vibration portion 132 may be 0.1 to 10 GPa, but embodiments of the present disclosure are not limited thereto. For example, the second portion 132*b* of the second vibration portion 132 may be configured with epoxy resin. Therefore, a vibration displacement of the first vibration portion 131 may be maximized, and thus, a sound of the low-pitched sound band may be output. For example, in order to solve a problem where a sound of the low-pitched sound band is reduced when the vibration device is configured with the second vibration portion 132, the vibration device 130 may be configured to include the first vibration portion 131, thereby complementing a sound characteristic of the low-pitched sound band.

According to an example embodiment of the present disclosure, because the vibration device 130 including the first vibration portion 131 and the second vibration portion 132 is configured, a sound characteristic of the low-pitched sound band may be improved, thereby providing the vibration device 130 having the low-pitched sound band and a high-pitched sound band.

Figure 3A:
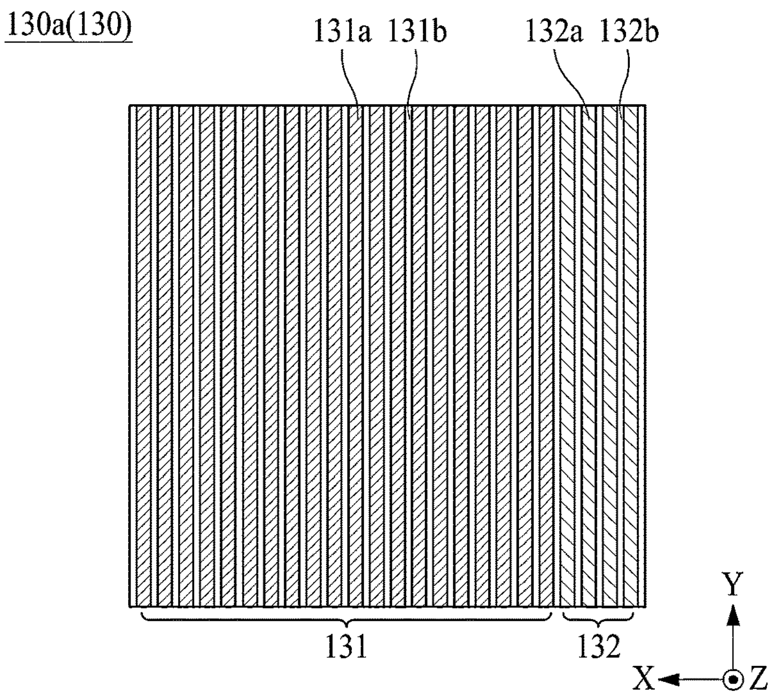
FIGS. 3A to 3F illustrate a vibration portion according to an example embodiment of the present disclosure.
Figure 3B:
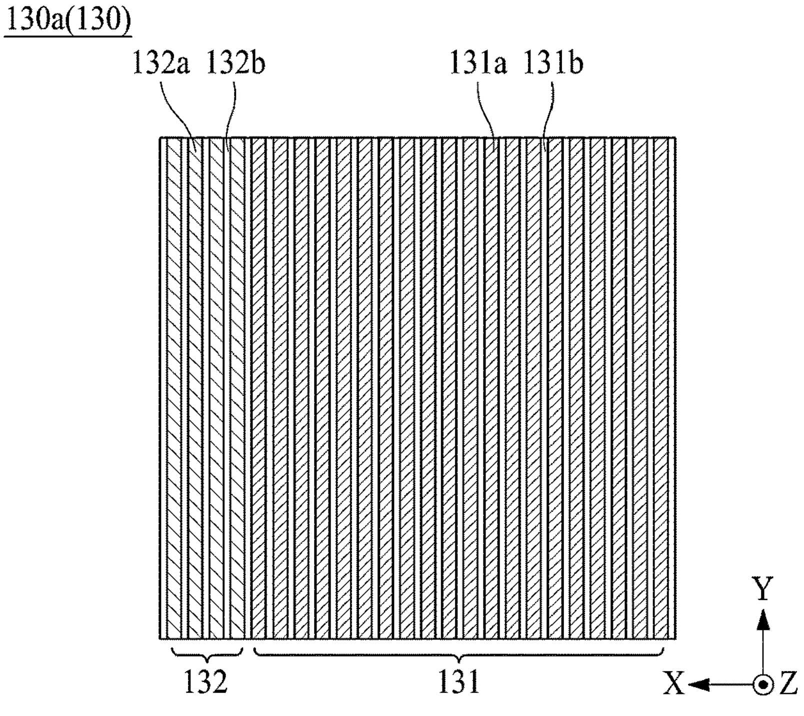
Figure 3C:
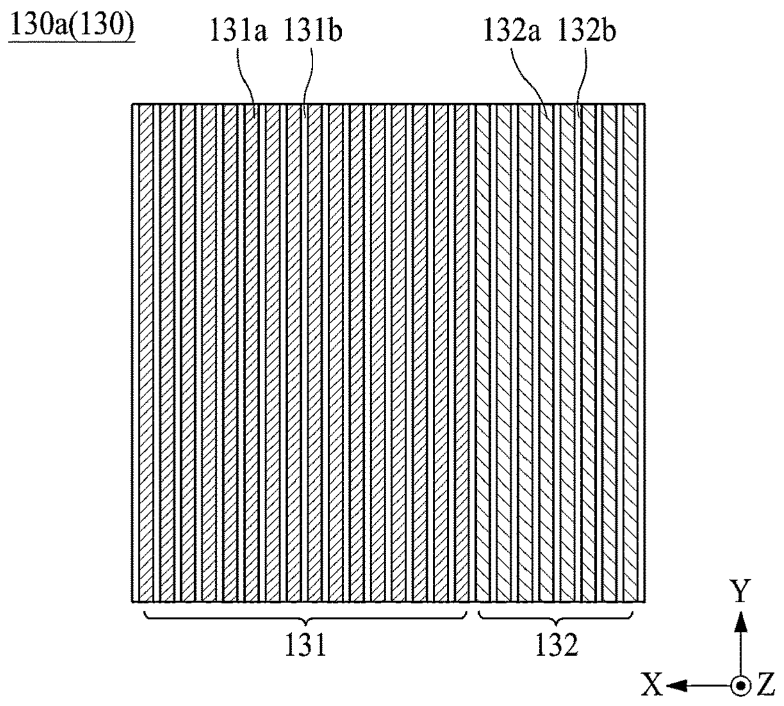
Figure 3D:
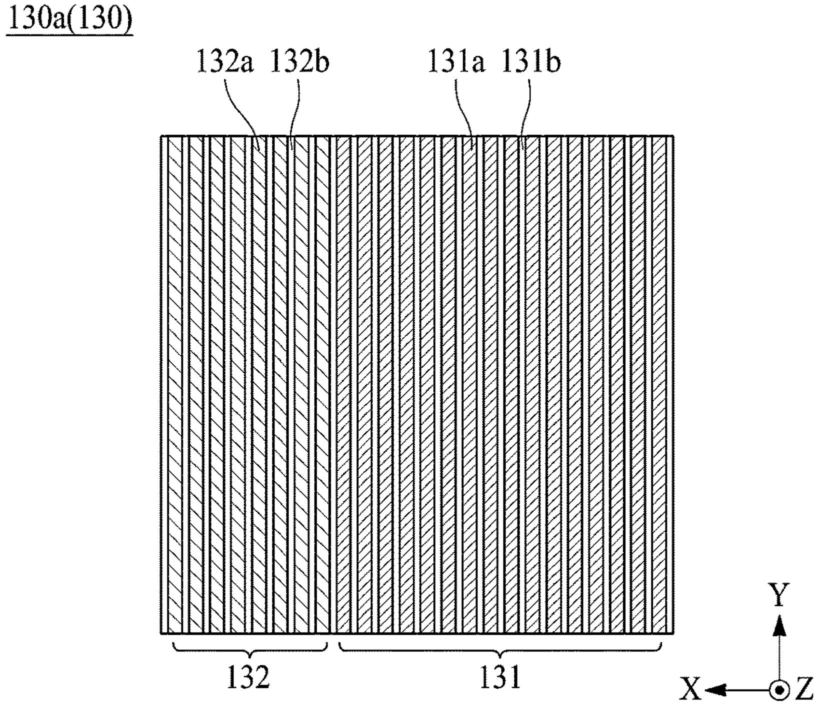

Moreover, according to an example embodiment of the present disclosure, because the vibration device 130 includ- With reference to FIGS. 3A to 3D, a vibration device 130 according to an example embodiment of the present disclosure may include a first vibration portion 131 and a second vibration portion 132. As in FIGS. 3A to 3C, a fraction of the first vibration portion 131 may increase more (or may be greater or larger) than a fraction of the second vibration portion 132, and thus, a sound of the low-pitched sound band may increase more (or may be greater, e.g., in outputting sound) than a sound of the high-pitched sound band. For example, a fraction may be a ratio of a volume occupied by the second vibration portion 132 to the first vibration portion 131, and a thickness of the first vibration portion 131 may be the same as that of the second vibration portion 132. For example, a fraction may be a size or an area. In FIGS. 3B and 3D, positions of the first vibration portion 131 and the second vibration portion 132 may be configured to be different from those of FIGS. 3A and 3C. For example, as in FIGS. 3B and 3D, positions of the first vibration portion 131 and the second vibration portion 132 may be configured to be opposite to those of FIGS. 3A and 3C.

Figure 3E:
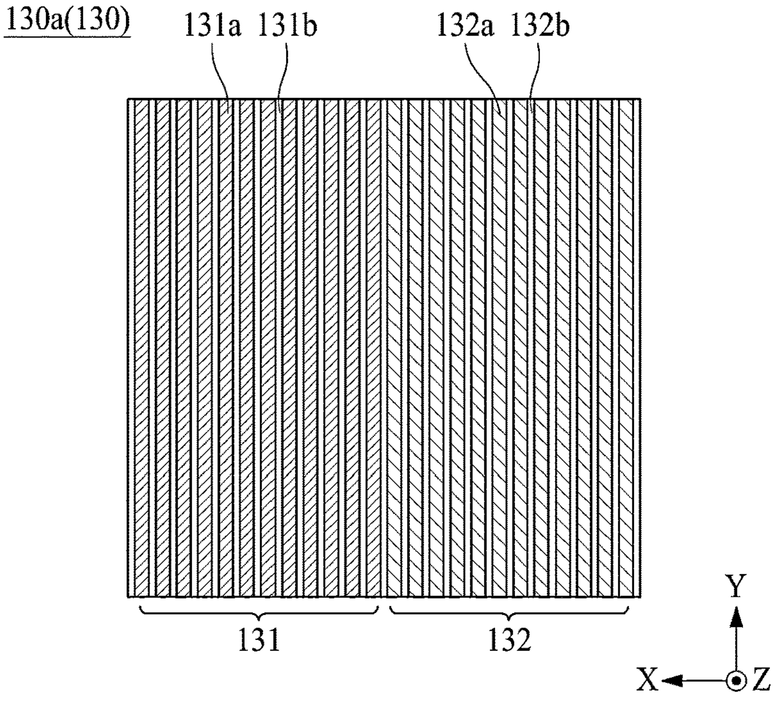
Figure 3F:
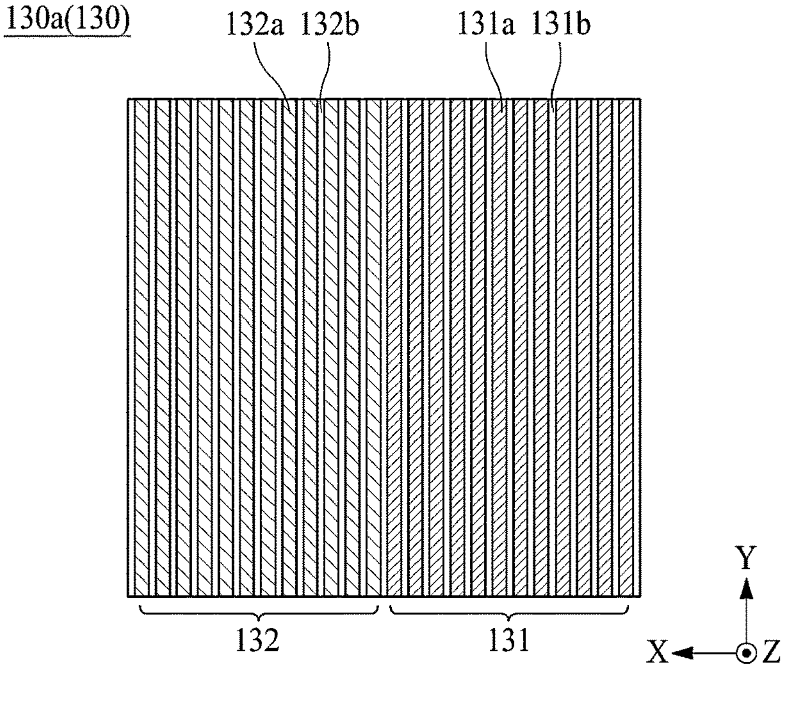

With reference to FIGS. 3E and 3F, a fraction of the first vibration portion 131 and a fraction of the second vibration portion 132 may be adjusted to be equal, and thus, a sound of the low-pitched sound band and the high-pitched sound band may be implemented. In FIG. 3E, positions of the first vibration portion 131 and the second vibration portion 132 may be configured to be different from those of FIG. 3F. For example, as in FIG. 3E, positions of the first vibration portion 131 and the second vibration portion 132 may be configured to be opposite to those of FIG. 3F.

According to an example embodiment of the present disclosure, a fraction (or a size) of each of the first vibration portion 131 and the second vibration portion 132 may be adjusted, thereby providing an apparatus for adjusting a sound of a desired pitched sound band. For example, a fraction (or a size) of the first vibration portion 131 may be configured to be greater than or equal to the second vibration portion 132, thereby providing an apparatus where a sound of the low-pitched sound band is enhanced more than a sound of the high-pitched sound band or providing an apparatus for implementing a sound from the low-pitched sound band to the high-pitched sound band. For example, a fraction (or a size) of each of the first vibration portion 131 and the second vibration portion 132 may be adjusted based on a sound characteristic and/or a sound pressure level characteristic needed for the vibration device 130, and thus, it may be easy to design the vibration device 130.

Moreover, the vibration device 130 according to an example embodiment of the present disclosure may be implemented as a thin film type as first portions 131*a* and 132*a* having a piezoelectric characteristic are alternately and repeatedly connected to second portions 131*b* and 132*b*, and thus, may be bent in a shape corresponding to a shape of the vibration member 100 or a vibration object. For example, in a case where the vibration device 130 is connected or coupled to the vibration member 100 including various curved portions by a connection member 150, the vibration device 130 may be bent in a curved shape along a shape of a curved portion of the vibration member 100, thereby providing an apparatus where reliability against damage or breakdown is not reduced despite being bent in a curved shape.

FIGS. 4A to 4D illustrate a vibration portion according to another example embodiment of the present disclosure.

With reference to FIGS. 4A to 4D, the vibration device 130 according to another example embodiment of the present disclosure may include a vibration portion 130*a*. The vibration portion 130*a* according to another example embodiment of the present disclosure may include a first vibration portion 131 and a second vibration portion 132.

Figure 4A:
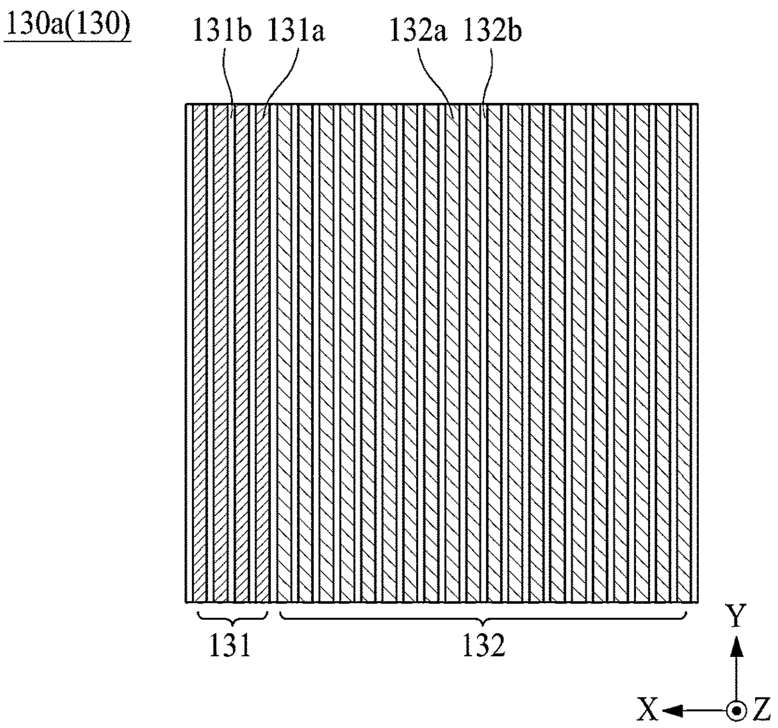
FIGS. 4A to 4D illustrate a vibration portion according to another example embodiment of the present disclosure.
Figure 4B:
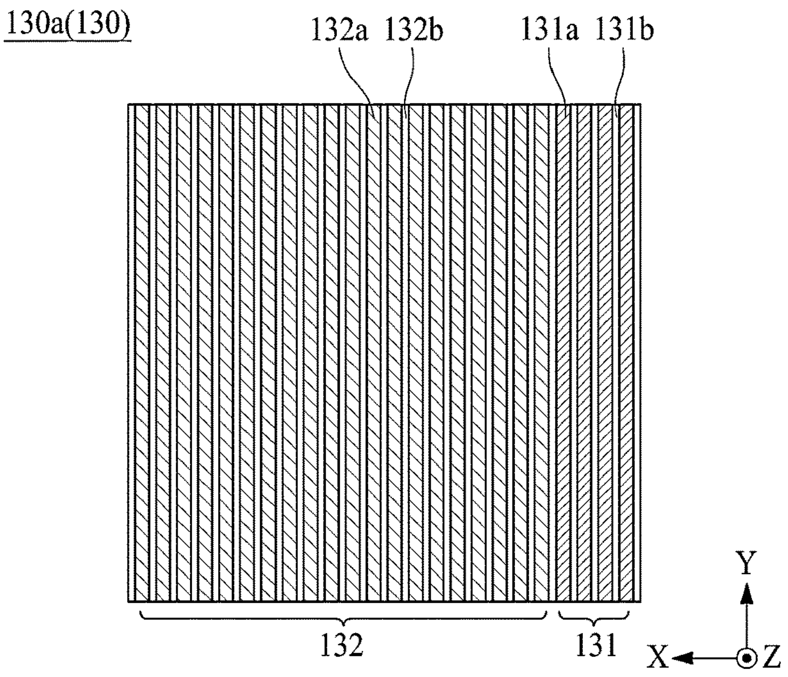
Figure 4C:
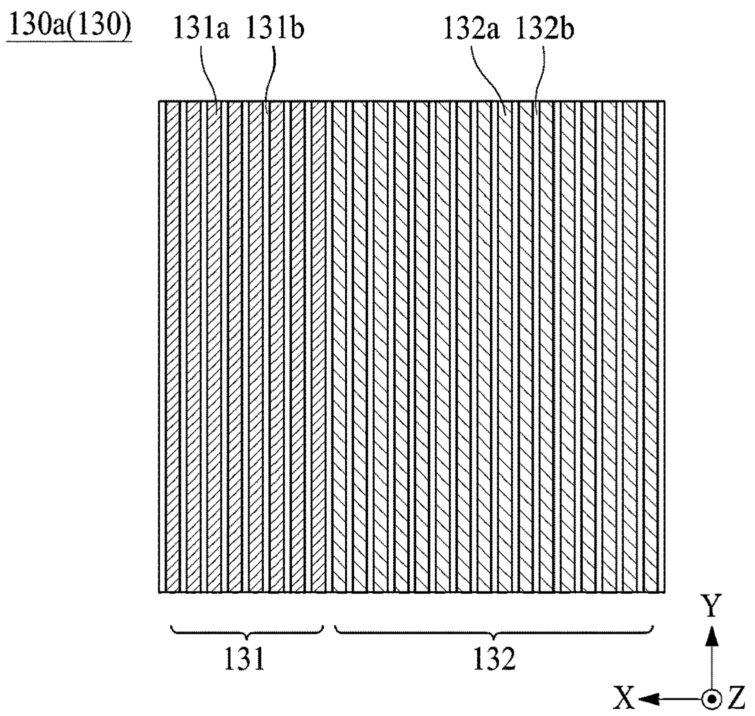
Figure 4D:
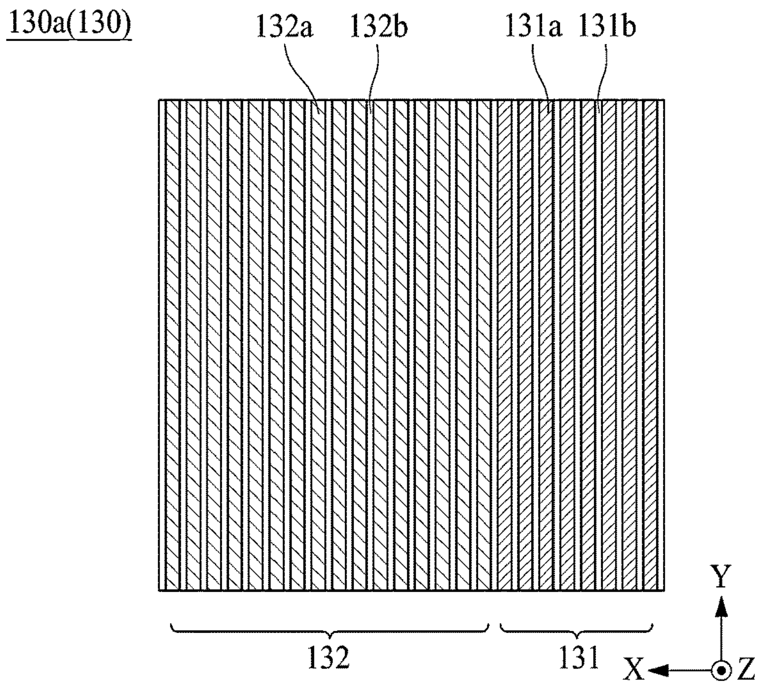

With reference to FIGS. 4A to 4D, a fraction of a second vibration portion 132 may increase more (or may be greater or larger) than a fraction of a first vibration portion 131, and thus, a sound of the high-pitched sound band may increase more (or may be greater) than a sound of the low-pitched sound band. In FIGS. 4B and 4D, positions of the first vibration portion 131 and the second vibration portion 132 may be configured to be different from those of FIGS. 4A and 4C. For example, as in FIGS. 4B and 4D, positions of the first vibration portion 131 and the second vibration portion 132 may be configured to be opposite to those of FIGS. 4A and 4C.

According to an example embodiment of the present disclosure, a fraction (or a size) of each of the first vibration portion 131 and the second vibration portion 132 may be adjusted, thereby providing an apparatus for adjusting a sound of a desired pitched sound band. For example, a fraction (or a size) of the second vibration portion 132 may be configured to be greater than the first vibration portion 131, thereby providing an apparatus where a sound of the low-pitched sound band is enhanced more than a sound of the high-pitched sound band. For example, a fraction (or a size) of each of the first vibration portion 131 and the second vibration portion 132 may be adjusted based on a sound characteristic and/or a sound pressure level characteristic needed for the vibration device 130, and thus, it may be easy to design the vibration device 130.

Figure 5A:
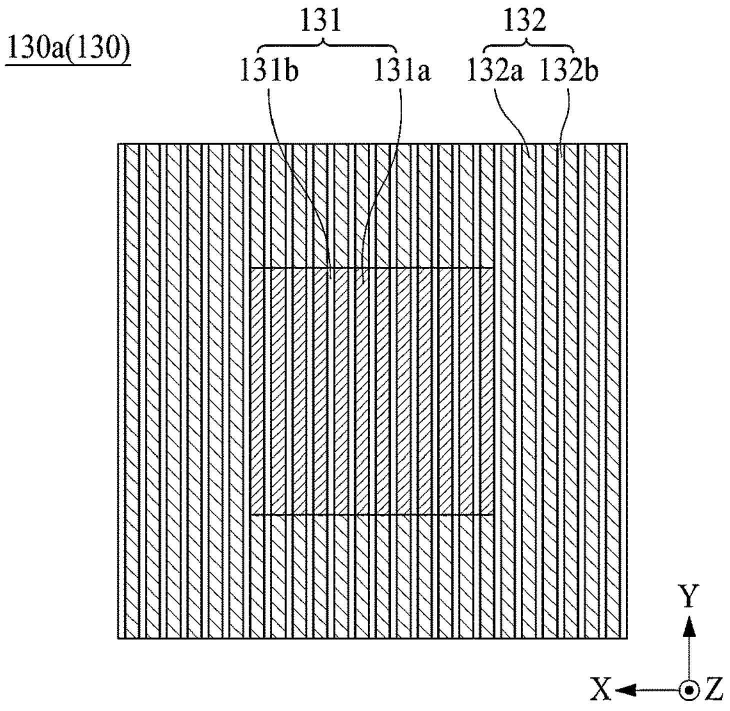
FIGS. 5A to 5D illustrate a vibration portion according to another example embodiment of the present disclosure.

FIGS. 5A to 4D illustrate a vibration portion according to another example embodiment of the present disclosure.

With reference to FIGS. 5A to 5D, the vibration device 130 according to another example embodiment of the present disclosure may include a vibration portion 130*a*. The vibration portion 130*a* according to another example embodiment of the present disclosure may include a first vibration portion 131 and a second vibration portion 132.

With reference to FIG. 5A, a first vibration portion 131 may be disposed at a center of a second vibration portion 132. For example, the second vibration portion 132 may surround the first vibration portion 131. For example, the second vibration portion 132 may be disposed outside the first vibration portion 131. According to an example embodiment of the present disclosure, because the first vibration portion 131 is disposed at the center of the second vibration portion 132, a uniform sound pressure level characteristic of a low sound and a high sound may be implemented compared to a case where an apparatus is configured with one vibration device (for example, the first vibration portion 131 or the second vibration portion 132). Further, a low frequency may be long in wavelength and may be weaker in linearity than a high frequency, and thus, when an apparatus is implemented with a vibration device (or a sound apparatus), displeasure may be caused by a vibration. Accordingly, comparing with a case where a vibration device is configured with only the first vibration portion 131, displeasure caused by a low sound may be reduced, and moreover, a high sound may be reinforced.

Figure 5B:
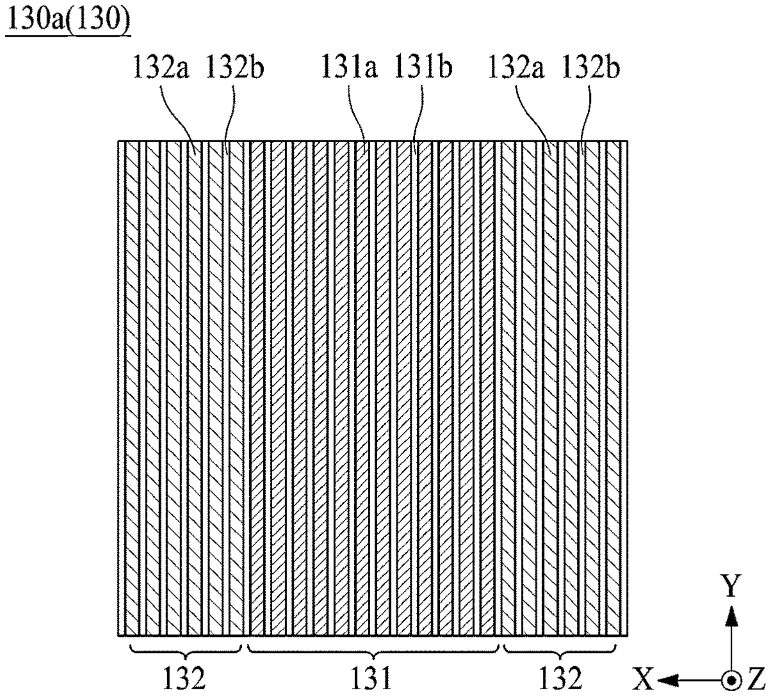
Figure 5C:
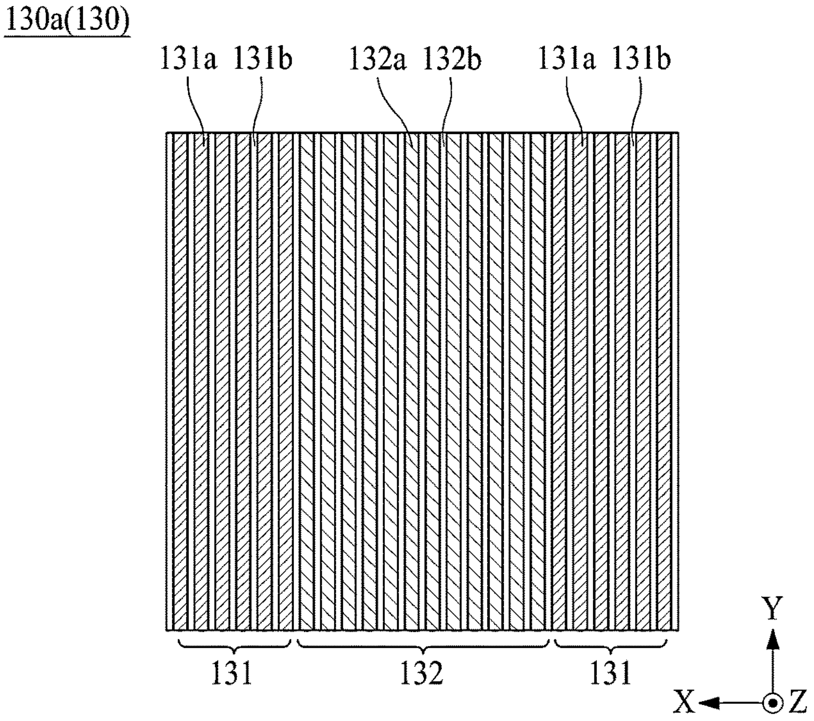
Figure 5D:
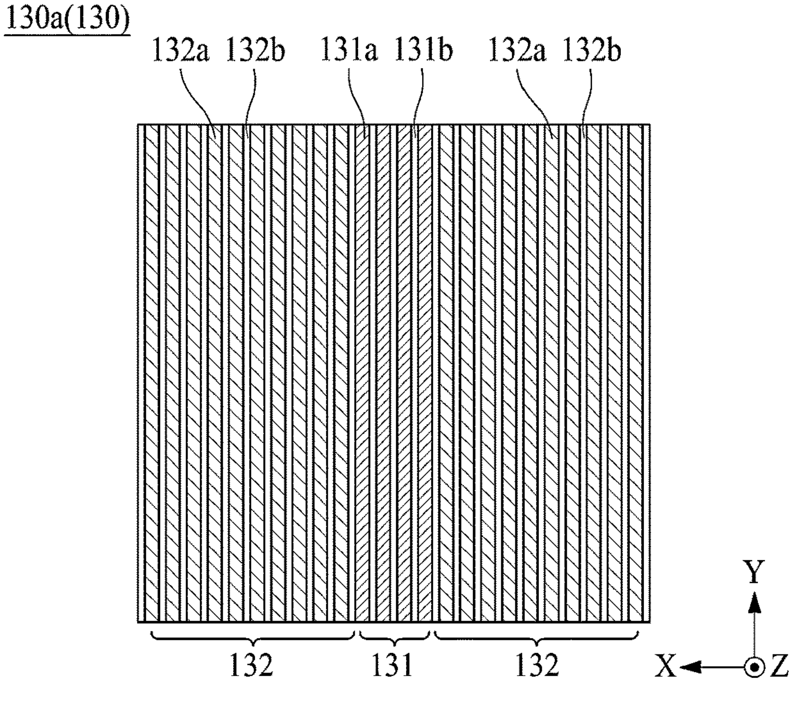

With reference to FIGS. 5B to 5D, a vibration portion 130*a* according to another example embodiment of the present disclosure may include a first vibration portion 131 and two second vibration portions 132. With reference to FIGS. 5B and 5D, the two second vibration portions 132 may be disposed at both sides of the first vibration portion 131. For example, the two second vibration portions 132 may be disposed with the first vibration portion 131 therebetween. Accordingly, a vibration device having a sound of the low-pitched sound band to the high-pitched sound band may be implemented.

With reference to FIG. 5B, because the two second vibration portions 132 are disposed with the first vibration portion 131 therebetween, a sound of the high-pitched sound band may be further enhanced. According to an example embodiment of the present disclosure, because the first vibration portion 131 is disposed at both sides of the second vibration portion 132, a uniform sound pressure level characteristic of a low sound and a high sound may be implemented compared to a case where an apparatus is configured with one vibration device (for example, the first vibration portion 131 or the second vibration portion 132). Further, a low frequency may be long in wavelength and may be weaker in linearity than a high frequency, and thus, when an apparatus is implemented with a vibration device (or a sound apparatus), displeasure may be caused by a vibration. Accordingly, comparing with a case where a vibration device is configured with only the first vibration portion 131, displeasure caused by a low sound may be reduced, and moreover, a high sound may be reinforced. Further, according to an example embodiment of the present disclosure, the first vibration portion 131 may reinforce a low sound to enhance a sound of the low-pitched sound band based on the first vibration portion 131, and the second vibration portion

132 may output a sound of the high-pitched sound band to enhance a sound of the high-pitched sound band based on the two second vibration portions 132.

With reference to FIG. 5D, a fraction (or a size) of the first vibration portion 131 may be configured to be smaller than the two second vibration portions 132, thereby providing an apparatus for implementing a sound of the low-pitched sound band to the high-pitched sound band. According to an example embodiment of the present disclosure, because the second vibration portion 132 is disposed at both sides of the first vibration portion 131, a uniform sound pressure level characteristic of a low sound and a high sound may be implemented compared to a case where an apparatus is configured with one vibration device (for example, the first vibration portion 131 or the second vibration portion 132). The manufacturing cost of the first vibration portion 131 may be more than the second vibration portion 132. Furthermore, comparing with FIG. 5B, as a fraction (or a size) of the first vibration portion 131 is reduced, a low sound may be reduced, but the manufacturing cost may decrease. By detecting a tradeoff point based on a low sound reinforcement effect with respect to the manufacturing cost, the degree of freedom in manufacturing the vibration device 130 may be enhanced based on the usefulness and manufacturing cost of the vibration device 130.

With reference to FIG. 5C, two first vibration portions 131 may be disposed at both sides of a second vibration portion 132. For example, the two first vibration portions 131 may be disposed with the second vibration portion 132 therebetween. Accordingly, a vibration device having a sound of the low-pitched sound band to the high-pitched sound band may be implemented. According to an example embodiment of the present disclosure, because the first vibration portion 131 is disposed at both sides of the second vibration portion 132, a uniform sound pressure level characteristic of a low sound and a high sound may be implemented compared to a case where an apparatus is configured with one vibration device (for example, the first vibration portion 131 or the second vibration portion 132). Further, in a high frequency, because a wavelength is shorter than a low frequency, a sound may not be transferred to a far position, but because the first vibration portion 131 is added in implementing an apparatus with a vibration device (or a sound apparatus), a transfer distance of a sound of the vibration device (or the sound apparatus) may increase and a low sound may also be reinforced. Furthermore, according to an example embodiment of the present disclosure, because the two first vibration portions 131 are disposed with the second vibration portion 132 therebetween, a sound of the low-pitched sound band may be further enhanced. Moreover, according to an example embodiment of the present disclosure, the first vibration portion 131 may reinforce a low sound to enhance a sound of the low-pitched sound band based on the first vibration portion 131, and the second vibration portion 132 may output a sound of the high-pitched sound band to enhance a sound of the high-pitched sound band based on the two second vibration portions 132.

According to an example embodiment of the present disclosure, a fraction (or a size) of each of the first vibration portion 131 and the second vibration portion 132 may be adjusted, thereby providing an apparatus for adjusting a sound of a desired pitched sound band. For example, a fraction (or a size) of each of the first vibration portion 131 and the second vibration portion 132 may be adjusted based on a sound characteristic and/or a sound pressure level characteristic needed for the vibration device 130, and thus, it may be easy to design the vibration device 130.

Figure 6:
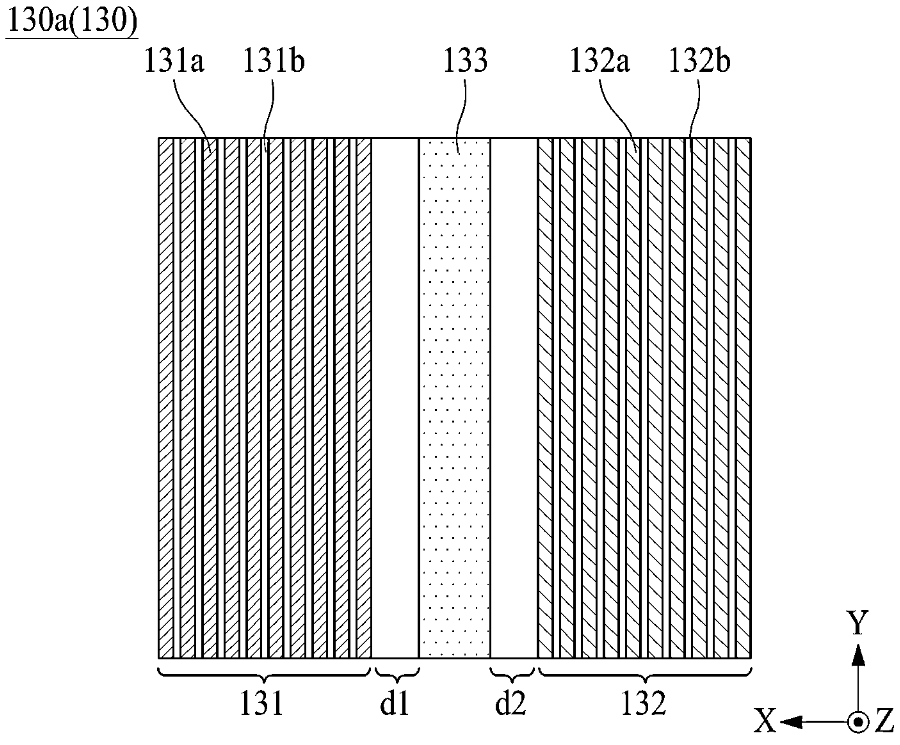
FIG. 6 illustrates a vibration portion according to another example embodiment of the present disclosure.

FIG. 6 illustrates a vibration portion according to another example embodiment of the present disclosure.

With reference to FIG. 6, a vibration portion 130*a* of a vibration device 130 according to an example embodiment of the present disclosure may further include a first layer 133. For example, the first layer 133 may be disposed between a first vibration portion 131 and a second vibration portion 132. The first layer 133 may prevent vibration interference between the first vibration portion 131 and the second vibration portion 132. For example, the first layer 133 may prevent sound and/or sound pressure level interference between the first vibration portion 131 and the second vibration portion 132. The first layer 133 may be referred to as a middle layer, a metal boundary layer, a boundary layer, a vibration interference prevention layer, or a sound interference prevention layer, but the terms are not limited thereto. The first layer 133 may be a metal layer, but embodiments of the present disclosure are not limited thereto. For example, the first layer 133 may include one or more of aluminum (Al), an Al alloy, copper (Cu), and a Cu alloy, but embodiments of the present disclosure are not limited thereto.

According to an example embodiment of the present disclosure, the first layer 133 may be spaced apart from the first vibration portion 131. The first layer 133 may be spaced apart from the second vibration portion 132. For example, the first vibration portion 131 may be spaced apart from the second vibration portion 132. For example, the first vibration portion 131 may be spaced apart from the second vibration portion 132 with the first layer 133 therebetween. A width of the first layer 133 may be adjusted within a range where the first layer 133 does not interfere in a vibration between the first vibration portion 131 and the second vibration portion 132. For example, a width of the first layer 133 may be narrower than a width of one or more of a first portion 131*a* of the first vibration portion 131 and a first portion 132*a* of the second vibration portion 132. For example, a width of the first layer 133 may be greater than one or more of a second portion 131*b* of the first vibration portion 131 and a second portion 132*b* of the second vibration portion 132. For example, a width of the first layer 133 may be 0.1 mm to 5 mm, but embodiments of the present disclosure are not limited thereto.

According to an example embodiment of the present disclosure, a first distance d1 between the first vibration portion 131 and the first layer 133 may be adjusted not to restrain a vibration of the first vibration portion 131 to the greatest extent possible. For example, the first distance d1 between the first vibration portion 131 and the first layer 133 may be 50 μm to 1 mm, but embodiments of the present disclosure are not limited thereto. For example, a second distance d2 between the second vibration portion 132 and the first layer 133 may be adjusted not to restrain a vibration of the second vibration portion 132 to the greatest extent possible. For example, the second distance d2 between the second vibration portion 132 and the first layer 133 may be 50 μm to 1 mm, but embodiments of the present disclosure are not limited thereto. For example, the first distance d1 may be the same as the second distance d2, but embodiments of the present disclosure are not limited thereto.

According to an example embodiment of the present disclosure, because the first layer 133 is provided between the first vibration portion 131 and the first layer 133, a vibration interference between the first vibration portion 131 and the first layer 133 may be prevented, thereby providing a vibration device for providing a cleaner sound.

Figure 7:
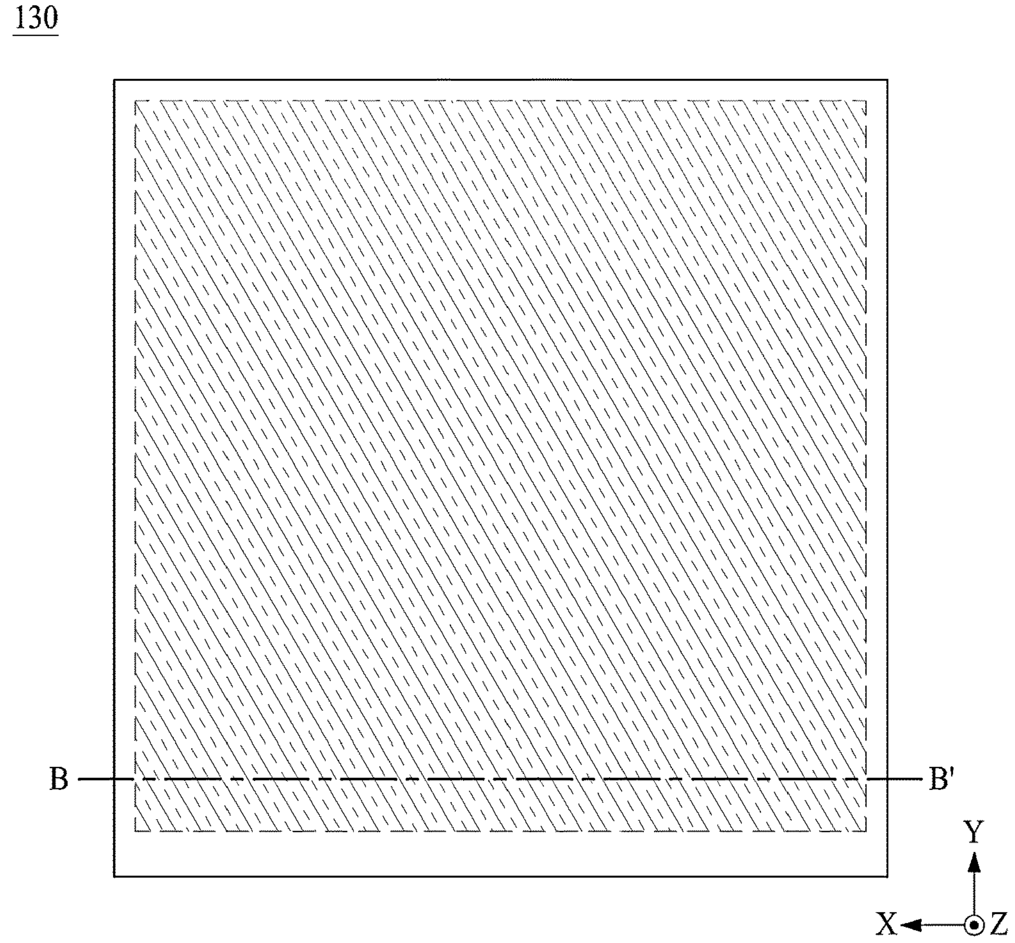
FIG. 7 illustrates an apparatus according to another example embodiment of the present disclosure.
Figure 8:
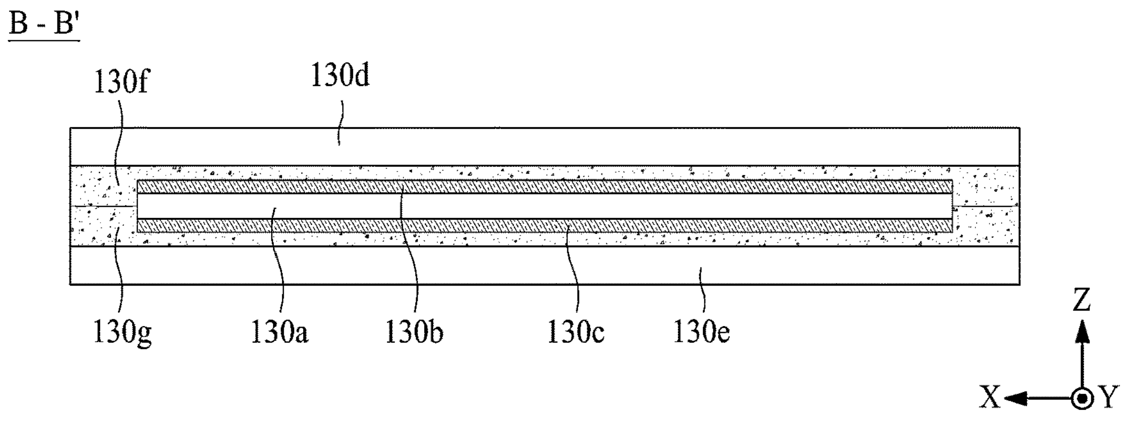
FIG. 8 is an example of a cross-sectional view taken along line B-B' of FIG. 7.

FIG. 7 illustrates an apparatus according to another example embodiment of the present disclosure. FIG. 8 is an example of a cross-sectional view taken along line B-B' of FIG. 7.

With reference to FIGS. 7 and 8, a vibration device 130 according to an example embodiment of the present disclosure may be referred to as a flexible vibration structure, a flexible vibrator, a flexible vibration generating device, a flexible vibration generator, a flexible sounder, a flexible sound device, a flexible sound generating device, a flexible sound generator, a flexible actuator, a flexible speaker, a flexible piezoelectric speaker, a film actuator, a film-type piezoelectric composite actuator, a film speaker, a film-type piezoelectric speaker, or a film-type piezoelectric composite speaker, or the like, but embodiments of the present disclosure are not limited thereto.

With reference to FIGS. 7 and 8, a vibration device 130 according to an example embodiment of the present disclosure may include a vibration portion 130*a*, a first electrode portion 130*b*, and a second electrode portion 130*c*. The vibration portion 130*a* is the same or substantially the same as the vibration portion 130*a* described above with reference to FIGS. 3A to 6, and thus, the repetitive description thereof may be omitted. For example, the vibration portion 130*a* may include at least one or more of the vibration portion 130*a* of the vibration device 130 described above with reference to FIGS. 3A to 6.

The first electrode portion 130*b* may be disposed at a first surface (or an upper surface) of the vibration portion 130*a*. For example, the first electrode portion 130*b* may be disposed at or coupled to a first surface of each of a plurality of first portions 131*a* and a first surface of each of a plurality of second portions 131*b* of the first vibration portion 131 in common. For example, the first electrode portion 130*b* may be electrically connected to the first surface of each of the plurality of first portions 131*a* and the plurality of second portions 131*b*. For example, the first electrode portion 130*b* may be disposed at or coupled to a first surface of each of a plurality of first portions 132*a* and a first surface of each of a plurality of second portions 132*b* of the second vibration portion 132 in common. For example, the first electrode portion 130*b* may be electrically connected to the first surface of each of the plurality of first portions 132*a* and the plurality of second portions 132*b*. For example, the first electrode portion 130*b* may have a single-body electrode shape which is disposed at a whole (or entire) first surface of the vibration portion 130*a*. For example, the first electrode portion 130*b* may have substantially the same shape (or the same shape and size) as the vibration portion 130*a*, but embodiments of the present disclosure are not limited thereto.

The first electrode portion 130*b* according to an example embodiment of the present disclosure may be formed of a transparent conductive material, a semitransparent conductive material, or an opaque conductive material. For example, the transparent conductive material or the semitransparent conductive material may include one or more of indium tin oxide (ITO) or indium zinc oxide (IZO), but embodiments of the present disclosure are not limited thereto. The opaque conductive material may include one or more of aluminum (Al), copper (Cu), gold (Au), silver (Ag), molybdenum (Mo), Mg, or the like, or an alloy thereof, but embodiments of the present disclosure are not limited thereto.

The second electrode portion 130*c* may be disposed at a surface different from (or opposite to) the first surface of the vibration portion 130*a*. For example, the second electrode portion 130*c* may be disposed at a second surface (or a rear surface) different from (or opposite to) the first surface of the vibration portion 130*a*. The second electrode portion 130*c* may be disposed at or coupled to a second surface of each of a plurality of first portions 131*a* and the second surface of each of a plurality of second portions 131*b* of the first vibration portion 131 in common. For example, the second electrode portion 130*c* may be electrically connected to the second surface of each of the plurality of first portions 131*a* and the plurality of second portions 131*b* of the first vibration portion 131. For example, the second electrode portion 130*c* may be disposed at or coupled to a second surface of each of a plurality of first portions 132*a* and the second surface of each of a plurality of second portions 132*b* of the second vibration portion 132 in common. For example, the second electrode portion 130*c* may be electrically connected to the second surface of each of the plurality of first portions 132*a* and the plurality of second portions 132*b* of the second vibration portion 132. For example, the second electrode portion 130*c* may have a single-body electrode shape which is disposed at a whole (or entire) second surface of the vibration portion 130*a*. The second electrode portion 130*c* may have the same shape (or the same shape and size) as the vibration portion 130*a*, but embodiments of the present disclosure are not limited thereto.

The second electrode portion 130*c* according to an example embodiment of the present disclosure may be formed of a transparent conductive material, a semitransparent conductive material, or an opaque conductive material. For example, the second electrode portion 130*c* may be formed of the same material as the first electrode portion 130*b*, but embodiments of the present disclosure are not limited thereto. As another example embodiment of the present disclosure, the second electrode portion 130*c* may be formed of a different material than that of the first electrode portion 130*b*.

The vibration portion 130*a* may be polarized (or poling) by a certain voltage applied to the first electrode portion 130*b* and the second electrode portion 130*c* in a certain temperature atmosphere, or a temperature atmosphere that may be changed from a high temperature to a room temperature, but embodiments of the present disclosure are not limited thereto. For example, the vibration portion 130*a* may alternately and repeatedly contract and expand based on an inverse piezoelectric effect according to a sound signal (or a voice signal) applied to the first electrode portion 130*b* and the second electrode portion 130*c* from the outside to vibrate. For example, the vibration portion 130*a* may vibrate based on a vertical-direction vibration and a planar direction vibration by a sound signal applied to the first electrode portion 130*b* and the second electrode portion 130*c*. The vibration portion 130*a* may increase the displacement of a vibration member (or a vibration plate or a vibration object) by contraction and expansion of the planar direction, thereby further improving the vibration.

The vibration device 130 according to an example embodiment of the present disclosure may further include a first cover member 130*d* and a second cover member 130*e*.

The first cover member 130*d* may be disposed at the first surface of the vibration portion 130*a*. For example, the first cover member 130*d* may be disposed at the first electrode portion 130*b*. For example, the first cover member 130*d* may be configured to cover the first electrode portion 130*b*. Accordingly, the first cover member 130*d* may protect the first electrode portion 130*b*.

The second cover member 130*e* may be disposed at the second surface of the vibration portion 130*a*. For example, the second cover member 130*e* may be disposed at the second electrode portion 130*c*. For example, the second cover member 130*e* may be configured to cover the second electrode portion 130*c*. Accordingly, the second cover member 130*e* may protect the second electrode portion 130*c*.

The first cover member 130*d* and the second cover member 130*e* according to an example embodiment of the present disclosure may each include one or more materials of a plastic, a fiber, and wood, but embodiments of the present disclosure are not limited thereto. For example, each of the first cover member 130*d* and the second cover member 130*e* may include the same or different material. For example, each of the first cover member 130*d* and the second cover member 130*e* may include one or more of a polyimide (PI) film, a polyethylene terephthalate (PET) film, or a polyethylene naphthalate (PEN) film, but embodiments of the present disclosure are not limited thereto.

The first cover member 130*d* according to an example embodiment of the present disclosure may be connected or coupled to the first electrode portion 130*b* by a first adhesive layer 130*f*. For example, the first cover member 130*d* may be connected or coupled to the first electrode portion 130*b* by a film laminating process using the first adhesive layer 130*f*.

The second cover member 130*e* according to an example embodiment of the present disclosure may be connected or coupled to the second electrode portion 130*c* by a second adhesive layer 130*g*. For example, the second cover member 130*e* may be connected or coupled to the second electrode portion 130*c* by a film laminating process using the second adhesive layer 130*g*.

The first adhesive layer 130*f* may be disposed between the first electrode portion 130*b* and the first cover member 130*d*. The second adhesive layer 130*g* may be disposed between the second electrode portion 130*c* and the second cover member 130*e*. For example, the first adhesive layer 130*f* and second adhesive layer 130*g* may be configured between the first cover member 130*d* and the second cover member 130*e* to surround or completely surround the vibration portion 130*a*, the first electrode portion 130*b*, and the second electrode portion 130*c*. For example, the vibration portion 130*a*, the first electrode portion 130*b*, and the second electrode portion 130*c* may be embedded or built-in between the first adhesive layer 130*f* and the second adhesive layer 130*g*.

Each of the first adhesive layer 130*f* and second adhesive layer 130*g* according to an example embodiment of the present disclosure may include an electrically insulating material which has adhesiveness and is capable of compression and decompression. For example, each of the first adhesive layer 130*f* and the second adhesive layer 130*g* may include an epoxy resin, an acrylic resin, a silicone resin, or a urethane resin, but embodiments of the present disclosure are not limited thereto.

According to an example embodiment of the present disclosure, any one of the first cover member 130*d* and the second cover member 130*e* may be attached to or coupled to the vibration member (or the vibration plate or the vibration object) by a connection member. For example, any one of the first cover member 130*d* and the second cover member 130*e* may be attached on or coupled to the vibration member 100 by the connection member 150 as described above with reference to FIGS. 1 and 2.

A method of manufacturing the first vibration portion 131 according to an example embodiment of the present disclosure will be described below.

The first vibration portion 131 may be formed by a solid state crystal growth process, but embodiments of the present disclosure are not limited thereto. For example, the solid state crystal growth process may be a process of mixing powders such as ceramic or the like, attaching a mixed powder on a single-crystalline seed, and growing poly-crystal into single crystal through a sintering process. For example, the single-crystalline seed may be BaTixZr(1−x)$O_3$, but embodiments of the present disclosure are not limited thereto. To describe such a process, powders such as ceramic or the like may be mixed, milled, and fired. A firing temperature may be 800° C., but a temperature is not limited thereto. In addition, secondary raw materials may be mixed and milled. For example, the secondary raw material may be a lead (Pb) compensation raw material, but embodiments of the present disclosure are not limited thereto. In addition, pellets may be manufactured and sintered. Furthermore, by using a seed template (for example, poly-crystal), growth of a compound may be induced, and crystal growth and Pb compensation may be performed, thereby manufacturing the first vibration portion 131. Crystal growth and Pb compensation may be performed for 200 hours or more at a temperature of 900° C. or more, but embodiments of the present disclosure are not limited thereto.

The first vibration portion 131 according to another example embodiment of the present disclosure may be formed by a Bridgman process. For example, the Bridgman process may be a process of melting all mixed powders including ceramic or the like to a liquid state at a high temperature and growing single crystal from a small single crystal nucleus. To describe such a process, powders such as ceramic or the like may be mixed, milled, and melted. A melting temperature may be 1,300° C. to 1,700° C., but embodiments of the present disclosure are not limited thereto. Furthermore, crystallization of a melted material may be induced while lowering a temperature, and thus, single crystal may be grown, thereby manufacturing the first vibration portion 131. A crystallization temperature may be 800° C. to 1,400° C., but embodiments of the present disclosure are not limited thereto.

A method of manufacturing a vibration device 130 including a first vibration portion 131 and a second vibration portion 132 according to another example embodiment of the present disclosure will be described below. A method of manufacturing the second vibration portion 132 may be the same or substantially the same as a method of manufacturing the first vibration portion 131, and thus, a method of manufacturing the first vibration portion 131 will be described as an example.

An inorganic material mother substrate having a plate shape and a piezoelectric characteristic may be manufactured through a pre-process.

A pre-process according to an example embodiment of the present disclosure may mix and dry a ceramic raw material, crystallize a crystalline structure through a firing process, and perform a molding process and a sintering process at least once, thereby manufacturing an inorganic material mother substrate having a plate shape. For example, the inorganic material mother substrate having a plate shape may include piezoelectric ceramic having a perovskite-based crystalline structure. The sintering process may use heat, pressure, and spike plasma.

By cutting the inorganic material mother substrate by predetermined size units through a cutting process, each of a plurality of first portions 131*a* (or each of a plurality of cut first portions 131*a*) may be manufactured from a respective one of a plurality of inorganic material mother substrates.

For example, the cutting process may be performed by at least one of a wire sawing process, a scribing process, a blade dicing process, a laser cutting process, a stealth dicing process, and a thermal laser separation (TLS) process, but embodiments of the present disclosure are not limited thereto. Further, a plurality of second portions 131*b* may be injected between the plurality of first portions 131*a* and may be cured.

In this manner, the second vibration portion 132 may be manufactured.

Subsequently, a first electrode portion 130*b* may be formed at a first surface of each of the first vibration portion 131 and the second vibration portion 132, and a second electrode portion 130*c* may be formed at a second surface, which is opposite to the first surface, of each of the first vibration portion 131 and the second vibration portion 132.

Subsequently, each of the plurality of first portions 131*a* and 132*a* disposed in the first vibration portion 131 and the second vibration portion 132 may be polarized (or poling) using a polarization (or a poling) process of applying a certain voltage to the first electrode portion 130*b* and the second electrode portion 130*c* at a certain temperature atmosphere or a temperature atmosphere where a high temperature is changed to a room temperature.

Subsequently, a pad connected to each of the first electrode portion 130*b* and the second electrode portion 130*c* may be formed, and cover members 130*d* and 130*e* respectively covering the first electrode portion 130*b* and the second electrode portion 130*c* may be formed, thereby completing a post-process of the vibration device 130.

A method of manufacturing a vibration device 130 including a first vibration portion 131 and a second vibration portion 132 according to another example embodiment of the present disclosure will be described below.

In solid state crystal growth, before a poly-crystal is changed to a single crystal by 100%, a process may stop at 50% or less (for example, 20% to 80%) of a manufacturing process and ceramic of a portion where a single crystal and a poly-crystal are provided in common may be obtained, and then, a vibration device including the first vibration portion 131 and the second vibration portion 132 may be manufactured.

Figure 9:
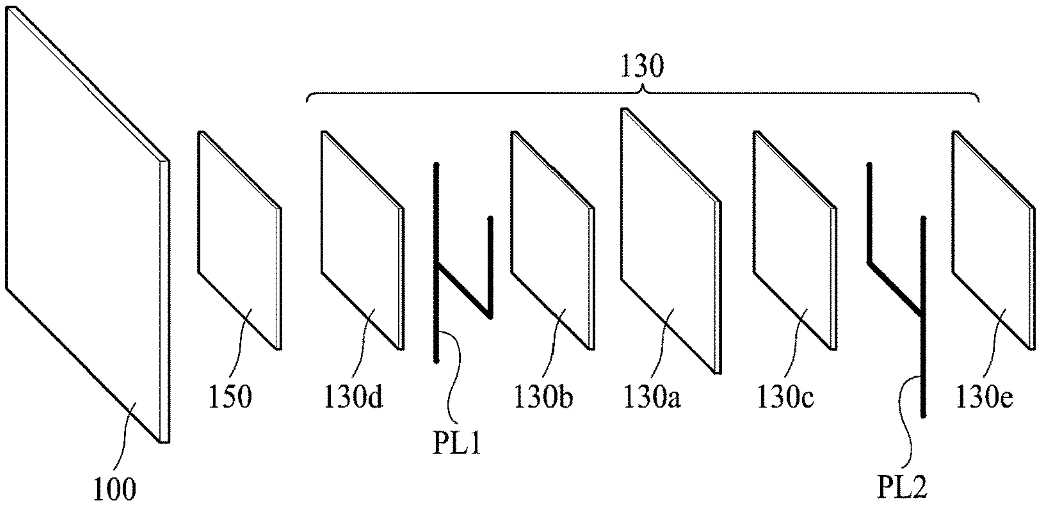
FIG. 9 illustrates an apparatus according to another example embodiment of the present disclosure.
Figure 10:
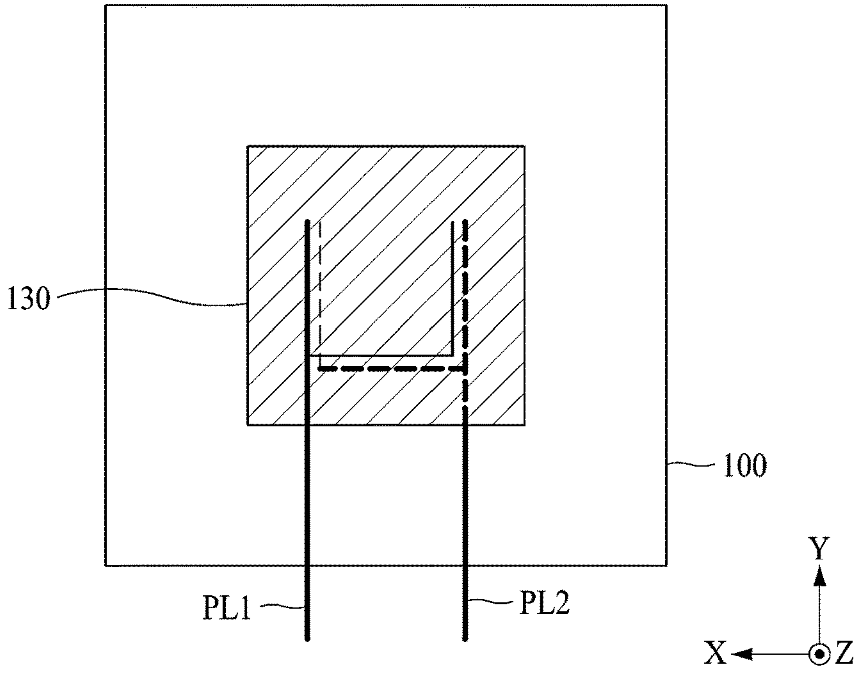
FIG. 10 is a plan view of a vibration device according to an example embodiment of the present disclosure.

FIG. 9 illustrates an apparatus according to another example embodiment of the present disclosure. FIG. 10 is a plan view of a vibration device according to an example embodiment of the present disclosure.

FIG. 9 illustrates an example where the vibration device according to an example embodiment of the present disclosure is coupled (or connected) to the apparatus.

With reference to FIG. 9, the apparatus according to another example embodiment of the present disclosure may include a vibration member 100 and a vibration device 130 at a rear surface of the vibration member 100. A description of the vibration device 130 may be the same or substantially the same as the descriptions of FIGS. 7 and 8, and thus, like reference numerals may refer to like elements, and the repetitive description thereof may be omitted.

The vibration device 130 according to an example embodiment of the present disclosure may further include a first power supply line PL1 and a second power supply line PL2. For example, the first power supply line PL1 may be disposed at a first cover member 130*d*. For example, the second power supply line PL2 may be disposed at a second cover member 130*e*.

The first power supply line PL1 may be disposed between a first electrode portion 130*b* and the first cover member 130*d*. For example, the first power supply line PL1 may be electrically connected to the first electrode portion 130*b*. For example, the first power supply line PL1 may be electrically connected to a center portion of the first electrode portion 130*b*. With reference to FIG. 10, the first power supply line PL1 may be extended in length along the second direction Y. As an example embodiment of the present disclosure, the first power supply line PL1 may be electrically connected to the first electrode portion 130*b* by an anisotropic conductive film. As another example embodiment of the present disclosure, the first power supply line PL1 may be electrically connected to the first electrode portion 130*b* through a conductive material (or particle) included in the first adhesive layer 130*f*.

The second power supply line PL2 may be disposed between a second electrode portion 130*c* and the second cover member 130*e*. For example, the second power supply line PL2 may be electrically connected to the second electrode portion 130*c*. For example, the second power supply line PL2 may be electrically connected to a center portion of the second electrode portion 130*c*. With reference to FIG. 10, the second power supply line PL2 may be extended in length along the second direction Y. As an example embodiment of the present disclosure, the second power supply line PL2 may be electrically connected to the second electrode portion 130*c* by an anisotropic conductive film. As another example embodiment of the present disclosure, the second power supply line PL2 may be electrically connected to the second electrode portion 130*c* through a conductive material (or particle) included in the second adhesive layer 130*g*.

The vibration device 130 according to an example embodiment of the present disclosure may further include a pad part electrically connected to the first power supply line PL1 and the second power supply line PL2. The pad part may be configured at one periphery portion of any one of the first cover member 130*d* and the second cover member 130*e* to be electrically connected to one portion (or one end) of each of the first power supply line PL1 and the second power supply line PL2.

The pad part according to an example embodiment of the present disclosure may include a first pad electrode electrically connected to one end (or one portion) of the first power supply line PL1, and a second pad electrode electrically connected to one end (or one portion) of the second power supply line PL2.

The first pad electrode may be disposed at one periphery portion of any one of the first cover member 130*d* and the second cover member 130*e* to be electrically connected to one end (or one portion) of the first power supply line PL1. For example, the first pad electrode may pass through any one of the first cover member 130*d* and the second cover member 130*e* to be electrically connected to one end (or one portion) of the first power supply line PL1.

The second pad electrode may be disposed in parallel with the first pad electrode to be electrically connected to one end (or one portion) of the second power supply line PL2. For example, the second pad electrode may pass through any one of the first cover member 130*d* and the second cover member 130*e* to be electrically connected to one end (or one portion) of the second power supply line PL2.

According to an example embodiment of the present disclosure, each of the first power supply line PL1, the second power supply line PL2, and the pad part may be configured to be transparent, translucent, or opaque.

The pad part according to another example embodiment of the present disclosure may be electrically connected to a signal cable.

The signal cable may be electrically connected to the pad part disposed at the vibration device 130 and may supply the vibration device 130 with vibration driving signals (or a sound signal) provided from a sound processing circuit. The signal cable according to an example embodiment of the present disclosure may include a first terminal and a second terminal. For example, the first terminal may be electrically connected to the first pad electrode of the pad part. For example, the second terminal may be electrically connected to the second pad electrode of the pad part. For example, the signal cable may be configured as a flexible printed circuit cable, a flexible flat cable, a single-sided flexible printed circuit, a single-sided flexible printed circuit board, a flexible multilayer printed circuit, or a flexible multilayer printed circuit board, but embodiments of the present disclosure are not limited thereto. The signal cable according to an example embodiment of the present disclosure may be configured to be transparent, translucent, or opaque.

The sound processing circuit may generate an alternating current (AC) vibration driving signal including a first vibration driving signal and a second vibration driving signal based on a sound data provided from an external sound data generating circuit part. The first vibration driving signal may be any one of a positive (+) vibration driving signal and a negative (−) vibration driving signal, and the second vibration driving signal may be any one of a positive (+) vibration driving signal and a negative (−) vibration driving signal. For example, the first vibration driving signal may be supplied to the first electrode portion 130*b* through a first terminal of the signal cable, the first pad electrode of the pad part, and the first power supply line PL1. The second vibration driving signal may be supplied to the second electrode portion 130*c* through a second terminal of the signal cable, the second pad electrode of the pad part, and the second power supply line PL2.

Figure 11:
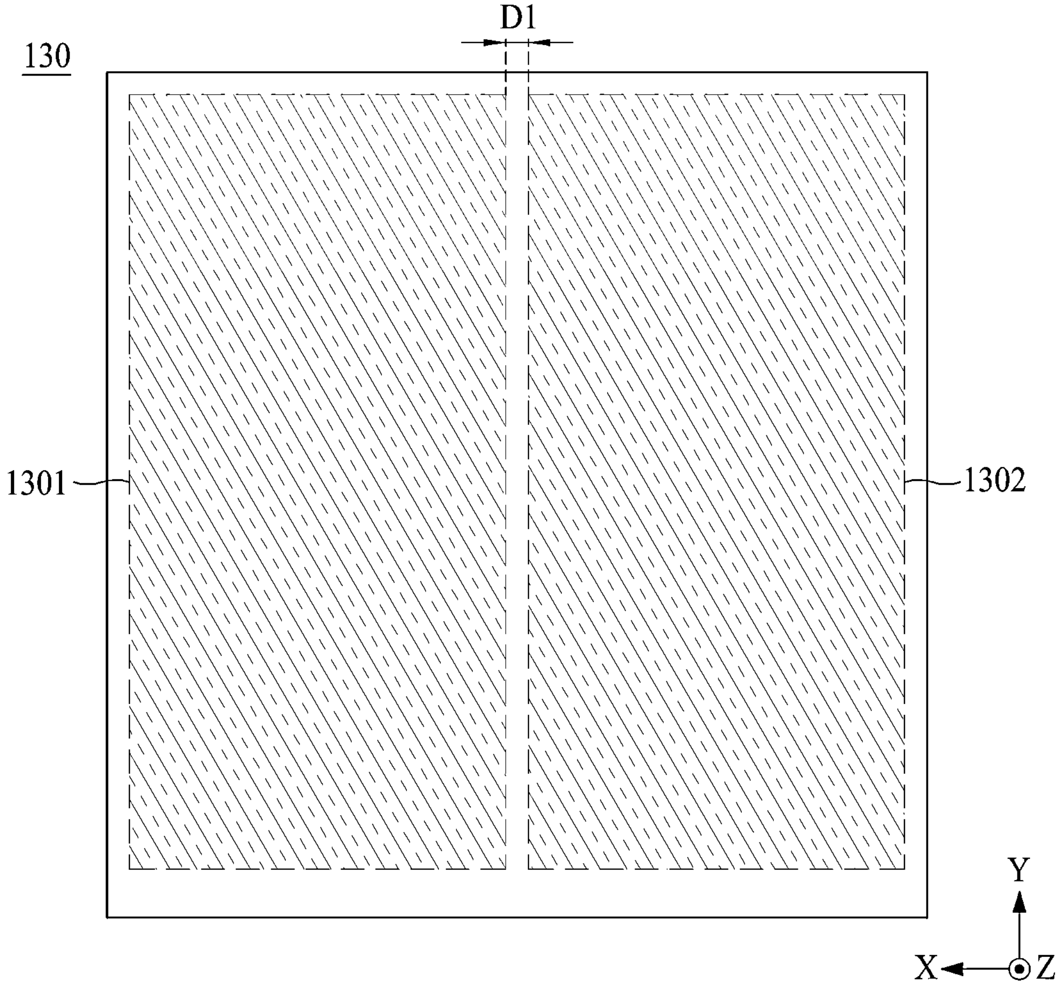
FIG. 11 illustrates an apparatus according to another example embodiment of the present disclosure.

FIG. 11 illustrates a vibration device according to another example embodiment of the present disclosure.

With reference to FIG. 11, the vibration device 130 according to another example embodiment of the present disclosure may include at least two or more vibration generating portions 1301 and 1302. For example, the vibration device 130 according to another example embodiment of the present disclosure may include first and second vibration generating portions 1301 and 1302.

Each of the first and second vibration generating portions 1301 and 1302 may be electrically separated and disposed while being spaced apart from each other along a first direction X. Each of the first and second vibration generating portions 1301 and 1302 may alternately and repeatedly contract and/or expand based on a piezoelectric effect to vibrate. For example, the first and second vibration generating portions 1301 and 1302 may be disposed or tiled at a certain interval (or distance) D1 along the first direction X. Thus, the vibration device 130 in which the first and second vibration generating portions 1301 and 1302 are tiled may be a vibration array, a vibration array part, a vibration module array part, a vibration array structure, a tiling vibration array, a tiling vibration array module, or a tiling vibration film, but embodiments of the present disclosure are not limited thereto.

Each of the first and second vibration generating portions 1301 and 1302 according to an example embodiment of the present disclosure may have a tetragonal shape. For example, each of the first and second vibration generating portions 1301 and 1302 may have a tetragonal shape having a width of about 5 cm or more. For example, each of the first and second vibration generating portions 1301 and 1302 may have a square shape having a size of 5 cm×5 cm or more, but embodiments of the present disclosure are not limited thereto.

Each of the first and second vibration generating portions 1301 and 1302 may be arranged or tiled on the same plane, and thus, the vibration device 130 may have an enlarged area based on tiling of the first and second vibration generating portions 1301 and 1302 having a relatively small size.

Each of the first and second vibration generating portions 1301 and 1302 may be arranged or tiled at a certain interval D1, and thus, may be implemented as one vibration device (or a single vibration device) which is driven as one complete single-body without being independently driven. According to an example embodiment of the present disclosure, with respect to the first direction X, a first interval D1 between the first and second vibration generating portions 1301 and 1302 may be 0.1 mm or more and less than 3 cm, but embodiments of the present disclosure are not limited thereto.

According to an example embodiment of the present disclosure, each of the first and second vibration generating portions 1301 and 1302 may be disposed or tiled to have the first interval (or separation distance) D1 of 0.1 mm or more and less than 3 cm, and thus, may be driven as one vibration device, thereby increasing a reproduction band of a sound and a sound pressure level characteristic of a sound which is generated based on a single-body vibration of the first and second vibration generating portions 1301 and 1302. For example, the first and second vibration generating portions 1301 and 1302 may be disposed in the first interval D1 of 0.1 mm or more and less than 5 mm, in order to increase a reproduction band of a sound generated based on a single-body vibration of the first and second vibration generating portions 1301 and 1302 and to increase a sound of a low-pitched sound band (for example, a sound pressure level characteristic in 500 Hz (hertz) or less).

According to an example embodiment of the present disclosure, when the first and second vibration generating portions 1301 and 1302 are disposed in the first interval D1 of less than 0.1 mm or without the first interval D1, the reliability of the first and second vibration generating portions 1301 and 1302 or the vibration device 130 may be reduced due to damage or a crack caused by a physical contact therebetween which occurs when each of the first and second vibration generating portions 1301 and 1302 vibrates.

According to an example embodiment of the present disclosure, when the first and second vibration generating portions 1301 and 1302 are disposed in the first interval D1 of 3 cm or more, the first and second vibration generating portions 1301 and 1302 may not be driven as one vibration device due to an independent vibration of each of the first and second vibration generating portions 1301 and 1302. Therefore, a reproduction band of a sound and a sound pressure level characteristic of a sound which is generated based on vibrations of the first and second vibration generating portions 1301 and 1302 may be reduced. For example, when the first and second vibration generating portions 1301 and 1302 are disposed in the first interval D1 of 3 cm or more, a sound characteristic and a sound pressure level characteristic of the low-pitched sound band (for example, in 500 Hz or less) may each be reduced.

According to an example embodiment of the present disclosure, when the first and second vibration generating portions 1301 and 1302 are disposed in the first interval D1 of 5 mm, each of the first and second vibration generating portions 1301 and 1302 may not be perfectly driven as one vibration device, and thus, a sound characteristic and a sound pressure level characteristic of the low-pitched sound band (for example, in 200 Hz or less) may each be reduced.

According to another example embodiment of the present disclosure, when the first and second vibration generating portions 1301 and 1302 are disposed in the first interval D1 of 1 mm, each of the first and second vibration generating portions 1301 and 1302 may be driven as one vibration device, and thus, a reproduction band of a sound may increase and a sound of the low-pitched sound band (for example, a sound pressure level characteristic in 500 Hz or less) may increase. For example, when the first and second vibration generating portions 1301 and 1302 are disposed in the first interval D1 of 1 mm, the vibration device 130 may be implemented as a large-area vibrator which is enlarged based on optimization of an interval (or a separation distance) between the first and second vibration generating portions 1301 and 1302. Therefore, the vibration device 130 may be driven as a large-area vibrator based on a single-body vibration of the first and second vibration generating portions 1301 and 1302, and thus, a sound characteristic and a sound pressure level characteristic may each increase a reproduction band of a sound and in the low-pitched sound band generated based on a large-area vibration of the vibration device 130.

Therefore, to implement a single-body vibration (or one vibration device) of the first and second vibration generating portions 1301 and 1302, the first interval D1 between the first and second vibration generating portions 1301 and 1302 may be adjusted to 0.1 mm or more and less than 3 cm. Furthermore, to implement a single-body vibration (or one vibration device) of the first and second vibration generating portions 1301 and 1302 and to increase a sound pressure level characteristic of a sound of the low-pitched sound band, the first interval D1 between the first and second vibration generating portions 1301 and 1302 may be adjusted to 0.1 mm or more and less than 5 mm.

Each of the first and second vibration generating portions 1301 and 1302 according to an example embodiment of the present disclosure may include at least one or more of the vibration portion 130*a* of the vibration device 130 described above with reference to FIGS. 3A to 6, and thus, the repetitive description thereof may be omitted. For example, each of the first and second vibration generating portions 1301 and 1302 may include a first vibration portion and a second vibration portion. The vibration device 130 may include a first electrode portion, a second electrode portion, a first cover member, a second cover member, a first adhesive layer, and a second adhesive layer described above with reference to FIGS. 7 and 8, and thus, their repetitive descriptions may be omitted.

According to an example embodiment of the present disclosure, each of at least two or more vibration generating portions 1301 and 1302 may be implemented as one vibration device. In addition, according to an example embodiment of the present disclosure, each of at least two or more vibration generating portions 1301 and 1302 may be configured with a first vibration portion and a second vibration portion, thereby providing an apparatus where a sound pressure level characteristic and/or a sound characteristic including a low-pitched sound band may be further enhanced.

Figure 12:
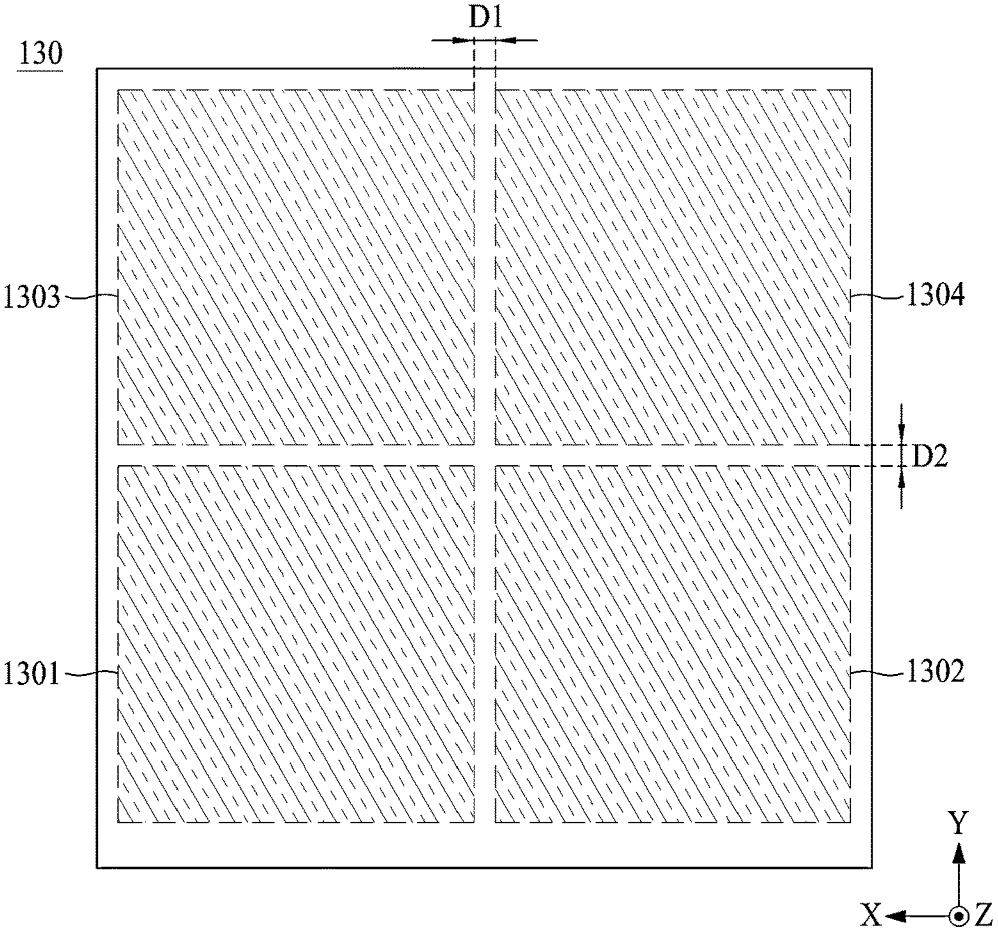
FIG. 12 illustrates an apparatus according to another example embodiment of the present disclosure.

FIG. 12 illustrates a vibration device according to another example embodiment of the present disclosure.

With reference to FIG. 12, the vibration device 130 according to another example embodiment of the present disclosure may include at least two or more vibration generating portions 1301 to 1304.

The vibration device 130 according to an example embodiment of the present disclosure may alternately and repeatedly contract and expand based on an inverse piezoelectric effect to vibrate in a thickness direction Z, thereby vibrating the vibration member 100. For example, the vibration device 130 according to an example embodiment of the present disclosure may vibrate by alternately and repeatedly contract and expand based on an inverse piezoelectric effect in a thickness direction Z, thereby directly vibrating the vibration member 100. For example, the vibration device 130 may be referred to as a vibration film, a displacement generator, a displacement film, a sound generator, a vibration array, a vibration array part, a vibration structure array part, a vibration array structure, a tiling vibration array, a tiling vibration array module, or a tiling vibration film, but embodiments of the present disclosure are not limited thereto. The vibration device 130 may include at least two or more vibration generating portions 1301 to 1304 which are disposed or tiled at a certain interval. The at least two or more vibration generating portions 1301 to 1304 may alternately and repeatedly contract and expand based on a piezoelectric effect (or a piezoelectric characteristic) to vibrate. For example, the at least two or more vibration generating portions 1301 to 1304 may be referred to as a vibration array, a vibration generating array, a division vibration array, a partial vibration array, a partial vibration structure, a division vibration structure, an individual vibration structure, or the like, but embodiments of the present disclosure are not limited thereto.

Each of the at least two or more vibration generating portions 1301 to 1304 according to another example embodiment of the present disclosure may be electrically disconnected and disposed spaced apart from one another along each of a first direction X (or a widthwise direction) and a second direction Y (or a lengthwise direction) intersecting with the first direction X. For example, the at least two or more vibration generating portions 1301 to 1304 may be arranged or tiled in an i×j form on the same plane, and thus, the vibration device 130 may be implemented to have a large area based on tiling of the at least two or more vibration generating portions 1301 to 1304 having a relatively small size. For example, i may be the number of the vibration generating portions disposed along the first direction X and may be a natural number of 2 or more, and j may be the number of the vibration generating portions disposed along the second direction Y and may be a natural number of 2 or more which is the same as or different from i. For example, the at least two or more vibration generating portions 1301 to 1304 may be arranged or tiled in a 2×2 form, but embodiments of the present disclosure are not limited thereto. Hereinafter, an example where the vibration device 130 includes first to fourth vibration generating portions 1301 to 1304 will be described.

According to an example embodiment of the present disclosure, the first and second vibration generating portions 1301 and 1302 may be spaced apart from each other along the first direction X. The third and fourth vibration generating portions 1303 and 1304 may be spaced apart from each other along the first direction X and may be spaced apart from each of the first and second vibration generating portions 1301 and 1302 along the second direction Y. The first and third vibration generating portions 1301 and 1303 may be spaced apart from each other along the second direction Y to face each other. The second and fourth vibration generating portions 1302 and 1304 may be spaced apart from each other along the second direction Y to face each other.

With reference to FIGS. 7, 8, and 12, the first to fourth vibration generating portions 1301 to 1304 may be disposed between the first cover member 130*d* and the second cover member 130*e*. For example, each of the first cover member 130*d* and the second cover member 130*e* may be connected to the first to fourth vibration generating portions 1301 to 1304 in common or may support the first to fourth vibration generating portions 1301 to 1304 in common, and thus, may drive the first to fourth vibration generating portions 1301 to 1304 as one vibration device (or a single vibration device). For example, the first to fourth vibration generating portions 1301 to 1304 may be tiled in a certain interval by the cover members 130*d* and 130*e*, and thus, may be driven as one vibration device (or a single vibration device).

According to an example embodiment of the present disclosure, as described above with reference to FIG. 11, in order to provide a complete single body vibration or a large-area vibration, the first to fourth vibration generating portions 1301 to 1304 may be disposed (or tiled) at first and second intervals D1 and D2 of 0.1 mm or more and less than 3 cm along of the first direction X and the second direction Y, for example, may be disposed (or tiled) at the first and second intervals D1 and D2 of 0.1 mm or more and less than 5 mm.

Each of the first to fourth vibration generating portions 1301 to 1304 according to an example embodiment of the present disclosure may include at least one or more of the vibration portion 130*a* of the vibration device 130 described above with reference to FIGS. 3A to 6, and thus, the repetitive description thereof may be omitted. For example, each of the first to fourth vibration generating portions 1301 to 1304 may include a first vibration portion and a second vibration portion. Each of the first to fourth vibration generating portions 1301 to 1304 may include a first electrode portion and a second electrode portion, and the vibration device 130 may further include a first cover member, a second cover member, a first adhesive layer, and a second adhesive layer described above with reference to FIGS. 7 and 8, and thus, their repetitive descriptions may be omitted.

According to an example embodiment of the present disclosure, each of the first to fourth vibration generating portions 1301 to 1304 may include any one vibration portion 130*a* of the vibration portion 130*a* of the vibration device 130 described above with reference to FIGS. 3A to 6, or may include different vibration portion 130*a*.

According to an example embodiment of the present disclosure, each of at least two or more vibration generating portions 1301 to 1304 may be implemented as one vibration device. In addition, according to an example embodiment of the present disclosure, each of at least two or more vibration generating portions 1301 to 1304 may be configured with a first vibration portion and a second vibration portion, thereby providing an apparatus where a sound pressure level characteristic and/or a sound characteristic including a low-pitched sound band may be further enhanced.

Figure 13:
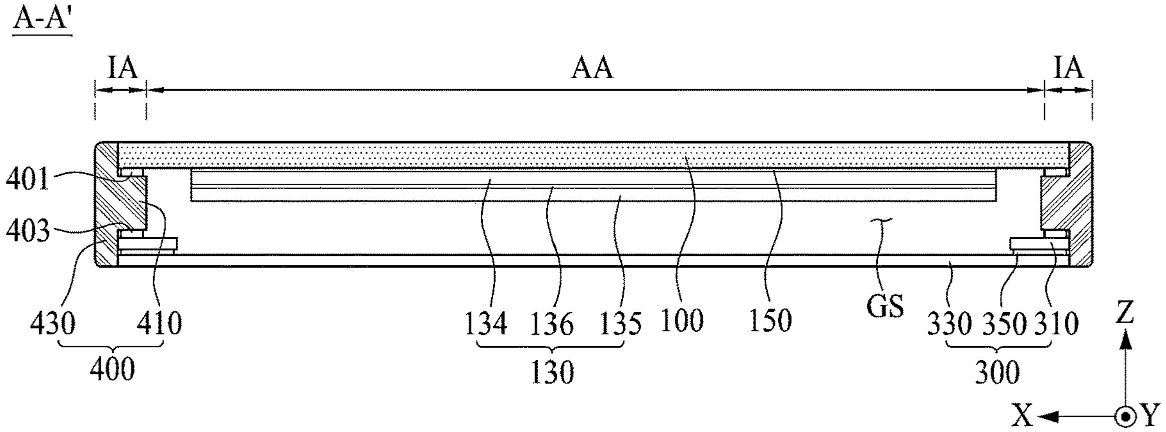
FIG. 13 is an example of another cross-sectional view taken along line A-A' of FIG. 1.

FIG. 13 illustrates a vibration device according to another example embodiment of the present disclosure. FIG. 13 is an example of another cross-sectional view taken along line A-A' illustrated in FIG. 1.

With reference to FIGS. 3E and 3F, a vibration device 130 according to another example embodiment of the present disclosure may include at least two or more vibration generators 134 and 135.

A vibration device including one vibration generator may have a problem where it is unable to output a sufficient sound. For example, when a vibration device including one vibration generator is applied to an apparatus such as a television (TV) or the like, there may be a problem where it is difficult to secure (or produce) a sufficient sound. Therefore, when a vibration device implemented as two vibration generators is applied to an apparatus, an attachment area between the vibration member (or the vibration object) and the vibration device may be enlarged. As the attachment area is enlarged, when the vibrating device is attached to the vibration member, for example, the rear surface of the display panel 100, it may be difficult to attach the vibration device on the rear surface of the display panel without an air bubble. For example, when the display panel may be a light emitting display panel, there may be a problem where it is difficult to attach the vibration device on an encapsulation substrate without an air bubble. In addition, in a vibration device implemented as two vibration generators arranged in parallel, because vibrations of adjacent vibration generators differ, there may be a problem of a divided vibration (or a difference in vibration or a frequency difference between two vibration generators) where different vibrations occur. Consequently, there may be a problem where it is difficult to output a sound having enhanced flatness of a sound characteristic. There may be a problem where a divided vibration (or a difference in vibration or a frequency difference between two vibration generators) increases as an attachment area of a vibration device increases.

The vibration device 130 according to an example embodiment of the present disclosure may include at least two or more vibration generators 134 and 135. For example, the vibration device 130 according to an example embodiment of the present disclosure may include at least two or more vibration generators 134 and 135 which overlap (or stack) each other. The at least two or more vibration generators 134 and 135 may vibrate in the same direction from each other. For example, the vibration device 130 may include the at least two or more vibration generators 134 and 135 which overlap or are stacked to be displaced (or vibrated or driven) in the same direction from each other. For example, the vibration device 130 may include the at least two or more vibration generators 134 and 135 which are overlapped or stacked to have the same driving direction (or the same vibration direction or the same displacement direction) from each other.

The at least two or more vibration generators 134 and 135 may overlap or be stacked to be displaced (or driven or vibrated) in the same direction from each other. For example, the at least two or more vibration generators 134 and 135 may contract or expand in the same driving direction (or the same displacement direction or the same vibration direction) from each other based on a vibration driving signal in a state where the at least two or more vibration generators 134 and 135 overlap or are stacked from each other, and thus, a displacement amount (or a bending force or a flexural force) or an amplitude displacement may increase or may be maximized. Therefore, the at least two or more vibration generators 134 and 135 may increase (or maximize) a displacement amount (or a bending force or a flexural force) or an amplitude displacement of the display panel or the vibration member 100, thereby enhancing a sound pressure level characteristic of a sound and a sound characteristic of a middle-low-pitched sound band generated based on a vibration of the display panel or the vibration member 100. For example, the at least two or more vibration generators 134 and 135 may be implemented so that the at least two or more vibration generators 134 and 135 overlap or are stacked to have the same driving direction from each other, and thus, a driving force of the at least two or more vibration generators 134 and 135 may increase or may be maximized, thereby enhancing a sound pressure level characteristic of a sound and a sound characteristic of a middle-low-pitched sound band generated by the display panel or the vibration member 100 based on vibrations of the at least two or more vibration generators 134 and 135. For example, the middle-low-pitched sound band may be 200 Hz to 1 kHz, but embodiments of the present disclosure are not limited thereto.

Each of the at least two or more vibration generators 134 and 135 according to an example embodiment of the present disclosure may include at least one or more of the vibration device 130 described above with reference to FIGS. 3A to 6, and thus, the repetitive description thereof may be omitted. For example, each of the at least two or more vibration generators 134 and 135 may include a first vibration portion and a second vibration portion. Each of the at least two or more vibration generators 134 and 135 may include a first electrode portion, a second electrode portion, a first cover member, a second cover member, a first adhesive layer, and a second adhesive layer described above with reference to FIGS. 7 and 8, and thus, their repetitive descriptions may be omitted.

Each of the at least two or more vibration generators 134 and 135 according to an example embodiment of the present disclosure may include at least two or more vibration generating portions. For example, each of the at least two or more vibration generators 134 and 135 may include the first and second vibration generating portions 1301 and 1302 described above with reference to FIG. 11, or may include the first to fourth vibration generating portions 1301 to 1304 described above with reference to FIG. 12, and thus, their repetitive descriptions may be omitted.

When a vibration driving signal (or a voice signal) is applied, each of the at least two or more vibration generators 134 and 135 may alternately and repeatedly contract and expand based on an inverse piezoelectric effect of the first vibration portion and the second vibration portion, and thus, may be displaced (or vibrated or driven) in the same direction based on a bending phenomenon where a bending direction is alternately changed, thereby increasing or maximizing a displacement amount (or a bending force or a flexural force) or an amplitude displacement of the vibration device 130 or/and the vibration member 100 (or display panel).

A first vibration generator 134 disposed at the vibration member 100 of the at least two or more vibration generators 134 and 135 may be one main vibration generator. For example, the remaining second vibration generator 135 of the at least two or more vibration generators 134 and 135 may be at least one auxiliary vibration generator which is stacked on the first vibration generator 134. The second vibration generator 135 may have the same structure as the first vibration generator 134, but embodiments of the present disclosure are not limited thereto. For example, the first vibration generator 134 may be a first vibration film, a first displacement generator, a first displacement film, a first sound generator, a first vibration array, a first vibration array part, a first vibration structure array part, a first vibration array structure, a first tiling vibration array, a first tiling vibration array module, or a first tiling vibration film, but embodiments of the present disclosure are not limited thereto. For example, the second vibration generator 135 may be a second vibration film, a second displacement generator, a second displacement film, a second sound generator, a second vibration array, a second vibration array part, a second vibration structure array part, a second vibration array structure, a second tiling vibration array, a second tiling vibration array module, or a second tiling vibration film, but embodiments of the present disclosure are not limited thereto.

The vibration device 130 according to an example embodiment of the present disclosure may further include an adhesive member 136 (or a third connection member) disposed between the at least two or more vibration generators 134 and 135.

The adhesive member 136 according to an example embodiment of the present disclosure may be disposed between the at least two or more vibration generators 134 and 135. For example, the adhesive member 136 may include a material including an adhesive layer which has a relatively strong adhesive force or attaching force with respect to each of the at least two or more vibration generators 134 and 135. For example, the adhesive member 136 may include a foam pad, a double-sided tape, or an adhesive, but embodiments of the present disclosure are not limited thereto. For example, the adhesive layer of the adhesive member 136 may include epoxy, acrylic, silicone, or urethane, but embodiments of the present disclosure are not limited thereto. For example, the adhesive layer of the adhesive member 136 may include a urethane-based material which has a relatively ductile characteristic compared to an acrylic-based material. Accordingly, the vibration loss of the vibration device 130 caused by a displacement interference between the at least two or more vibration generators 134 and 135 may be minimized, or each of the at least two or more vibration generators 134 and 135 may be freely displaced (or vibrated or driven).

The at least two or more vibration generators 134 and 135 according to an example embodiment of the present disclosure may be integrated as one structure (or an element) by a laminating process using the adhesive member 136.

The apparatus according to an example embodiment of the present disclosure may further include a connection member 150 (or a first connection member) disposed between the vibration member 100 and the vibration device 130.

The connection member 150 may be disposed between the vibration member 100 and the vibration device 130, and thus, may connect or couple the vibration device 130 to the rear surface of the display panel or the vibration member 100. For example, the vibration device 130 may be connected or coupled to the rear surface of the display panel or the vibration member 100 by the connection member 150, and thus, may be supported by or disposed at the rear surface of the vibration member 100.

The connection member 150 according to an example embodiment of the present disclosure may include a material including an adhesive layer which has a relatively strong adhesive force or attaching force with respect to each of the rear surface of the display panel or the vibration member 100 and the vibration device 130. For example, the connection member 150 may include a foam pad, a double-sided tape, an adhesive, or the like, but embodiments of the present disclosure are not limited thereto. For example, the adhesive layer of the connection member 150 may include epoxy, acrylic, silicone, or urethane, but embodiments of the present disclosure are not limited thereto. For example, the adhesive layer of the connection member 150 may differ from the adhesive layer of the adhesive member 136. For example, the adhesive layer of the connection member 150 may include an acrylic-based material which has a relatively strong adhesive force and a relatively high hardness compared to a urethane-based material so that the vibration of the vibration device 130 may be transmitted to the display panel or the vibration member 100 effectively. Accordingly, a vibration of the vibration device 130 may be transferred to the display panel or the vibration member 100 effectively.

The adhesive layer of the connection member 150 may further include an additive, such as a tackifier or an adhesion enhancing agent, a wax component, an anti-oxidation agent, or the like. The additive may prevent or reduce the connection member 150 from being detached (stripped) from the display panel or the vibration member 100 by a vibration of the vibration device 130. For example, the tackifier may be a rosin derivative or the like, and the wax component may be paraffin wax or the like. For example, the anti-oxidation agent may be a phenol-based anti-oxidation agent, such as thioester, or the like, but embodiments of the present disclosure are not limited thereto.

The connection member 150 according to another example of the present disclosure may further include a hollow portion provided between the display panel or the vibration member 100 and the vibration device 130. The hollow portion of the connection member 150 may provide an air gap between the display panel or the vibration member 100 and the vibration device 130. Due to the air gap, a sound wave (or a sound pressure) based on a vibration of the vibration device 130 may not be dispersed by the connection member 150, and may concentrate on the display panel or the vibration member 100. Thus, the loss of a vibration caused by the connection member 150 may be minimized, thereby increasing a sound pressure level characteristic of a sound generated based on a vibration of the display panel or the vibration member 100.

The apparatus according to an example embodiment of the present disclosure may further include a supporting member 300 and a middle frame 400 disposed at a rear surface of the vibration member 100. A description of a supporting member 300 and a middle frame 400 may be substantially the same as the descriptions given above with reference to FIGS. 1 to 2, and thus, their repetitive descriptions may be omitted.

The vibration device 130 according to an example embodiment of the present disclosure may further include a plate.

According to an example embodiment of the present disclosure, the plate may be connected or coupled to the rear surface of the vibration member 100. For example, when the vibration member 100 is a light emitting display panel that is the display panel, the plate may be disposed at a rear surface of an encapsulation part of the light emitting display panel. The plate may be configured in a structure which is disposed at or bonded to the rear surface of the encapsulation part. The plate may dissipate heat occurring in the display panel. For example, the plate may be referred to as a heat dissipation member, a heat dissipation plate, or a heat sink, or the like, but embodiments of the present disclosure are not limited thereto.

According to an example embodiment of the present disclosure, the plate may reinforce a mass of the vibration device 130 which is disposed at or hung from the rear surface of the vibration member 100. Thus, the plate may decrease a resonance frequency of the vibration device 130 based on an increase in mass of the vibration device 130. Therefore, the plate may increase a sound characteristic and a sound pressure level characteristic of the low-pitched sound band generated based on a vibration of the vibration device 130 and may enhance the flatness of a sound pressure level characteristic. For example, the flatness of a sound characteristic may represent a deviation in magnitude between a highest sound pressure level and a lowest sound pressure level. For example, the plate may be referred to as a weight member, a mass member, a sound planarization member, or the like, but embodiments of the present disclosure are not limited thereto.

The plate may have the same shape and size as the rear surface of the vibration member 100 or the display panel, or may have the same shape and size as the vibration device 130. As another example embodiment of the present disclosure, the plate may have a size different from the vibration member 100 or the display panel. For example, the plate may be smaller than the size of the vibration member 100 or the display panel. As another example embodiment of the present disclosure, the plate may have a size different from the vibration device 130. For example, the plate may be greater or smaller than the size of the vibration device 130. The vibration device 130 may be the same as or smaller than the size of the vibration member 100 or the display panel.

The plate according to an example embodiment of the present disclosure may be configured as a metal material. For example, the plate may include one or more materials of stainless steel, aluminum (Al), a magnesium (Mg), a Mg alloy, a magnesium-lithium (Mg—Li) alloy, and an Al alloy, but embodiments of the present disclosure are not limited thereto.

According to an example embodiment of the present disclosure, a displacement amount (or a bending force or a flexural force) or an amplitude displacement (or a vibration width) of the vibration member 100 or the display panel with the plate disposed therein may decrease as a thickness of the plate increases, based on the stiffness of the plate. Accordingly, a sound pressure level characteristic and a low-pitched sound band characteristic of a sound generated based on a displacement (or a vibration or a driving) of the vibration member 100 or the display panel are lowered or reduced.

The plate according to an example embodiment of the present disclosure may be coupled or connected to a rear surface of the vibration member 100 or the display panel by a connection member (or a fifth connection member). The connection member may be disposed between the vibration member 100 and the plate.

The connection member (or the fifth connection member) according to an example embodiment of the present disclosure may include a material including an adhesive layer which has a relatively strong adhesive force or attaching force with respect to the rear surface of the vibration member 100 or the display panel and the vibration device 130, respectively. For example, the connection member may include a foam pad, a double-sided tape, or an adhesive. For example, the adhesive layer of the connection member may include epoxy, acrylic, silicone, or urethane, but embodiments of the present disclosure are not limited thereto. For example, the adhesive layer of the connection member may be the same as the adhesive layer of the connection member 150, but embodiments of the present disclosure are not limited thereto. For example, the adhesive layer of the connection member may include an acrylic-based material which has a relatively strong adhesive force and a relatively hard hardness compared to a urethane-based material so that the vibration of the vibration device 130 may be transmitted to the vibration member 100 or the display panel effectively. As another example embodiment of the present disclosure, the adhesive layer of the connection member may be configured to be different from the adhesive layer of the connection member 150.

The plate according to an example embodiment of the present disclosure may be integrated into the vibration device 130, or may be provided as an element of the vibration device 130. For example, the plate and the vibration device 130 may be configured with one structure or one component (or module), which is provided as one body. Accordingly, when the plate is disposed between the rear surface of the vibration member 100 or the display panel and the vibration device 130, an assembly process between the vibration member 100 or the display panel and the vibration device 130 may be easily performed based on component integration (or modulization) between the plate and the vibration device 130.

As another example embodiment of the present disclosure, in a case where the plate and the vibration device 130 are configured as (or in) one structure or one component (or module) which is provided as one unitary body, a non-display panel may be configured with a vibration plate. The plate and the vibration device 130 may be disposed at the non-display panel. The plate and the vibration device 130 may be connected or coupled to the non-display panel by a connection member 150. For example, the plate may include one or more of metal, wood, rubber, plastic, glass, cloth, fiber, paper, carbon, a mirror, leather, a vehicle interior material, a building indoor ceiling, or an aircraft interior material, or the like, but embodiments of the present disclosure are not limited thereto. Therefore, the vibration device 130 may output a sound by vibrating the non-display panel. As another example embodiment of the present disclosure, in a case where the plate and the vibration device 130 are configured as (or in) one structure or one component (or module) which is provided as one unitary body, the plate may be configured as a vibration plate. For example, in a module (or structure) of the plate and the vibration device 130, the plate may include a single nonmetal material or a composite nonmetal material of one or more of wood, rubber, plastic, glass, cloth, fiber, paper, carbon, a mirror, and leather, but embodiments of the present disclosure are not limited thereto.

The plate according to another example embodiment of the present disclosure may include a plurality of opening portions. The plurality of opening portions may be configured to have a predetermined size and a predetermined interval. For example, the plurality of opening portions may be provided along a first direction X and a second direction Y so as to have a predetermined size and a predetermined interval. Due to the plurality of opening portions, a sound wave (or a sound pressure) based on a vibration of the vibration device 130 may not be dispersed by the plate, and may concentrate on the vibration member 100. Thus, the loss of a vibration caused by the plate may be minimized, thereby increasing a sound pressure level characteristic of a sound generated based on a vibration of the vibration member 100. For example, the plate including the plurality of openings may have a mesh shape. For example, the plate including the plurality of openings may be a mesh plate.

In the apparatus according to an example embodiment of the present disclosure, because at least two or more vibration generators 134 and 135 are configured, a sound pressure level characteristic of a sound and a sound characteristic of a middle-low-pitched sound band generated according to the vibration member 100 based on vibrations of the at least two or more vibration generators 134 and 135 may be enhanced.

Moreover, the apparatus according to an example embodiment of the present disclosure may further include the plate disposed at the rear surface of the vibration device 130, and thus, a resonance frequency of the vibration device 130 may be decreased. Accordingly, the apparatus according to an example embodiment of the present disclosure may increase a sound characteristic of the low-pitched sound band, a sound pressure level characteristic of the low-pitched sound band, and a flatness of a sound characteristic of a sound generated according to a vibration of the vibration member 100 or the display panel based on a vibration of the vibration device 130.

Moreover, in the apparatus according to an example embodiment of the present disclosure, each of the at least two or more vibration generators 134 and 135 may be configured with a first vibration portion and a second vibration portion, thereby providing an apparatus where a sound pressure level characteristic and/or a sound characteristic including a low-pitched sound band may be further enhanced.

Figure 14:
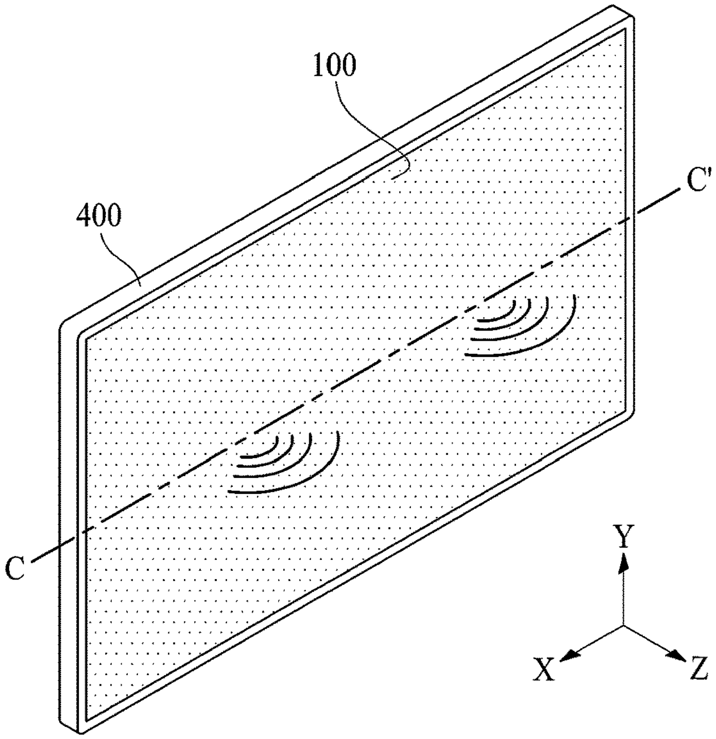
FIG. 14 illustrates an apparatus according to another example embodiment of the present disclosure.
Figure 15:
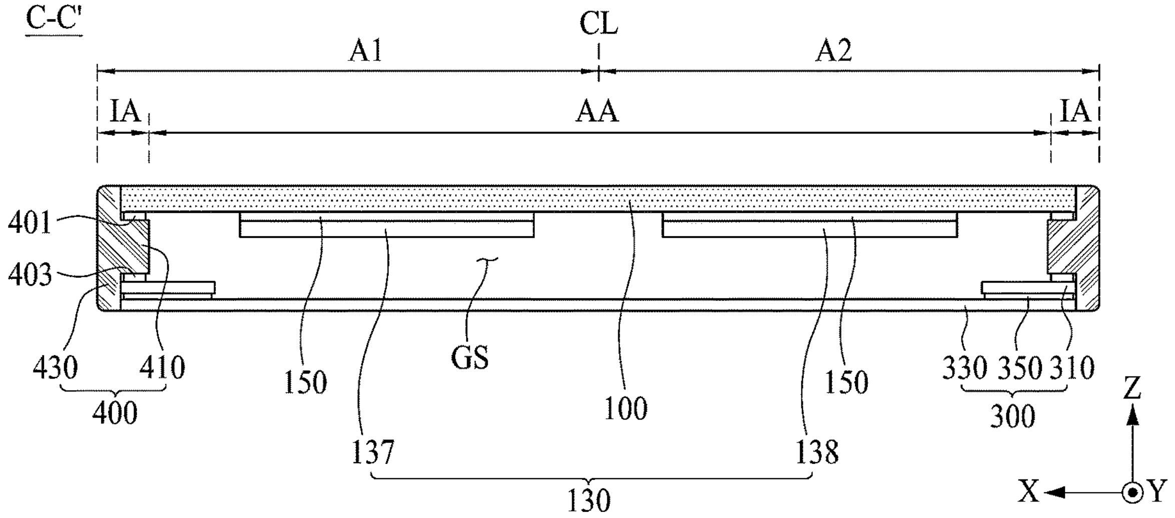
FIG. 15 is an example of a cross-sectional view taken along line C-C' of FIG. 14.

FIG. 14 illustrates an apparatus according to another example embodiment of the present disclosure. FIG. 15 is an example of a cross-sectional view taken along line C-C' illustrated in FIG. 14.

With reference to FIGS. 14 and 15, in the apparatus according to another example embodiment of the present disclosure, a rear surface (or a backside surface) of a vibration member 100 or a display panel may include a first region (or a first rear area) A1 and a second region (or a second rear area) A2. For example, in the rear surface of the vibration member 100 or the display panel, the first region A1 may be a left rear region, and the second region A2 may be a right rear region. The first region A1 and the second region A2 may be left-right symmetrical with respect to a center line CL of the vibration member 100 in a first direction X, but embodiments of the present disclosure are not limited thereto. For example, when the vibration member 100 is a display panel, each of the first region A1 and the second region A2 may overlap the display area of the display panel.

The vibration device 130 according to another example embodiment of the present disclosure may include a first vibration device 137 and a second vibration device 138 disposed at the rear surface of the vibration member 100 or the display panel. For example, the first vibration device 137 may be a first vibration generating apparatus, a first displacement apparatus, a first sound apparatus, a first sound generating apparatus, or the like, but embodiments of the present disclosure are not limited thereto. For example, the second vibration device 138 may be a second vibration generating apparatus, a second displacement apparatus, a second sound apparatus, a second sound generating apparatus, or the like, but embodiments of the present disclosure are not limited thereto.

The first vibration device 137 may be disposed in the first region A1 of the vibration member 100 or the display panel. For example, the first vibration device 137 may be disposed at a center of the first region A1 of the vibration member 100 or the display panel with respect to the first direction X. For another example, the first vibration device 137 may be disposed close to a center or a periphery within the first region A1 of the vibration member 100 or the display panel with respect to the first direction X. The first vibration device 137 according to an example embodiment of the present disclosure may vibrate the first region A1 of the vibration member 100 or the display panel 100, and thus, may generate a first vibration sound or a first haptic feedback in the first region A1 of the vibration member 100 or the display panel 100. For example, the first vibration device 137 according to an example embodiment of the present disclosure may directly vibrate the first region A1 of the vibration member 100 or the display panel 100, and thus, may generate the first vibration sound or the first haptic feedback in the first region A1 of the vibration member 100 or the display panel 100. For example, the first vibration sound may be a left sound. A size of the first vibration device 137 according to an example embodiment of the present disclosure may have a size corresponding to half or less of the first region A1 or half or more of the first region A1 based on a characteristic of the first vibration sound or a sound characteristic needed for an apparatus. As another example embodiment of the present disclosure, the size of the first vibration device 137 may have a size corresponding to the first region A1 of the vibration member 100 or the display panel. For example, the size of the first vibration device 137 may have the same size as the first region A1 of the vibration member 100 or the display panel or may have a size smaller than the first region A1 of the vibration member 100 or the display panel.

The second vibration device 138 may be disposed in the second region A2 of the vibration member 100 or the display panel. For example, the second vibration device 138 may be disposed at a center of the second region A2 of the vibration member 100 or the display panel with respect to the first direction X. For another example, the second vibration device 138 may be disposed close to a center or a periphery within the second region A2 of the vibration member 100 or the display panel with respect to the first direction X. The second vibration device 138 according to an example embodiment of the present disclosure may vibrate the second region A2 of the vibration member 100 or the display panel 100, and thus, may generate a second vibration sound or a second haptic feedback in the second region A2 of the vibration member 100 or the display panel 100. For example, the second vibration device 138 according to an example embodiment of the present disclosure may directly vibrate the second region A2 of the vibration member 100 or the display panel 100, and thus, may generate the second vibration sound or the second haptic feedback in the second region A2 of the vibration member 100 or the display panel 100. For example, the second vibration sound may be a right sound. A size of the second vibration device 138 according to an example embodiment of the present disclosure may have a size corresponding to half or less of the second region A2 or half or more of the second region A2 based on a characteristic of the second vibration sound or a sound characteristic needed for an apparatus. As another example embodiment of the present disclosure, the size of the second vibration device 138 may have a size corresponding to the second region A2 of the vibration member 100 or the display panel. For example, the size of the second vibration device 138 may have the same size as the second region A2 of the vibration member 100 or the display panel or may have a size smaller than the second region A2 of the vibration member 100 or the display panel. Therefore, the first vibration device 137 and the second vibration device 138 may have the same size or different sizes to each other based on a sound characteristic of left and right sounds and/or a sound characteristic of the apparatus. Further, the first vibration device 137 and the second vibration device 138 may be disposed in a left-right symmetrical structure or a left-right asymmetrical structure with respect to the center line CL of the vibration member 100 or the display panel 100.

Each of the first vibration device 137 and the second vibration device 138 may include one or more of the vibration portions 130*a* of the vibration device 130 described above with reference to FIGS. 3A to 6, and thus, their repetitive description may be omitted.

For example, each of the first vibration device 137 and the second vibration device 138 may include one or more of the vibration portions 130*a* of the vibration device 130 described above with reference to FIGS. 3A to 4D. In such a configuration, each of the first vibration device 137 and the second vibration device 138 may implement a sound having the high-pitched sound band and/or the low-pitched sound band, based on a position of a vibration member 100 or a display panel.

For example, each of the first vibration device 137 and the second vibration device 138 may include one or more of the vibration portions 130*a* of the vibration device 130 described above with reference to FIGS. 5B and 5D. In such a configuration, each of the first vibration device 137 and the second vibration device 138 may implement a sound from the low-pitched sound band to the high-pitched sound band in a direction from a center of the vibration member 100 or the display panel to a periphery thereof.

For example, each of the first vibration device 137 and the second vibration device 138 may include one or more of the vibration portions 130*a* of the vibration device 130 described above with reference to FIG. 5C. In such a configuration, each of the first vibration device 137 and the second vibration device 138 may implement a sound from the low-pitched sound band to the high-pitched sound band in a direction from a center of the vibration member 100 or the display panel to a periphery thereof. For example, in a case where each of the first vibration device 137 and the second vibration device 138 is configured with a vibration device 130 described above with reference to FIGS. 3A to 5D, the vibration device 130 described above with reference to FIG. 6 may be applied together with one of the vibration devices 130 described above with reference to FIGS. 3A to 5D.

A connection member 150 according to an example embodiment of the present disclosure may be disposed between each of the first vibration device 137 and the second vibration device 138 and a rear surface of the display panel or the vibration member 100. For example, each of the first vibration device 137 and the second vibration device 138 may be disposed at the rear surface of the display panel or the vibration member 100 by the connection member 150. The connection member 150 may be substantially the same as the connection member 150 described above with reference to FIG. 2, and thus, the repetitive description thereof may be omitted.

Accordingly, an apparatus according to another example embodiment of the present disclosure may output a sound, including a left sound and a right sound, in a forward direction of the vibration member 100 or the display panel through the first vibration device 137 and the second vibration device 138, thereby providing a sound to a user.

Figure 16:
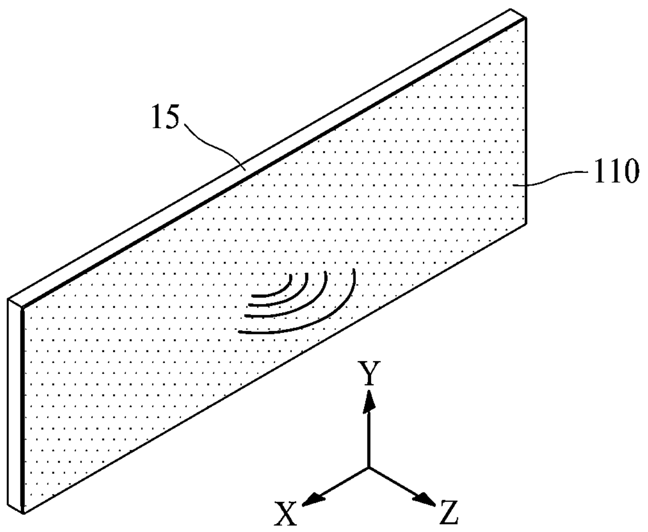
FIG. 16 is a perspective view of an apparatus according to another example embodiment of the present disclosure.
Figure 17:
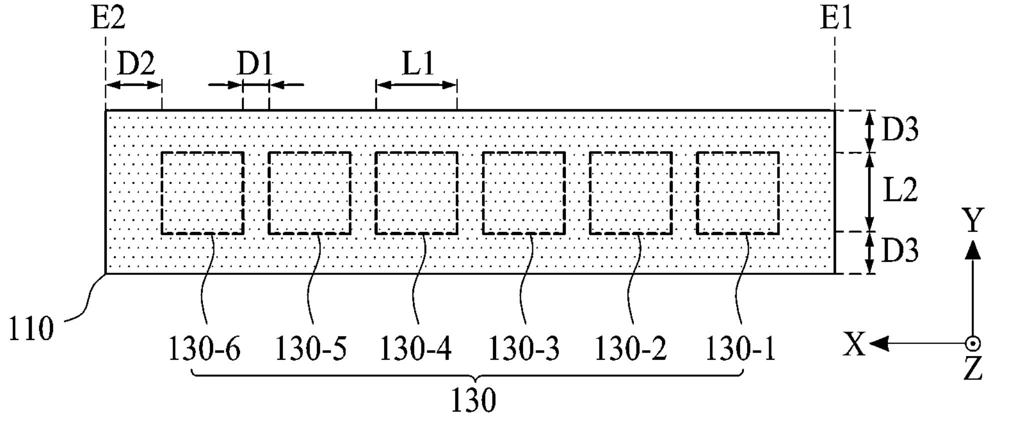
FIG. 17 illustrates a vibration member and a vibration device according to another example embodiment of the present disclosure.

FIG. 16 is a perspective view illustrating an apparatus according to another example embodiment of the present disclosure. FIG. 17 illustrates a vibration member and a vibration device according to another example embodiment of the present disclosure.

With reference to FIGS. 16 and 17, the apparatus according to another example embodiment of the present disclosure may include a vibration member 110 and a housing 15. The apparatus according to another example embodiment of the present disclosure may be an apparatus applied to a sound bar. For example, the apparatus according to another example embodiment of the present disclosure may be a sound bar or a sound apparatus, but embodiments of the present disclosure are not limited thereto.

The vibrating member 110 may be configured substantially the same as the vibration member 100 illustrated in any one of FIGS. 2, 8, and 13.

The housing 15 may be disposed at a rear surface of the vibration member 110 to cover the rear surface of the vibration member 110 and the vibration generating apparatus 130. The housing 15 may include an accommodation space for accommodating the vibration generating apparatus 130 and may have a box shape where one side (or a portion) is opened. For example, the vibration generating apparatus 130 may be a vibration device, but embodiments of the present disclosure are not limited thereto.

The housing 15 according to an example embodiment of the present disclosure may include one or more of a metal material and a nonmetal material (or a composite nonmetal material), but embodiments of the present disclosure are not limited thereto. For example, the housing 15 may include one or more materials of a metal material, plastic, and wood, but embodiments of the present disclosure are not limited thereto. For example, the housing 15 may be referred to as a term such as a case, an outer case, a case member, a housing member, a cabinet, an enclosure, a sealing member, a sealing cap, a sealing box, or a sound box, or the like, but embodiments of the present disclosure are not limited thereto. For example, the accommodation space of the housing 15 may be referred to as a term such as a gap space, an air gap, a vibration space, a sound space, a sound box, or a sealing space, or the like, but embodiments of the present disclosure are not limited thereto.

The housing 15 according to an example embodiment of the present disclosure may maintain an impedance component based on air which acts on the vibration member 110 when the vibration member 110 vibrates. For example, air near the vibration member 110 may resist a vibration of the vibration member 110 and may act as an impedance component having a reactance component and a different resistance based on a frequency. Therefore, the housing 15 may configure the closed space, which surrounds the vibration generating apparatus 130, and thus, may maintain an impedance component (or an air impedance or an acoustic impedance) which acts on the vibration member 110 due to air, thereby enhancing a sound characteristic and/or a sound pressure level characteristic of a low-pitched sound band generated based on the vibration of the vibration member 110 and enhancing the quality of a sound of a high-pitched sound band generated based on the vibration of the vibration member 110.

A connection member may be disposed between the rear surface of the vibration member 110 and the housing 15. A lateral portion of the housing 15 may be connected or coupled to the rear surface of the vibration member 110 by the connection member. For example, the lateral portion of the housing 15 may be connected or coupled to a periphery portion of the rear surface of the vibration member 110 by the connection member.

According to an example embodiment of the present disclosure, the vibration member 110 may include a plurality of regions. The plurality of regions may include first to $n^{th}$ (where n is a natural number of 2 or more) regions. The vibration member 110 may include a vibration generating apparatus 130 at the rear surface of the vibration member 110. The vibration generating apparatus 130 may vibrate the vibration member 110. The vibration generating apparatus 130 may include first to $n^{th}$ vibration devices connected to the first to $n^{th}$ regions of the vibration member 110. According to an example embodiment of the present disclosure, a sound output from one or more of the first to $n^{th}$ regions may have a pitched sound band which is different from a pitched sound band of a sound output from the other region(s) (or from the other one or more regions of the first to $n^{th}$ regions). Each of the first to $n^{th}$ vibration devices according to an example embodiment of the present disclosure may include at least one or more of the vibration portions 130*a* of the vibration device 130 described above with reference to FIGS. 3A to 6, and thus, the repetitive description thereof may be omitted. For example, each of the first to $n^{th}$ vibration devices may include a first vibration portion and a second vibration portion. Each of the first to $n^{th}$ vibration devices may include the first electrode portion, the second electrode portion, the first cover member, the second cover member, the first adhesive layer, and the second adhesive layer described above with reference to FIGS. 7 and 8, and thus, their repetitive descriptions may be omitted.

According to an example embodiment of the present disclosure, the vibration generating apparatus 130 may include a plurality of vibration devices. The plurality of vibration devices may include first to sixth vibration devices 130-1 to 130-6, and this is exemplarily illustrated and the vibration generating apparatus 130 may include six or more vibration devices. For example, the vibration generating apparatus 130 may include the first to sixth vibration devices 130-1 to 130-6 which are connected or tiled to the rear surface of the vibration member 110 to have a certain interval along a first direction X. For example, each of the first to sixth vibration devices 130-1 to 130-6 may be a vibration generating portion or a vibration portion, but embodiments of the present disclosure are not limited thereto.

Each of the first to sixth vibration devices 130-1 to 130-6 may have a square shape where a horizontal length L1 is the same as a vertical length L2, but embodiments of the present disclosure are not limited thereto. For example, each of the first to sixth vibration devices 130-1 to 130-6 may have a rectangular shape where the horizontal length L1 is relatively longer than the vertical length L2.

A sound generated in the vibration member 110, which vibrates based on a vibration of each of the first to sixth vibration devices 130-1 to 130-6, may be reduced in reproduction pitched sound band and sound pressure level characteristic due to constructive interference and/or destructive interference and a standing wave caused by a reflective wave generated through reflection by the connection member. In order to prevent or minimize a reduction in the reproduction pitched sound band and sound pressure level characteristic of a sound caused by an influence of the reflected wave, a first interval (or gap or distance) D1 between adjacent vibration devices of the first to sixth vibration devices 130-1 to 130-6 may be 3 mm to 5 mm, with respect to the first direction X, but embodiments of the present disclosure are not limited thereto. Thus, a reduction in the reproduction pitched sound band and/or sound pressure level characteristic of a sound caused by an influence of the reflected wave may be prevented or minimized.

According to an example embodiment of the present disclosure, when the first to sixth vibration devices 130-1 to 130-6 are arranged at the first interval D1 of less than 3 mm or without the first interval D1, the reliability of each of the first to sixth vibration devices 130-1 to 130-6 may be reduced due to damage or the occurrence of a crack caused by a physical contact between the first to sixth vibration devices 130-1 to 130-6 when each of the first to sixth vibration devices 130-1 to 130-6 vibrates (or is vibrating).

According to an example embodiment of the present disclosure, when the first to sixth vibration devices 130-1 to 130-6 are arranged at the first interval D1 of more than 5 mm, a sound characteristic and/or a sound pressure level characteristic based on a vibration of each of the first to sixth vibration devices 130-1 to 130-6 may be reduced due to an influence of the reflected wave. For example, when the first to sixth vibration devices 130-1 to 130-6 are arranged at the first interval D1 of more than 5 mm, a sound characteristic and/or a sound pressure level characteristic in a low-pitched sound band (for example, 500 Hz or less) may be reduced.

According to an example embodiment of the present disclosure, when the first to sixth vibration devices 130-1 to 130-6 are arranged at the first interval D1 of 3 mm to 5 mm, the occurrence of constructive interference and/or destructive interference and a standing wave caused by a reflective wave generated based on a vibration of each of the first to sixth vibration devices 130-1 to 130-6 may be reduced or minimized, and thus, a production pitched sound band of a sound may increase and a sound pressure level characteristic of a sound of the low-pitched sound band (for example, 500 Hz or less) may increase.

In one or more examples, a second interval D2 may be an interval (or gap or distance) between an end or edge (e.g., E1 or E2) of the vibration member 110 and a vibration device (e.g., 130-1 or 130-6 located closest to the end or edge of the vibration member 110. With respect to the first direction X, a second interval D2 may be smaller than the horizontal length L1 of one (or each) of the vibration devices 130-1 to 130-6 and may be greater than the first interval D1.

In addition, with respect to the second direction Y, a third interval (or gap or distance) D3 between each end of the vibration member 110 and each of the first to sixth vibration devices 130-1 to 130-6 may be smaller than the vertical length L2 of one (or each) of the vibration devices 130-1 to 130-6 (for example, the first vibration device 130-1) and may be greater than the first interval D1. For example, when the second interval D2 is relatively greater than the horizontal length L1 of one (or each) of the vibration devices 130-1 to 130-6 (for example, the first vibration device 130-1) and the third interval D3 is greater than the vertical length L2 of one (or each) of the vibration devices 130-1 to 130-6 (for example, the first vibration device 130-1), a vibration region of each of the first vibration device 130-1 and the sixth vibration device 130-6 may relatively increase, and thus, the uniformity of a sound characteristic and/or a sound pressure level characteristic may be reduced. Accordingly, in order to implement a uniform sound characteristic and/or a uniform sound pressure level characteristic based on a vibration of each of the first to sixth vibration devices 130-1 to 130-6, the second interval D2 may be smaller than the horizontal length L1 of one (or each) of the vibration devices 130-1 to 130-6 (for example, the first vibration device 130-1) and may be greater than the first interval D1, and the third interval D3 may be smaller than the vertical length L2 of one (or each) of the vibration devices 130-1 to 130-6 (for example, the first vibration device 130-1) and may be greater than the first interval D1.

Each of the first to sixth vibration devices 130-1 to 130-6 may vibrate the vibration member 110 based on a vibration driving signal supplied from the sound processing circuit, and thus, may output a sound generated based on a vibration of the vibration member 110. For example, each of the first to sixth vibration devices 130-1 to 130-6 may vibrate the vibration member 110 based on the vibration driving signal to output a sound of the same pitched sound band, but embodiments of the present disclosure are not limited thereto. For example, one or more of the first to sixth vibration devices 130-1 to 130-6 may vibrate the vibration member 110 based on the vibration driving signal to output sounds of different pitched sound bands.

The sound apparatus according to another example embodiment of the present disclosure may vibrate the vibration member 110 based on a vibration of each of the first to sixth vibration devices 130-1 to 130-6 which is connected to a rear surface of the vibration member 110 to have an interval D1 based on an influence of a reflected wave, and thus, may output a sound, thereby enhancing a sound pressure level characteristic and/or a reproduction pitched sound band of a sound.

Figure 18A:
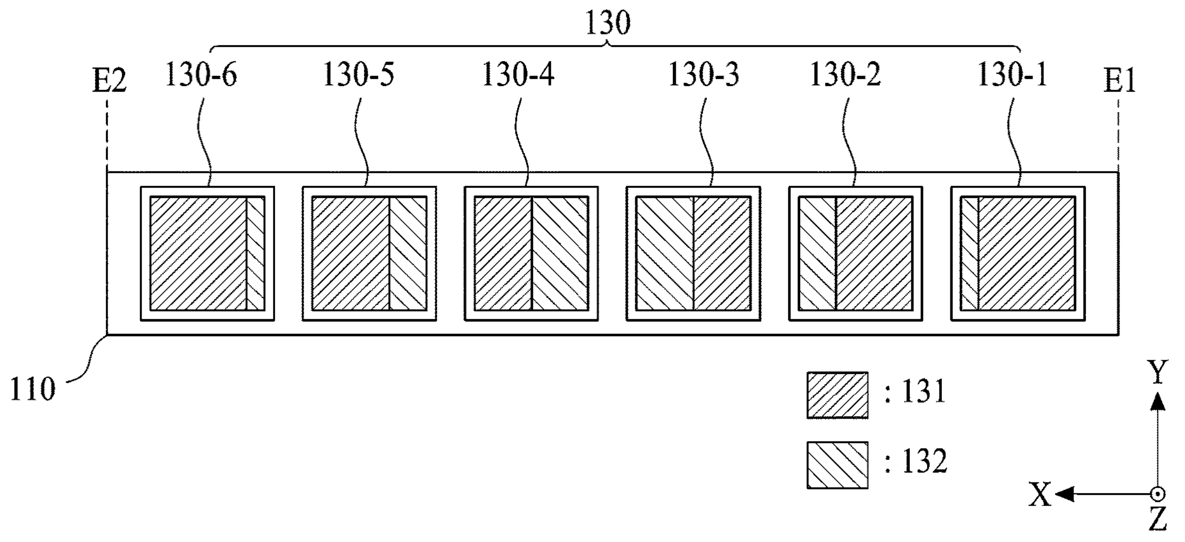
FIGS. 18A to 18C illustrate an apparatus according to another example embodiment of the present disclosure.
Figure 18B:
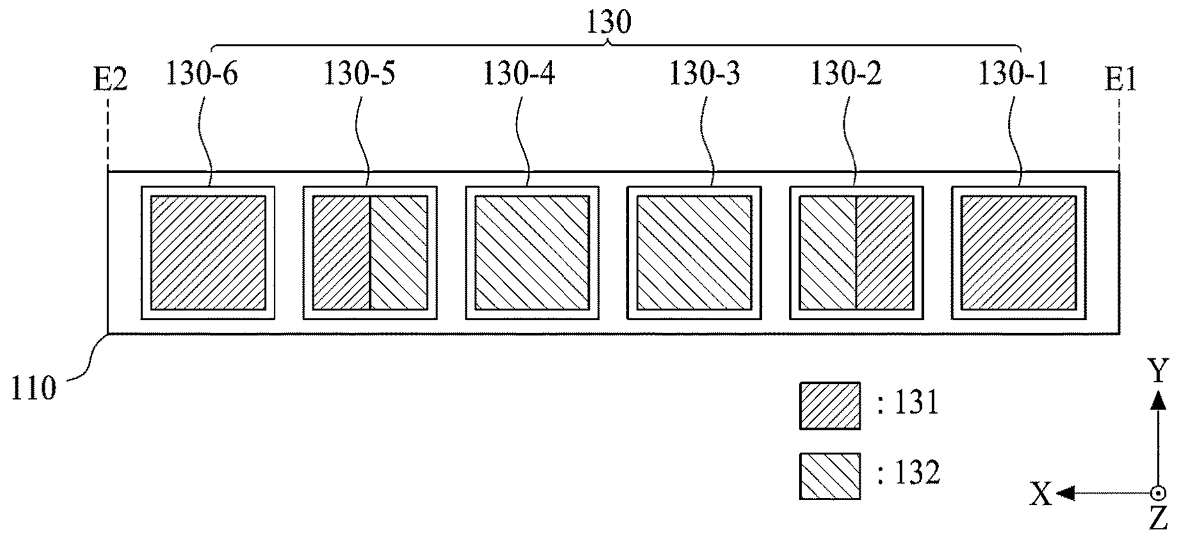
Figure 18C:
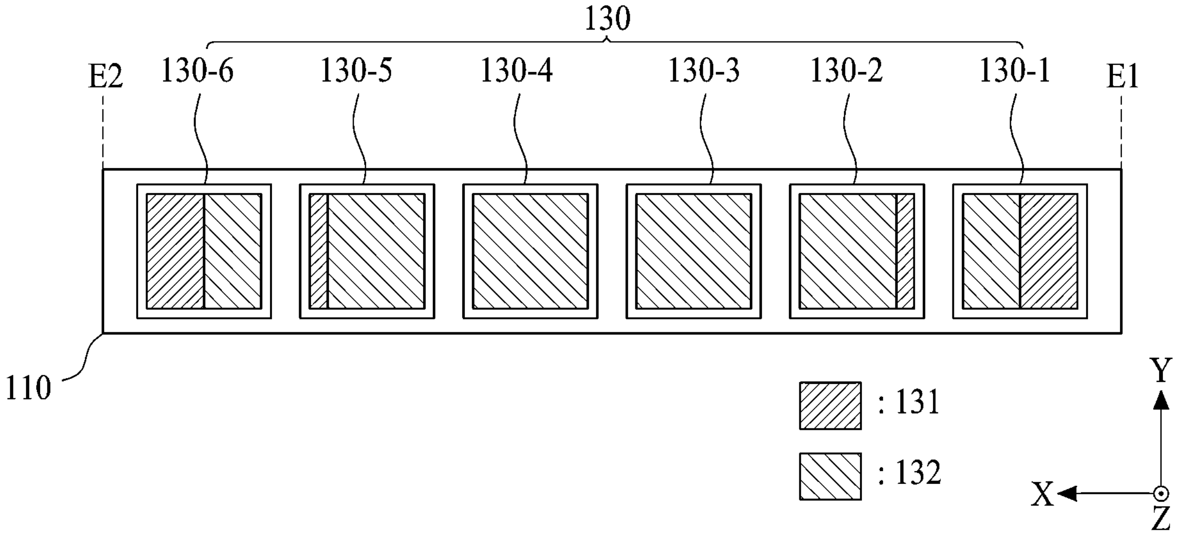

FIGS. 18A to 18C illustrate an apparatus according to another example embodiment of the present disclosure.

With reference to FIGS. 18A to 18C, the apparatus according to another example embodiment of the present disclosure may include a vibration member 110 and a vibration generating apparatus 130.

The vibration generating apparatus 130 may include at least two or more vibration devices 130-1 to 130-6. For example, the vibration generating apparatus 130 may include first to $n^{th}$ vibration devices 130-1 to 130-6. For example, the vibration generating apparatus 130 may include first to sixth vibration devices 130-1 to 130-6. For example, the vibration generating apparatus 130 may be a vibration device, but embodiments of the present disclosure are not limited thereto.

When it is assumed that a position of an object (or a user) receiving a sound source is a center of an apparatus or a sound bar, in order to transfer the sound source up to a distance of an outer portion (or one or each of both ends) far away from the object, a fraction (or a size) of a first vibration portion 131 for providing a sound of the low-pitched sound band in each of the first to $n^{th}$ vibration devices, disposed close to the outer portion, may be disposed to be greater (or larger) than that of a second vibration portion 132. Accordingly, a sound source or a sound of a uniform pitched sound band may be provided to the object (or the user). For example, because a frequency of the low-pitched sound band is short and a wavelength thereof is long, a sound source or a sound may be transferred (or traveled) up to a distance far away from the object.

According to an example embodiment of the present disclosure, each of first to $n^{th}$ vibration devices disposed close to an object (or a user listening to a sound of an apparatus) of an apparatus may be configured so that a size of the second vibration portion 132 is greater than the first vibration portion 131, and each of first to $n^{th}$ vibration devices disposed far away from a position of the object of the apparatus may be configured so that a size of the first vibration portion 131 is greater than the second vibration portion 132. Stated in another way, in one or more aspects, each of the first to $n^{th}$ vibration devices disposed close to an object of the apparatus may be configured so that a size of the second vibration portion 132 of each of the first to $n^{th}$ vibration devices disposed close to the object is greater than a size of the first vibration portion 131 of a respective one of the first to $n^{th}$ vibration devices disposed close to the object. Furthermore, each of the first to $n^{th}$ vibration devices disposed far away from a position of the object of the apparatus may be configured so that a size of the first vibration portion 131 of each of the first to $n^{th}$ vibration devices disposed far away from the position of the object is greater than a size of the second vibration portion 132 of a respective one of the first to $n^{th}$ vibration devices disposed far away from the position of the object.

With reference to FIG. 18A, the first vibration device 130-1 and the sixth vibration device 130-6 may be configured so that the first vibration portion 131 is greater in fraction (or size) than the second vibration portion 132. When a position of an object listening to a sound of the vibration generating apparatus 130 is a center of the vibration member 110, the center of the vibration member 110 may be configured so that a size of the second vibration portion 132 of each of the first to $n^{th}$ vibration devices is greater than the first vibration portion 131, and a size of the first vibration portion 131 may be configured to be greater than the second vibration portion 132 in a direction distancing from a position of an object. Stated in another way, in one or more aspects, when a position of an object listening to a sound of the vibration generating apparatus 130 is a center of the vibration member 110, (a) the center of the vibration member 110 may be configured so that a size of the second vibration portion 132 of each of the first to $n^{th}$ vibration devices, located closer to the center (rather than a periphery) of the vibration member 110, is greater than a size of the first vibration portion 131 of a respective one of the first to $n^{th}$ vibration devices, and (b) a size of the first vibration portion 131 may be configured to become greater than a size of the second vibration portion 132 in a direction distancing from the position of the object. For example, when it is assumed that a position of an object (or a user listening to a sound of an apparatus) is a center, the first vibration device 130-1 and the sixth vibration device 130-6 far away from the object may be configured so that a fraction (or a size) of the first vibration portion 131 is greater than a fraction (or a size) of second vibration portion 132. The second vibration device 130-2 and the fifth vibration device 130-5 may be configured so that the first vibration portion 131 is greater in fraction (or size) than the second vibration portion 132. For example, comparing with the first vibration device 130-1 and the sixth vibration device 130-6, the second vibration device 130-2 and the fifth vibration device 130-5 may be configured so that a fraction (or a size) of the first vibration portion 131 of each of the second vibration device 130-2 and the fifth vibration device 130-5 is smaller than that of each of the first vibration device 130-1 and the sixth vibration device 130-6.

According to an example embodiment of the present disclosure, in each of the first to $n^{th}$ vibration devices, a fraction (or a size) of the first vibration portion 131 may increase progressively in a direction from each (or a center region) of the first to $n^{th}$ regions of the vibration member 110 to a periphery of the vibration member 110. For example, a fraction (or a size) of the first vibration portion 131 may be configured to increase more than the second vibration portion 132 in a direction from a center of the vibration member 110 to both ends E1 and E2 (or peripheries) thereof. Stated in another way, in one or more aspects, a fraction (or a size) of the first vibration portion 131 may be configured to increase, while a fraction (or a size) of the second vibration portion 132 is configured to decrease, in a direction from a center of the vibration member 110 to each of the both ends E1 and E2 (or peripheries) thereof. The third vibration device 130-3 and the fourth vibration device 130-4 may be configured so that a fraction (or a size) of the first vibration portion 131 is the same or substantially the same as the second vibration portion 132. For example, when an object is disposed at a center, the third vibration device 130-3 and the fourth vibration device 130-4 may be disposed close to the object, and thus, a fraction (or a size) of the first vibration portion 131 may be the same or substantially the same as the second vibration portion 132. For example, an apparatus or a sound bar outputting a sound including the low-pitched sound band and the high-pitched sound band may be provided at the center of the vibration member 110. According to an example embodiment of the present disclosure, the first to third vibration device 130-1 to 130-3 may be symmetrical to the fourth to sixth vibration devices 130-4 to 130-6, respectively in reverse order, with respect to a center of the vibration member 110. According to an example embodiment of the present disclosure, an apparatus or a sound bar may be provided where a sound of the low-pitched sound band increases more than a sound of the high-pitched sound band in a direction from the center of the vibration member 110 to the both ends E1 and E2 (or peripheries) thereof. For example, because a fraction (or a size) of the first vibration portion 131 is configured to increase more than the second vibration portion 132 in a direction from the center of the vibration member 110 to the both ends E1 and E2 (or peripheries) thereof, an apparatus or a sound bar may be provided where a sound of the low-pitched sound band increases more, based on a position of an object. For example, because a fraction (or a size) of the first vibration portion 131 is configured to increase more than the second vibration portion 132 in a direction from the center of the vibration member 110 to the both ends E1 and E2 (or peripheries) thereof, an apparatus or a sound bar having a uniform pitched sound band may be provided to an object (or a user). For example, because the first to $n^{th}$ vibration devices disposed in the first to $n^{th}$ regions of the vibration member 110 are provided and sizes of the first vibration portion 131 and the second vibration portion 132 are configured differently in the first to $n^{th}$ vibration devices, an apparatus or a sound bar may be provided where a sound output from one or more of the first to $n^{th}$ regions of the vibration member 110 has a pitched sound band which is different from a pitched sound band of a sound output from the other region(s) of the vibration member 110.

With reference to FIG. 18B, the first vibration device 130-1 and the sixth vibration device 130-6 may be configured with the first vibration portion 131. For example, when it is assumed that a position of an object is a center, the first vibration device 130-1 and the sixth vibration device 130-6 far away from the object may be configured with the first vibration portion 131. The second vibration device 130-2 and the fifth vibration device 130-5 may be configured so that a fraction (or a size) of the first vibration portion 131 is the same or substantially the same as a fraction (or a size) of the second vibration portion 132. The third vibration device 130-3 and the fourth vibration device 130-4 may be configured with the second vibration portion 132. Accordingly, when it is assumed that a position of an object is a center of the vibration member 110, an apparatus or a sound bar outputting a sound of the high-pitched sound band may be provided at a position close to the object. According to an example embodiment of the present disclosure, in each of the first to $n^{th}$ vibration devices, a size of the second vibration portion 132 may be configured to increase progressively in a direction from each of the first to $n^{th}$ regions of the vibration member 110 (or from a respective one of the first and $n^{th}$ regions of the vibration member 110) to the center of the vibration member 110. For example, because the second vibration portion 132 is provided at the center of the vibration member 110, an apparatus or a sound bar outputting a sound of the high-pitched sound band may be provided at the center of the vibration member 110. FIG. 18B may be an apparatus or a sound bar where a sound of the low-pitched sound band is enhanced more than the apparatus of FIG. 18A. According to an example embodiment of the present disclosure, the first to third vibration devices 130-1 to 130-3 may be symmetrical with the fourth to sixth vibration devices 130-4 to 130-6, respectively in reverse order, with respect to the center of the vibration member 110. According to an example embodiment of the present disclosure, an apparatus or a sound bar may be provided where a sound from the high-pitched sound band to the low-pitched sound band is output in a direction from the center of the vibration member 110 to the both ends E1 and E2 (or peripheries) thereof. For example, because a fraction (or a size) of the first vibration portion 131 is configured to increase more than the second vibration portion 132 in a direction from the center of the vibration member 110 to the both ends E1 and E2 (or peripheries) thereof, an apparatus or a sound bar may be provided where a sound of the low-pitched sound band increases more. For example, because a fraction (or a size) of the first vibration portion 131 is configured to increase more than the second vibration portion 132 in a direction from the center of the vibration member 110 to the both ends E1 and E2 (or peripheries) thereof, an apparatus or a sound bar having a uniform pitched sound band may be provided to an object (or a user). For example, because the first to $n^{th}$ vibration devices disposed in the first to $n^{th}$ regions of the vibration member 110 are provided and sizes of the first vibration portion 131 and the second vibration portion 132 are configured differently in the first to $n^{th}$ vibration devices, an apparatus or a sound bar may be provided where a sound output from one or more of the first to $n^{th}$ regions of the vibration member 110 has a pitched sound band which is different from a pitched sound band of a sound output from the other region(s) of the vibration member 110.

With reference to FIG. 18C, the first vibration device 130-1 and the sixth vibration device 130-6 may be configured so that a fraction (or a size) of the first vibration portion 131 is the same or substantially the same as a fraction (or a size) of the second vibration portion 132. For example, when it is assumed that a position of an object is a center, the first vibration device 130-1 and the sixth vibration device 130-6 far away from the object may provide an apparatus or a sound bar outputting a sound including the low-pitched sound band and the high-pitched sound band. The second vibration device 130-2 and the fifth vibration device 130-5 may be configured so that a fraction (or a size) of the second vibration portion 132 is greater than a fraction (or a size) of the first vibration portion 131. The third vibration device 130-3 and the fourth vibration device 130-4 may be configured with the second vibration portion 132. Accordingly, when it is assumed that a position of an object is the center of the vibration member 110, an apparatus or a sound bar outputting a sound of the high-pitched sound band may be provided at a position close to the object. According to an example embodiment of the present disclosure, in each of the first to $n^{th}$ vibration devices, a size of the second vibration portion 132 may be configured to increase progressively in a direction from each of the first to $n^{th}$ regions of the vibration member 110 (or from a respective one of the first and $n^{th}$ regions of the vibration member 110) to the center of the vibration member 110. For example, because the second vibration portion 132 is configured at the center of the vibration member 110, an apparatus or a sound bar outputting a sound of the high-pitched sound band may be provided at the center of the vibration member 110. According to an example embodiment of the present disclosure, an apparatus or a sound bar may be configured where a sound of the high-pitched sound band is enhanced more than a sound of the low-pitched sound band. According to an example embodiment of the present disclosure, the first to third vibration devices 130-1 to 130-3 may be symmetrical with the fourth to sixth vibration devices 130-4 to 130-6, respectively in reverse order, with respect to the center of the vibration member 110. According to an example embodiment of the present disclosure, an apparatus or a sound bar may be provided where a sound including from the high-pitched sound band to the low-pitched sound band is output in a direction from the both ends E1 and E2 (or peripheries) of the vibration member 110 to the center thereof. For example, an apparatus or a sound bar may be provided where a sound of the high-pitched sound band increases progressively in a direction from the both ends E1 and E2 (or peripheries) of the vibration member 110 to the center thereof. For example, a fraction (or a size) of the second vibration portion 132 may be configured to increase more than the first vibration portion 131 in a direction from the both ends E1 and E2 (or peripheries) of the vibration member 110 to the center thereof, an apparatus or a sound bar having a uniform pitched sound band may be provided to an object (or a user).

According to an example embodiment of the present disclosure, an aspect ratio of the first vibration portion 131 and the second vibration portion 132 may be smaller than 1. For example, an aspect ratio may be vertical length/horizontal length of the first vibration portion 131 and the second vibration portion 132. For example, an aspect ratio of FIGS. 18A to 18C may be 1/6. For example, the first vibration portion 131 having a square shape may be enhanced in sound pressure level as an aspect ratio is reduced.

According to an example embodiment of the present disclosure, a fraction (or a size) of each of the first vibration portion 131 and the second vibration portion 132 may be adjusted, thereby providing an apparatus for adjusting a sound of a desired pitched sound band. For example, a fraction (or a size) of each of the first vibration portion 131 and the second vibration portion 132 may be adjusted based on a sound characteristic and/or a sound pressure level characteristic needed for an apparatus or a sound bar, and thus, it may be easy to design the vibration device 130. Moreover, according to an example embodiment of the present disclosure, the vibration generating apparatus 130 configured in the apparatus or the sound bar may be configured as a thin film type, and thus, a thickness of the apparatus or the sound bar may be configured to be thin, thereby providing an apparatus or a sound bar having a slim design. In addition, according to an example embodiment of the present disclosure, a sound of the low-pitched sound band may be implemented by the vibration generating apparatus 130 according to an example embodiment of the present disclosure without a woofer for implementing a sound of the low-pitched sound band, thereby enhancing the degree of freedom in space of an apparatus or a sound bar. Furthermore, according to an example embodiment of the present disclosure, because the first to $n^{th}$ vibration devices disposed in the first to $n^{th}$ regions of the vibration member 110 are provided and sizes of the first vibration portion 131 and the second vibration portion 132 are configured differently in the first to $n^{th}$ vibration devices, an apparatus or a sound bar may be provided where a sound output from one or more of the first to $n^{th}$ regions of the vibration member 110 has a pitched sound band which is different from a pitched sound band of a sound output from the other region(s) of the vibration member 110.

Figure 19A:
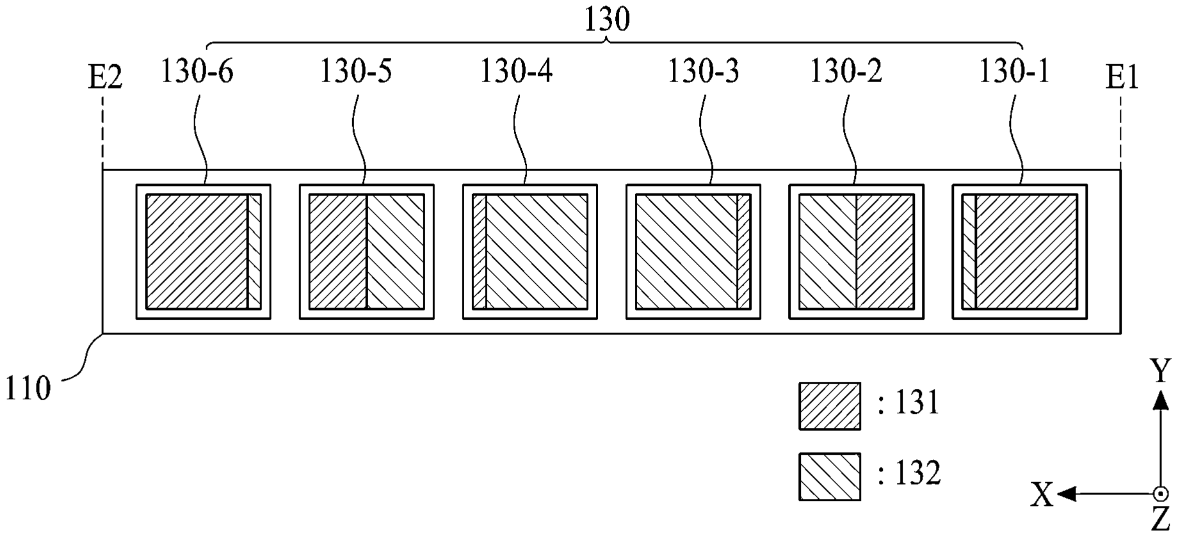
FIGS. 19A and 19B illustrate an apparatus according to another example embodiment of the present disclosure.
Figure 19B:
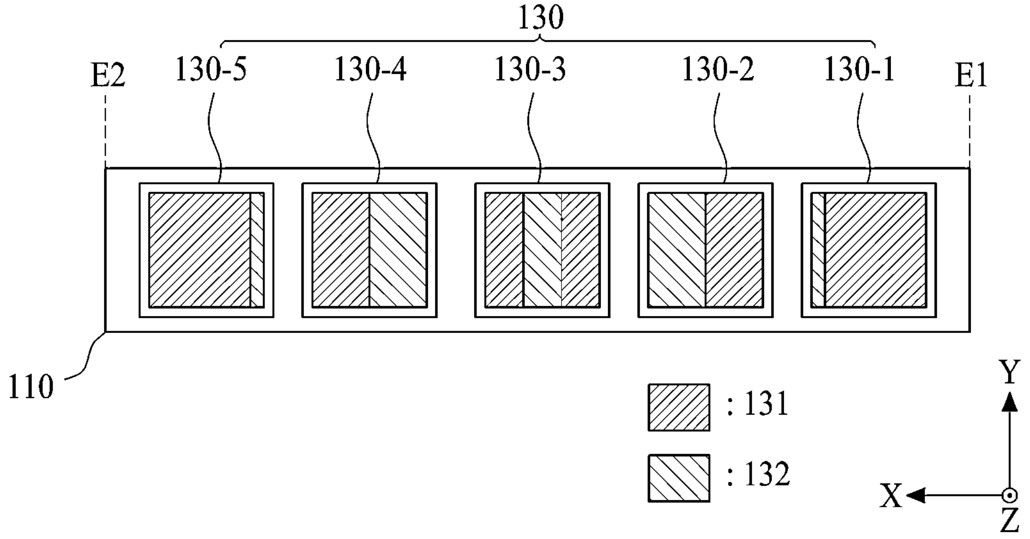

FIGS. 19A and 19B illustrate an apparatus according to another example embodiment of the present disclosure.

With reference to FIGS. 19A and 19B, the apparatus according to another example embodiment of the present disclosure may include a vibration member 110 and a vibration generating apparatus 130.

The vibration generating apparatus 130 may include at least two or more vibration devices. For example, the vibration generating apparatus 130 may include first to $n^{th}$ vibration devices 130-1 to **130-*n*. For example, the vibration generating apparatus 130 may include first to sixth vibration devices 130-1 to 130-6**.

With reference to FIG. 19A, a first vibration device 130-1 and a sixth vibration device 130-6 may be configured so that a first vibration portion 131 is greater in fraction (or size) than a second vibration portion 132. For example, when it is assumed that a position of an object is a center, the first vibration device 130-1 and the sixth vibration device 130-6 far away from the object may be configured so that a fraction (or a size) of the first vibration portion 131 is greater than a fraction (or a size) of the second vibration portion 132. A second vibration device 130-2 and a fifth vibration device 130-5 may be configured so that a fraction (or size) of a first vibration portion 131 is the same or substantially the same as a fraction (or size) of a second vibration portion 132. For example, comparing with the first vibration device 130-1 and the sixth vibration device 130-6, the second vibration device 130-2 and the fifth vibration device 130-5 may be configured so that a fraction (or a size) of the first vibration portion 131 is smaller. According to an example embodiment of the present disclosure, in each of the first to $n^{th}$ vibration devices, a fraction (or a size) of the first vibration portion 131 may increase progressively in a direction from each of the first to $n^{th}$ regions of the vibration member 110 (or from a center of the vibration member 110) to a periphery of the vibration member 110. For example, a fraction (or a size) of the first vibration portion 131 may be configured to increase more than a fraction (or a size) of the second vibration portion 132 in a direction from the center of the vibration member 110 to the both ends E1 and E2 (or peripheries) thereof. A third vibration device 130-3 and a fourth vibration device 130-4 may be configured so that a second vibration portion 132 is greater in fraction (or size) than a first vibration portion 131. Accordingly, when it is assumed that a position of an object is a center of the vibration member 110, an apparatus or a sound bar outputting a sound of the high-pitched sound band may be provided at a position close to the object. According to an example embodiment of the present disclosure, in each of the first to $n^{th}$ vibration devices, a fraction (or a size) of the second vibration portion 132 may increase progressively in a direction from each of the first to $n^{th}$ regions of the vibration member 110 (or from a respective one of the first and $n^{th}$ regions of the vibration member 110) to the center of the vibration member 110. For example, a fraction (or a size) of the second vibration portion 132 may be greater than the first vibration portion 131 at the center of the vibration member 110, an apparatus or a sound bar outputting a sound of the high-pitched sound band may be provided at the center of the vibration member 110. According to an example embodiment of the present disclosure, the first to third vibration devices 130-1 to 130-3 may be symmetrical with the fourth to sixth vibration devices 130-4 to 130-6, respectively in reverse order, with respect to the center of the vibration member 110. According to an example embodiment of the present disclosure, an apparatus or a sound bar may be provided where a sound of the low-pitched sound band increases more than a sound of the high-pitched sound band in a direction from the center of the vibration member 110 to the both ends E1 and E2 (or peripheries) thereof. For example, because a fraction (or a size) of the first vibration portion 131 is configured to increase more than the second vibration portion 132 in a direction from the center of the vibration member 110 to the both ends E1 and E2 (or peripheries) thereof, an apparatus or a sound bar having a uniform pitched sound band may be provided to an object (or a user).

FIGS. 18A to 19A are example embodiments in which even-numbered vibration devices are provided, and FIG. 19B is an example embodiment in which odd-numbered vibration devices are provided.

With reference to FIG. 19B, a vibration generating apparatus 130 may include first to fifth vibration devices 130-1 to 130-5.

A first vibration device 130-1 and a fifth vibration device 130-5 may be configured so that a first vibration portion 131 is greater in fraction (or size) than a second vibration portion 132. For example, when it is assumed that a position of an object is a center, the first vibration device 130-1 and the fifth vibration device 130-5 far away from the object may be configured so that a fraction (or a size) of the first vibration portion 131 is greater than a fraction (or a size) of the second vibration portion 132. A second vibration device 130-2 and a fourth vibration device 130-4 may be configured so that a fraction (or size) of a first vibration portion 131 is the same or substantially the same as a second vibration portion 132. The third vibration device 130-3 may be configured with two first vibration portions 131 and one second vibration portions 132. In the third vibration device 130-3, the second vibration portion 132 may be disposed between two first vibration portions 131. Accordingly, when it is assumed that a position of an object is a center of the vibration member 110, an apparatus or a sound bar outputting a sound of the low-pitched sound band and the high-pitched sound band may be provided at a position close to the object. According to an example embodiment of the present disclosure, the first and second vibration devices 130-1 and 130-2 may be symmetrical with the fourth and fifth vibration device 130-4 and 130-5, respectively in reverse order, with respect to the center of the vibration member 110. For example, the first and second vibration devices 130-1 and 130-2 may be symmetrical with the fourth and fifth vibration devices 130-4 and 130-5, respectively in reverse order, with respect to the third vibration device 130-3. According to an example embodiment of the present disclosure, an apparatus or a sound bar may be provided where a sound including from the high-pitched sound band to the low-pitched sound band is output in a direction from the center of the vibration member 110 to both ends E1 and E2 (or peripheries) thereof. For example, a fraction (or a size) of the first vibration portion 131 may be configured to increase more than the second vibration portion 132 in a direction from the center of the vibration member 110 to the both ends E1 and E2 (or peripheries) thereof. For example, because a fraction (or a size) of the first vibration portion 131 is configured to increase more than the second vibration portion 132 in a direction from the center of the vibration member 110 to the both ends E1 and E2 (or peripheries) thereof, an apparatus or a sound bar having a uniform pitched sound band may be provided to an object (or a user).

According to an example embodiment of the present disclosure, an aspect ratio of the first vibration portion 131 and the second vibration portion 132 may be smaller than 1. For example, an aspect ratio may be vertical length/horizontal length of the first vibration portion 131 and the second vibration portion 132. For example, an aspect ratio of FIG. 19A may be 1/6, and an aspect ratio of FIG. 19B may be 1/5. For example, the first vibration portion 131 having a square shape may be enhanced in sound pressure level as an aspect ratio is reduced.

According to an example embodiment of the present disclosure, a fraction (or a size) of each of the first vibration portion 131 and the second vibration portion 132 may be adjusted, thereby providing an apparatus for adjusting a sound of a desired pitched sound band. For example, a fraction (or a size) of each of the first vibration portion 131 and the second vibration portion 132 may be adjusted based on a sound characteristic and/or a sound pressure level characteristic needed for an apparatus or a sound bar, and thus, it may be easy to design the vibration generating apparatus 130. Furthermore, according to an example embodiment of the present disclosure, the vibration generating apparatus 130 configured in the apparatus or the sound bar may be configured as a thin film type, and thus, a thickness of the apparatus or the sound bar may be configured to be thin, thereby providing an apparatus or a sound bar having a slim design. In addition, according to an example embodiment of the present disclosure, a sound of the low-pitched sound band may be implemented by the vibration generating apparatus 130 according to an example embodiment of the present disclosure without a woofer for implementing a sound of the low-pitched sound band, thereby enhancing the degree of freedom in space of an apparatus or a sound bar. Furthermore, according to an example embodiment of the present disclosure, the vibration generating apparatus 130 may be implemented to include the first vibration portion 131 and the second vibration portion 132 regardless of the number (odd number and/or even number) of the vibration generating apparatus 130, and thus, the degree of freedom of a vibration device may be enhanced. Moreover, according to an example embodiment of the present disclosure, first to $n^{th}$ vibration devices disposed in first to $n^{th}$ regions of the vibration member 110 may be provided and the first to $n^{th}$ vibration devices may be configured so that a size of a first vibration portion 131 differs from a second vibration portion 132, and thus, an apparatus or a sound bar may be provided where a sound output from one or more of the first to $n^{th}$ regions of the vibration member 110 has a pitched sound band which is different from a pitched sound band of a sound output from the other region(s) of the vibration member 110.

Figure 20A:
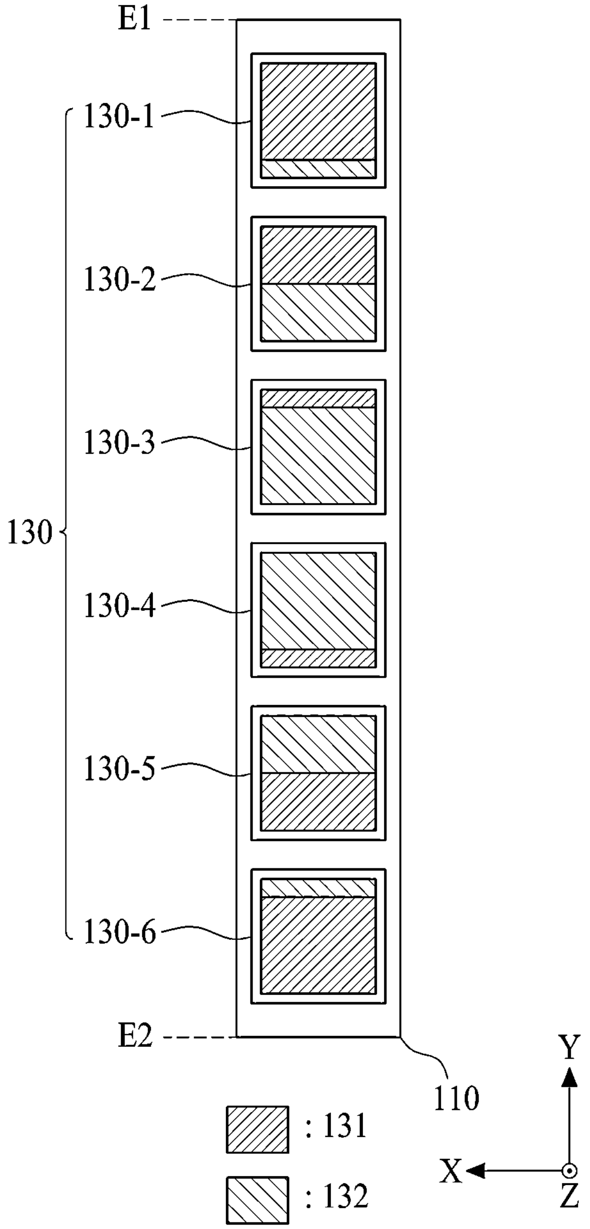
FIGS. 20A and 20B illustrate an apparatus according to another example embodiment of the present disclosure.
Figure 20B:
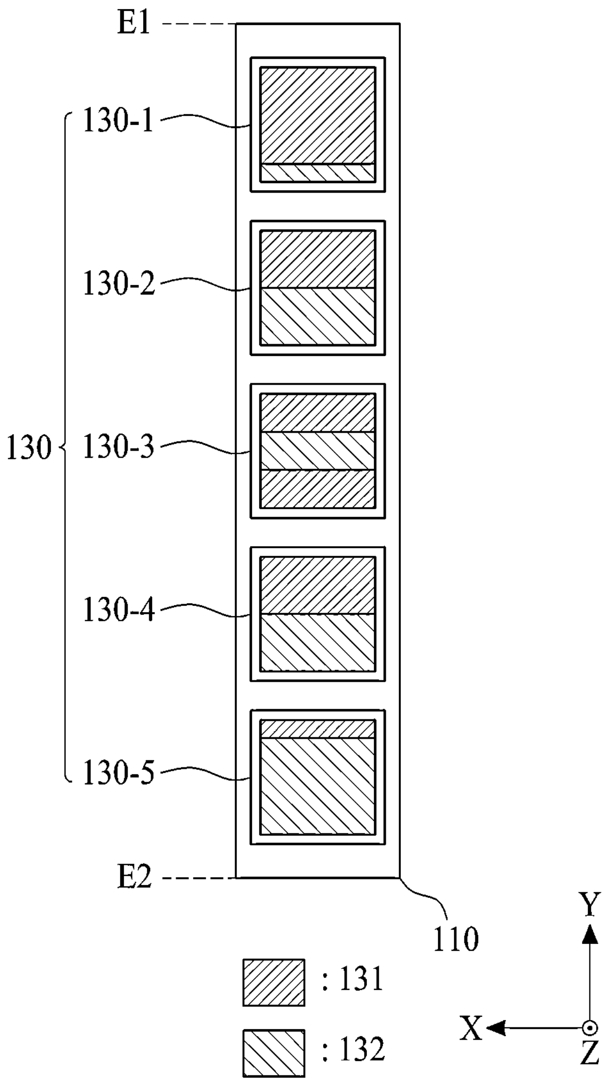

FIGS. 20A and 20B illustrate an apparatus according to another example embodiment of the present disclosure.

With reference to FIGS. 20A and 20B, an apparatus or a sound bar arranged along a second direction Y (or a third direction Z) is illustrated. For example, FIGS. 20A and 20B illustrate an example embodiment where the apparatuses described above with reference to FIGS. 19A and 19B are arranged along the second direction Y (or the third direction Z). Like reference numerals may refer to like elements, and repetitive descriptions thereof may be omitted or will be briefly given below. For example, the third direction Z may be a direction which is parallel to a thickness direction of a vibration member 110 or a vibration generating apparatus 130.

The apparatus according to another example embodiment of the present disclosure may include a vibration member 110 and a vibration generating apparatus 130. The vibration generating apparatus 130 may include at least two or more vibration devices, such as vibration devices 130-1 to 130-6.

With reference to FIG. 20A, the first vibration device 130-1 and the sixth vibration device 130-6 may be configured so that the first vibration portion 131 is greater in fraction (or size) than the second vibration portion 132. For example, when it is assumed that a position of an object is a center, the first vibration device 130-1 and the sixth vibration device 130-6 far away from the object may be configured so that a fraction (or a size) of the first vibration portion 131 is greater than a fraction (or a size) of the second vibration portion 132. The second vibration device 130-2 and the fifth vibration device 130-5 may be configured so that a fraction (or a size) of the first vibration portion 131 is the same or substantially the same as a fraction (or a size) of the second vibration portion 132. For example, comparing with the first vibration device 130-1 and the sixth vibration device 130-6, the second vibration device 130-2 and the fifth vibration device 130-5 may be configured so that a fraction (or a size) of the first vibration portion 131 is smaller. For example, a fraction (or a size) of the first vibration portion 131 may be configured to increase more than a fraction (or a size) of the second vibration portion 132 in a direction from the center of the vibration member 110 to the both ends E1 and E2 (or peripheries) thereof. A third vibration device 130-3 and a fourth vibration device 130-4 may be configured so that a second vibration portion 132 is greater in fraction (or size) than a first vibration portion 131. Accordingly, when it is assumed that a position of an object is a center of the vibration member 110, an apparatus or a sound bar outputting a sound of the high-pitched sound band may be provided at a position close to the object. For example, because the second vibration portion 132 is configured at the center of the vibration member 110, an apparatus or a sound bar outputting a sound of the high-pitched sound band may be provided at the center of the vibration member 110. According to an example embodiment of the present disclosure, the first to third vibration devices 130-1 to 130-3 may be symmetrical with the fourth to sixth vibration devices 130-4 to 130-6, respectively in reverse order, with respect to the center of the vibration member 110. According to an example embodiment of the present disclosure, an apparatus or a sound bar may be provided where a sound of the low-pitched sound band increases more than a sound of the high-pitched sound band in a direction from the center of the vibration member 110 to the both ends E1 and E2 (or peripheries) thereof. For example, because a fraction (or a size) of the first vibration portion 131 is configured to increase more than the second vibration portion 132 in a direction from the center of the vibration member 110 to the both ends E1 and E2 (or peripheries) thereof, an apparatus or a sound bar having a uniform pitched sound band may be provided to an object (or a user).

With reference to FIG. 20B, a vibration generating apparatus 130 may include first to fifth vibration devices 130-1 to 130-5.

A first vibration device 130-1 and a fifth vibration device 130-5 may be configured so that a first vibration portion 131 is greater in fraction (or size) than a second vibration portion 132. For example, when it is assumed that a position of an object is a center, the first vibration device 130-1 and the fifth vibration device 130-5 far away from the object may be configured so that a fraction (or a size) of the first vibration portion 131 is greater than a fraction (or a size) of the second vibration portion 132. A second vibration device 130-2 and a fourth vibration device 130-4 may be configured so that a fraction (or size) of a first vibration portion 131 is the same or substantially the same as a second vibration portion 132. The third vibration device 130-3 may be configured with two first vibration portions 131 and one second vibration portions 132. In the third vibration device 130-3, the second vibration portion 132 may be disposed between two first vibration portions 131. Accordingly, when it is assumed that a position of an object is a center of the vibration member 110, an apparatus or a sound bar outputting a sound of the low-pitched sound band and the high-pitched sound band may be provided at a position close to the object. According to an example embodiment of the present disclosure, the first and second vibration devices 130-1 and 130-2 may be symmetrical with the fourth and fifth vibration devices 130-4 and 130-5, respectively in reverse order, with respect to the center of the vibration member 110. For example, the first and second vibration devices 130-1 and 130-2 may be symmetrical with the fourth and fifth vibration devices 130-4 and 130-5, respectively in reverse order, with respect to the third vibration device 130-3. According to an example embodiment of the present disclosure, an apparatus or a sound bar may be provided where a sound including from the high-pitched sound band to the low-pitched sound band is output in a direction from the center of the vibration member 110 to both ends E1 and E2 (or peripheries) thereof. For example, a fraction (or a size) of the first vibration portion 131 may be configured to increase more than the second vibration portion 132 in a direction from the center of the vibration member 110 to the both ends E1 and E2 (or peripheries) thereof. For example, because a fraction (or a size) of the first vibration portion 131 is configured to increase more than the second vibration portion 132 in a direction from the center of the vibration member 110 to the both ends E1 and E2 (or peripheries) thereof, an apparatus or a sound bar having a uniform pitched sound band may be provided to an object (or a user).

According to an example embodiment of the present disclosure, an aspect ratio of the first vibration portion 131 and the second vibration portion 132 may be greater than 1. For example, an aspect ratio of FIG. 20A may be 6, and an aspect ratio of FIG. 20B may be 5. For example, the first vibration portion 131 having a square shape may be enhanced in sound pressure level as an aspect ratio is increased.

According to an example embodiment of the present disclosure, a fraction (or a size) of each of the first vibration portion 131 and the second vibration portion 132 may be adjusted, thereby providing an apparatus for adjusting a sound of a desired pitched sound band. For example, a fraction (or a size) of each of the first vibration portion 131 and the second vibration portion 132 may be adjusted based on a sound characteristic and/or a sound pressure level characteristic needed for an apparatus or a sound bar, and thus, it may be easy to design the vibration generating apparatus 130. Furthermore, according to an example embodiment of the present disclosure, the vibration generating apparatus 130 configured in the apparatus or the sound bar may be configured as a thin film type, and thus, a thickness of the apparatus or the sound bar may be configured to be thin, thereby providing an apparatus or a sound bar having a slim design. In addition, according to an example embodiment of the present disclosure, a sound of the low-pitched sound band may be implemented by the vibration generating apparatus 130 according to an example embodiment of the present disclosure without a woofer for implementing a sound of the low-pitched sound band, thereby enhancing the degree of freedom in space of an apparatus or a sound bar. Furthermore, according to an example embodiment of the present disclosure, the vibration generating apparatus 130 may be implemented to include the first vibration portion 131 and the second vibration portion 132 regardless of the number (odd number and/or even number) of the vibration generating apparatus 130, and thus, the degree of freedom of a vibration device may be enhanced. Moreover, according to an example embodiment of the present disclosure, first to $n^{th}$ vibration devices disposed in first to $n^{th}$ regions of the vibration member 110 may be provided and the first to $n^{th}$ vibration devices may be configured so that a size of a first vibration portion 131 differs from a second vibration portion 132, and thus, an apparatus or a sound bar may be provided where a sound output from one or more of the first to $n^{th}$ regions of the vibration member 110 has a pitched sound band which is different from a pitched sound band of a sound output from the other region(s) of the vibration member 110.

Figure 21A:
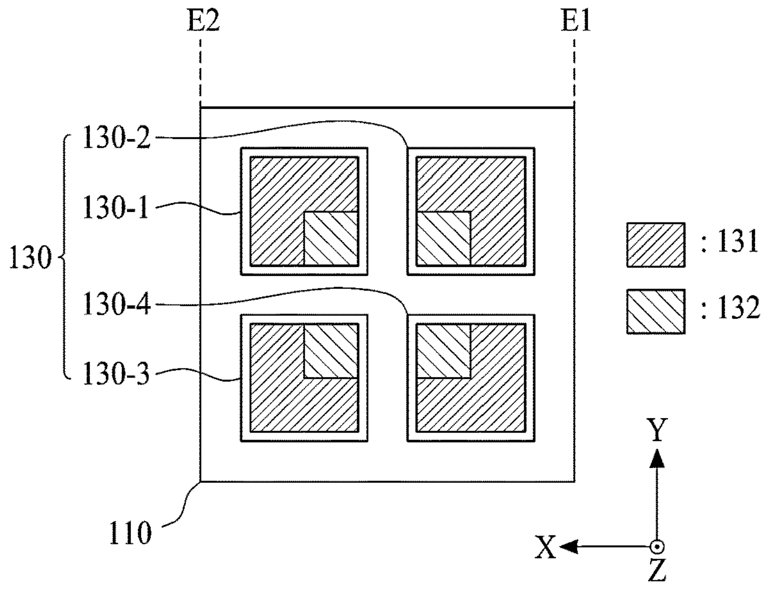
FIGS. 21A and 21B illustrate an apparatus according to another example embodiment of the present disclosure.
Figure 21B:
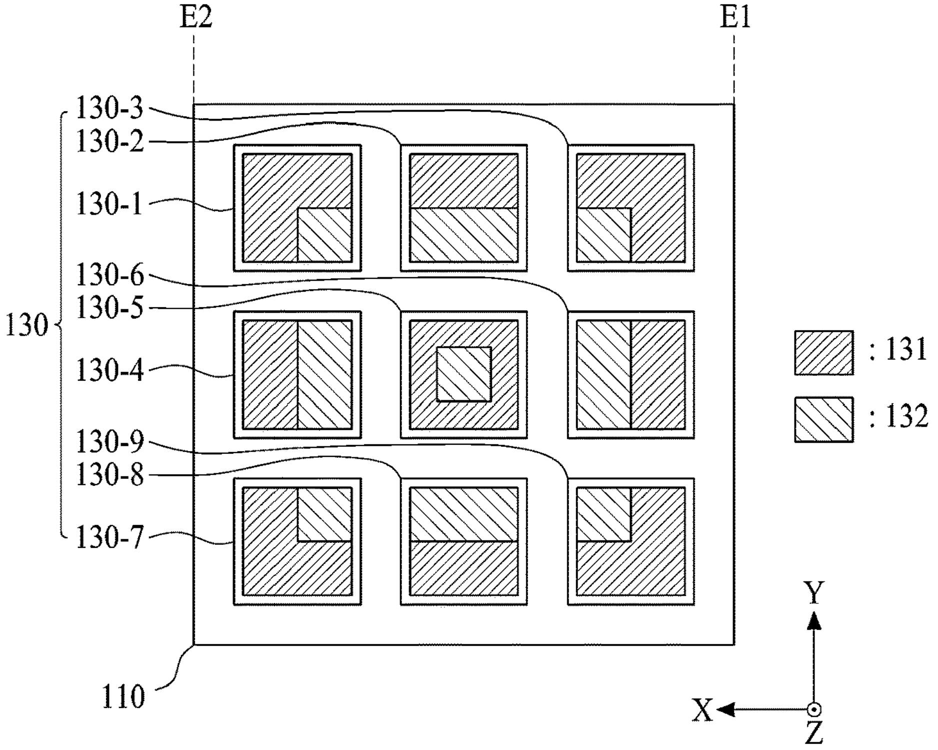

FIGS. 21A and 21B illustrate an apparatus according to another example embodiment of the present disclosure.

With reference to FIGS. 21A and 21B, an apparatus or a sound bar arranged along the first and second directions X and Y is illustrated. For example, FIGS. 21A and 21B may be substantially the same as the descriptions described above with reference to FIGS. 19A and 19B, and thus, like reference numerals may refer to like elements, and repetitive descriptions thereof may be omitted or will be briefly given below.

The apparatus according to another example embodiment of the present disclosure may include a vibration member 110 and a vibration generating apparatus 130. The vibration generating apparatus 130 may include two or more vibration devices 130-1 to 130-4. For example, FIG. 21A illustrates an apparatus or a sound bar including an even number of vibration devices. For example, a vibration generating apparatus 130 of FIG. 21A may be a 2×2 array, but embodiments of the present disclosure are not limited thereto.

With reference to FIG. 21A, first to fourth vibration devices 130-1 to 130-4 may be configured so that a fraction (or a size) of a first vibration portion 131 is greater than a second vibration portion 132. For example, the first to fourth vibration devices 130-1 to 130-4 may be identically configured so that a fraction (or a size) of the first vibration portion 131 is greater than the second vibration portion 132. However, embodiments of the present disclosure are not limited thereto, and the first to fourth vibration devices 130-1 to 130-4 may be identically or substantially identically configured so that a fraction (or a size) of the first vibration portion 131 is greater than the second vibration portion 132 and may be configured to have different fractions (or sizes). For example, a fraction (or a size) of a second vibration portion 132 of the first vibration device 130-1 and a fraction (or a size) of a second vibration portion 132 of the second vibration device 130-2 may be greater or smaller than a fraction (or a size) of a second vibration portion 132 of the third vibration device 130-3 and a fraction (or a size) of a second vibration portion 132 of the fourth vibration device 130-4. For example, a fraction (or a size) of the second vibration portion 132 of the first vibration device 130-1 and a fraction (or a size) of the second vibration portion 132 of the third vibration device 130-3 may be greater or smaller than a fraction (or a size) of the second vibration portion 132 of the second vibration device 130-2 and a fraction (or a size) of the second vibration portion 132 of the fourth vibration device 130-4. For example, the first vibration portion 131 may be disposed at a periphery of a vibration member 110. For example, the second vibration portion 132 may be disposed at one periphery of each of the first to fourth vibration devices 130-1 to 130-4. For example, the second vibration portion 132 may be disposed at a center of the vibration member 110. According to an example embodiment of the present disclosure, a first vibration portion 131 of each of first to $n^{th}$ vibration devices may be disposed closer to the periphery of the vibration member 110 than a second vibration portion 132, and a second vibration portion 132 of each of the first to $n^{th}$ vibration devices may be disposed closer to a center of the vibration member 110 than the first vibration portion 131. Furthermore, according to an example embodiment of the present disclosure, a sound of the high-pitched sound band may be output at the center of the vibration member 110, and a sound of the low-pitched sound band may be output in a direction from the center of the vibration member 110 to the periphery thereof, thereby providing an apparatus or a sound bar including a vibration device having a uniform pitches sound band of the low-pitched sound band to the high-pitched sound band. In addition, according to an example embodiment of the present disclosure, the first vibration portion 131 may be disposed adjacent to the center of the vibration member 110 and the second vibration portion 132 may be disposed near the first vibration portion 131, and thus, a uniform sound pressure level characteristic of a low sound and a high sound may be implemented more than a case where one vibration device (for example, the first vibration portion 131 or the second vibration portion 132) is provided. Moreover, in a high frequency, because a wavelength is shorter than a low frequency, a sound may not be substantially transferred (or traveled) to a far position, but because the first vibration portion 131 is added in implementing an apparatus with a vibration device (or a sound apparatus), a transfer (travel) distance of a sound of the vibration device (or the sound apparatus or the speaker) may increase and a low sound may also be reinforced.

With reference to FIG. 21B, a vibration generating apparatus 130 may include at least two or more vibration devices 130-1 to 130-9. For example, the vibration generating apparatus 130 may include first to ninth vibration devices 130-1 to 130-9. For example, FIG. 21B illustrates an apparatus or a sound bar including an odd number of vibration devices. For example, a vibration generating apparatus 130 of FIG. 21B may be a 3×3 array, but embodiments of the present disclosure are not limited thereto. For example, the vibration generating apparatus 130 of FIG. 21B may have an area larger than that of the vibration generating apparatus 130 than FIG. 21A, and thus, a sound pressure level characteristic and/or a sound characteristic may be further enhanced.

A first vibration device 130-1 and a third vibration device 130-3 may be configured so that a fraction (or size) of a first vibration portion 131 is greater than a second vibration portion 132. For example, a fraction (or size) of a first vibration portion 131 of the first vibration device 130-1 may be the same or substantially the same as that of the third vibration device 130-3. For example, a fraction (or size) of a second vibration portion 132 of the first vibration device 130-1 may be the same or substantially the same as that of the third vibration device 130-3. The first vibration device 130-1 and the third vibration device 130-3 may be symmetrical with each other with respect to a center of a vibration member 110. For example, the first vibration device 130-1 and the third vibration device 130-3 may be symmetrical with each other with respect to a center of a second vibration device 130-2.

The second vibration device 130-2 and an eighth vibration device 130-8 may be configured so that a fraction (or size) of a first vibration portion 131 is the same or substantially the same as that of a second vibration portion 132. For example, a fraction (or size) of a first vibration portion 131 of the second vibration device 130-2 may be the same or substantially the same as that of the eighth vibration device 130-8. For example, a fraction (or size) of a second vibration portion 132 of the second vibration device 130-2 may be the same or substantially the same as that of the eighth vibration device 130-8. The second vibration device 130-2 and the eighth vibration device 130-8 may be symmetrical with each other with respect to a center of the vibration member 110. For example, the second vibration device 130-2 and the eighth vibration device 130-8 may be symmetrical with each other with respect to a center of a fifth vibration device 130-5.

A fourth vibration device 130-4 and a sixth vibration device 130-6 may be configured so that a fraction (or size) of a first vibration portion 131 is the same or substantially the same as that of a second vibration portion 132. For example, a fraction (or size) of a first vibration portion 131 of the fourth vibration device 130-4 may be the same or substantially the same as that of the sixth vibration device 130-6. For example, a fraction (or size) of a second vibration portion 132 of the fourth vibration device 130-4 may be the same or substantially the same as that of the sixth vibration device 130-6. The fourth vibration device 130-4 and the sixth vibration device 130-6 may be symmetrical with each other with respect to a center of the vibration member 110. For example, the fourth vibration device 130-4 and the sixth vibration device 130-6 may be symmetrical with each other with respect to a center of the fifth vibration device 130-5.

A seventh vibration device 130-7 and a ninth vibration device 130-9 may be configured so that a fraction (or size) of a first vibration portion 131 is greater than a second vibration portion 132. For example, a fraction (or size) of a first vibration portion 131 of the seventh vibration device 130-7 may be the same or substantially the same as that of the ninth vibration device 130-9. For example, a fraction (or size) of a second vibration portion 132 of the seventh vibration device 130-7 may be the same or substantially the same as that of the ninth vibration device 130-9. The seventh vibration device 130-7 and the ninth vibration device 130-9 may be symmetrical with each other with respect to a center of the vibration member 110. For example, the seventh vibration device 130-7 and the ninth vibration device 130-9 may be symmetrical with each other with respect to a center of the eighth vibration device 130-8.

The fifth vibration device 130-5 may be configured so that a fraction (or size) of the first vibration portion 131 is greater than a fraction (or size) of the second vibration portion 132. For example, the second vibration portion 132 may be disposed at a center of the fifth vibration device 130-5. For example, a first vibration portion 131 of the fifth vibration device 130-5 may surround a second vibration portion 132.

The first vibration device 130-1, the fourth vibration device 130-4, and the seventh vibration device 130-7 may be symmetrical with the third vibration device 130-3, the sixth vibration device 130-6, and the ninth vibration device 130-9 with respect to the center of the vibration member 110.

According to an example embodiment of the present disclosure, a first vibration portion 131 of each of first to $n^{th}$ vibration devices may be disposed closer to the periphery of the vibration member 110 than a second vibration portion 132, and a second vibration portion 132 of each of the first to $n^{th}$ vibration devices may be disposed closer to the center of the vibration member 110 than the first vibration portion 131. Furthermore, according to an example embodiment of the present disclosure, a sound of the high-pitched sound band may be output at the center of the vibration member 110, and a sound of the low-pitched sound band may be output in a direction from the center of the vibration member 110 to the periphery thereof, thereby providing an apparatus or a sound bar including a vibration device having a uniform pitches sound band of the low-pitched sound band to the high-pitched sound band. In addition, according to an example embodiment of the present disclosure, because the first to $n^{th}$ vibration devices disposed in first to $n^{th}$ regions of the vibration member 110 are provided and sizes of the first vibration portion 131 and the second vibration portion 132 are configured differently in the first to $n^{th}$ vibration devices, an apparatus or a sound bar may be provided where a sound output from one or more of the first to $n^{th}$ regions of the vibration member 110 has a pitched sound band which is different from a pitched sound band of a sound output from the other region(s) of the vibration member 110. Furthermore, according to an example embodiment of the present disclosure, the first vibration portion 131 may be disposed adjacent to the center of the vibration member 110 and the second vibration portion 132 may be disposed near the first vibration portion 131, and thus, a uniform sound pressure level characteristic of a low sound and a high sound may be implemented more than a case where one vibration device (for example, the first vibration portion 131 or the second vibration portion 132) is provided. Moreover, in a high frequency, because a wavelength is shorter than a low frequency, a sound may not be transferred to a far position, but because the first vibration portion 131 is added in implementing an apparatus with a vibration device (or the sound apparatus), a transfer distance of a sound of the vibration device (or the sound apparatus or the speaker) may increase and a low sound may also be reinforced.

Figure 22:
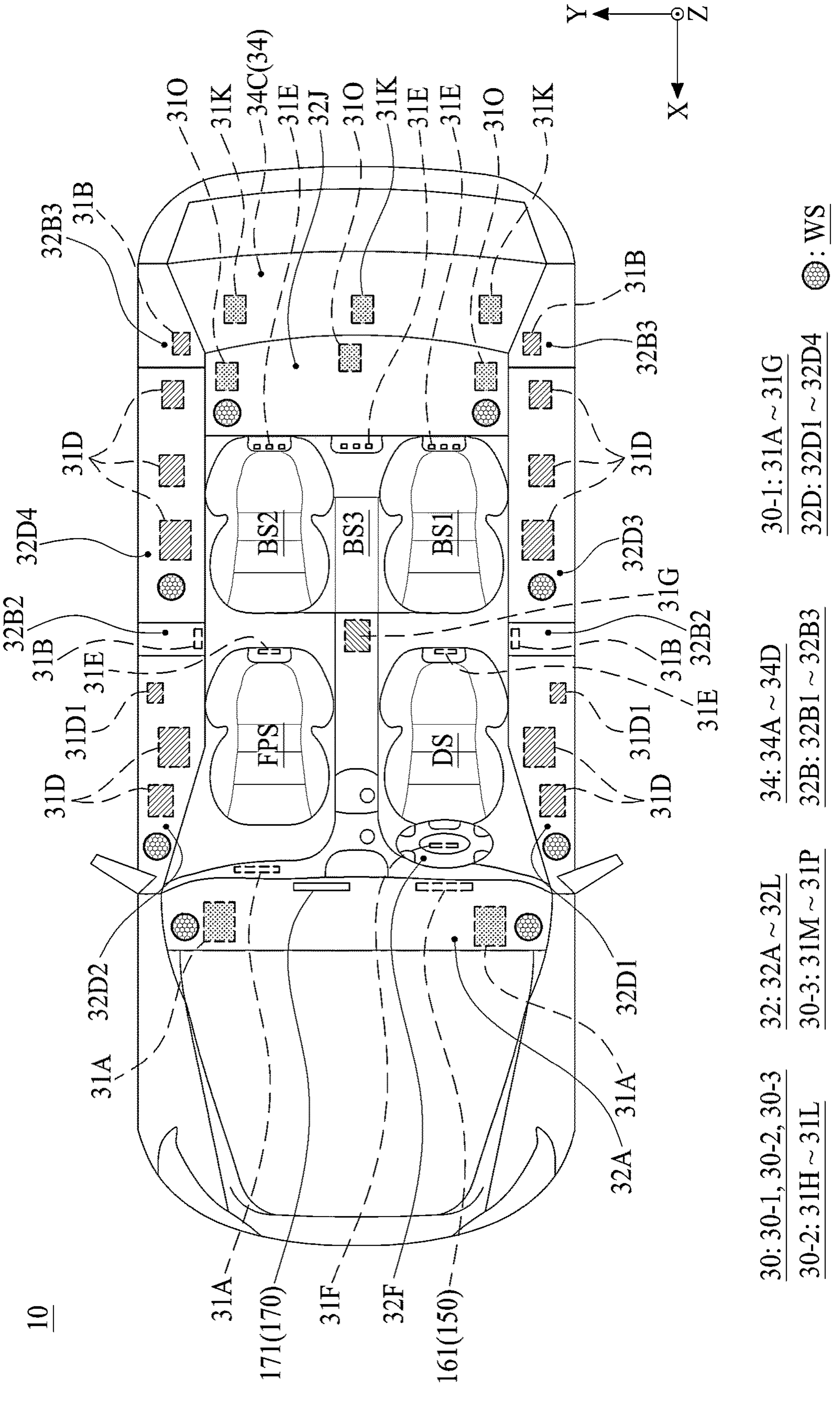
FIG. 22 illustrates a vehicular apparatus according to an example embodiment of the present disclosure.
Figure 23:
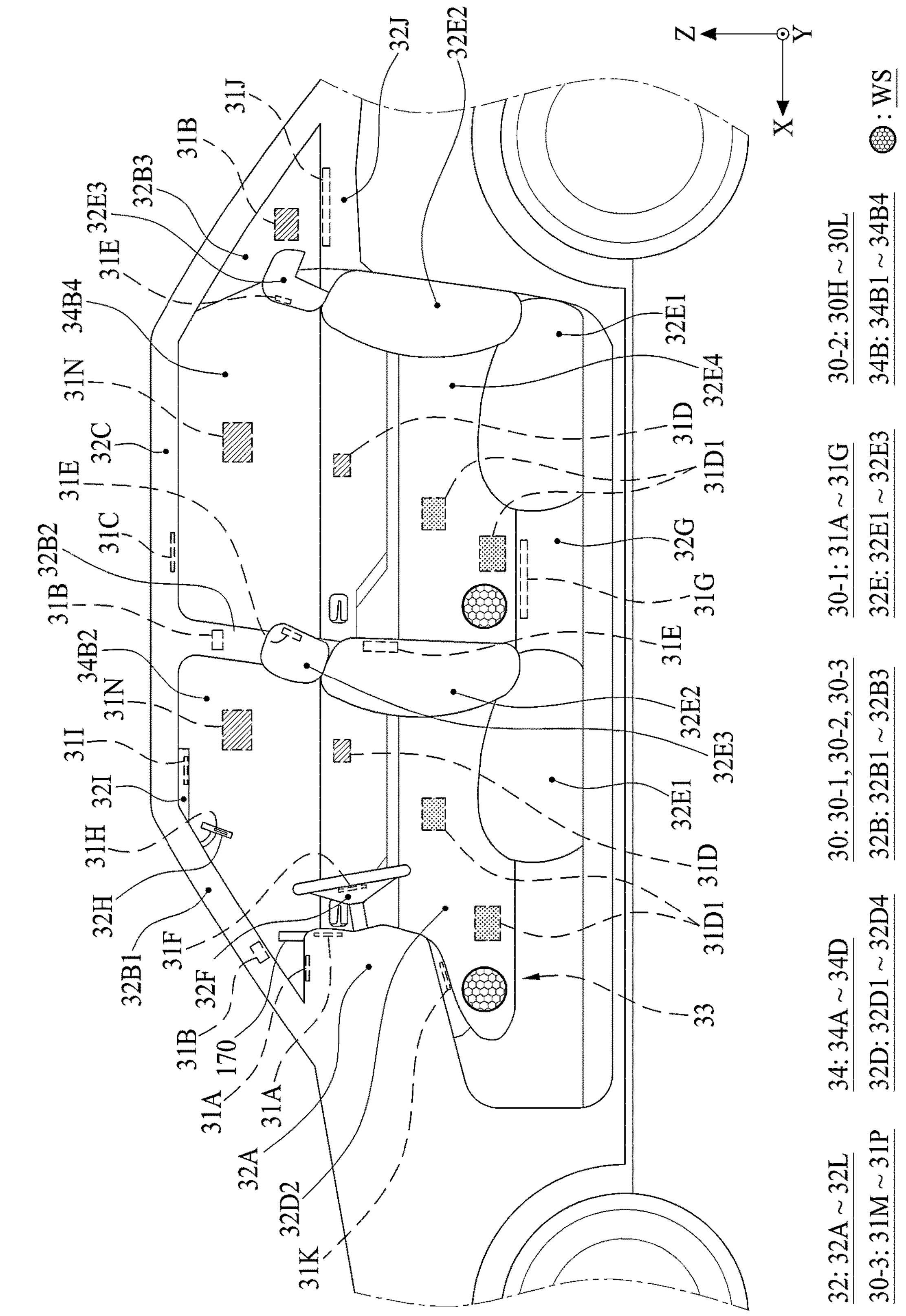
FIG. 23 illustrates a vehicular apparatus according to an example embodiment of the present disclosure.
Figure 24:
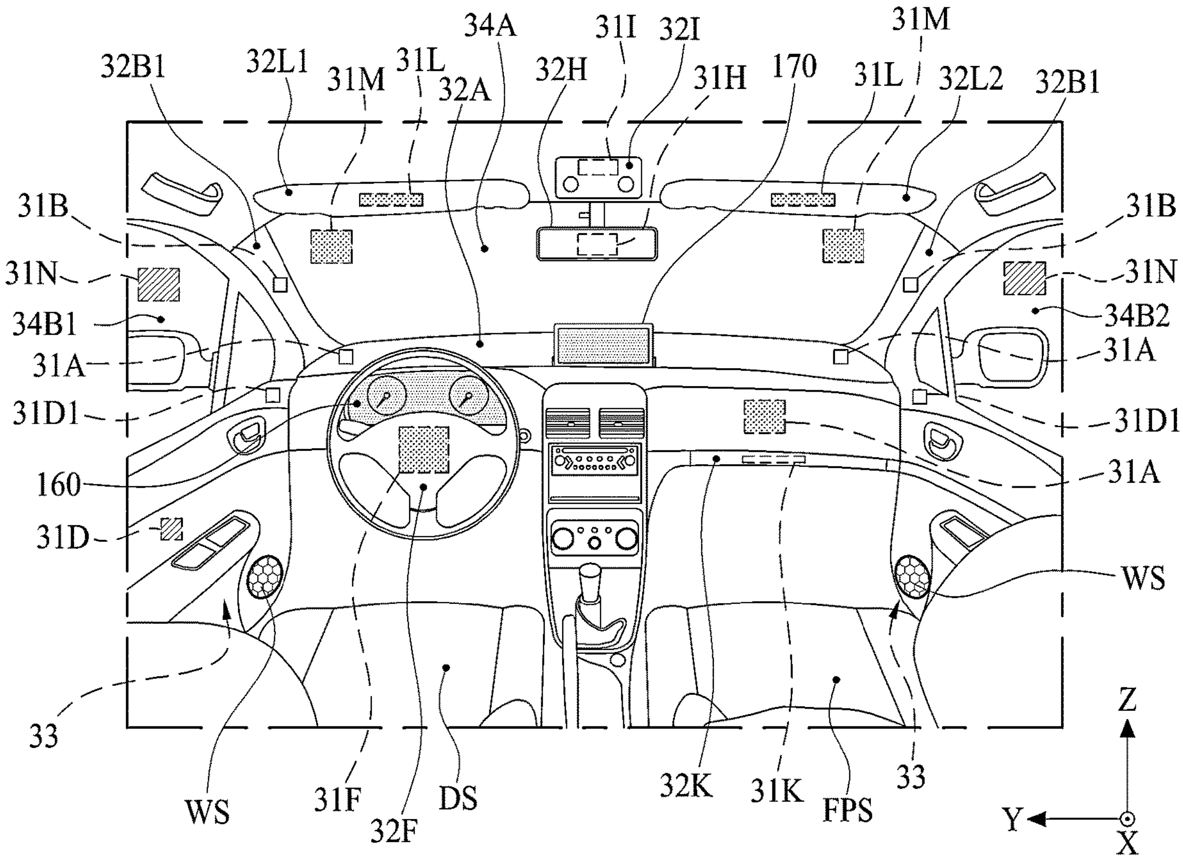
FIG. 24 illustrates a vibrator disposed near a driver seat and a passenger seat of a vehicular apparatus according to an example embodiment of the present disclosure.
Figure 25:
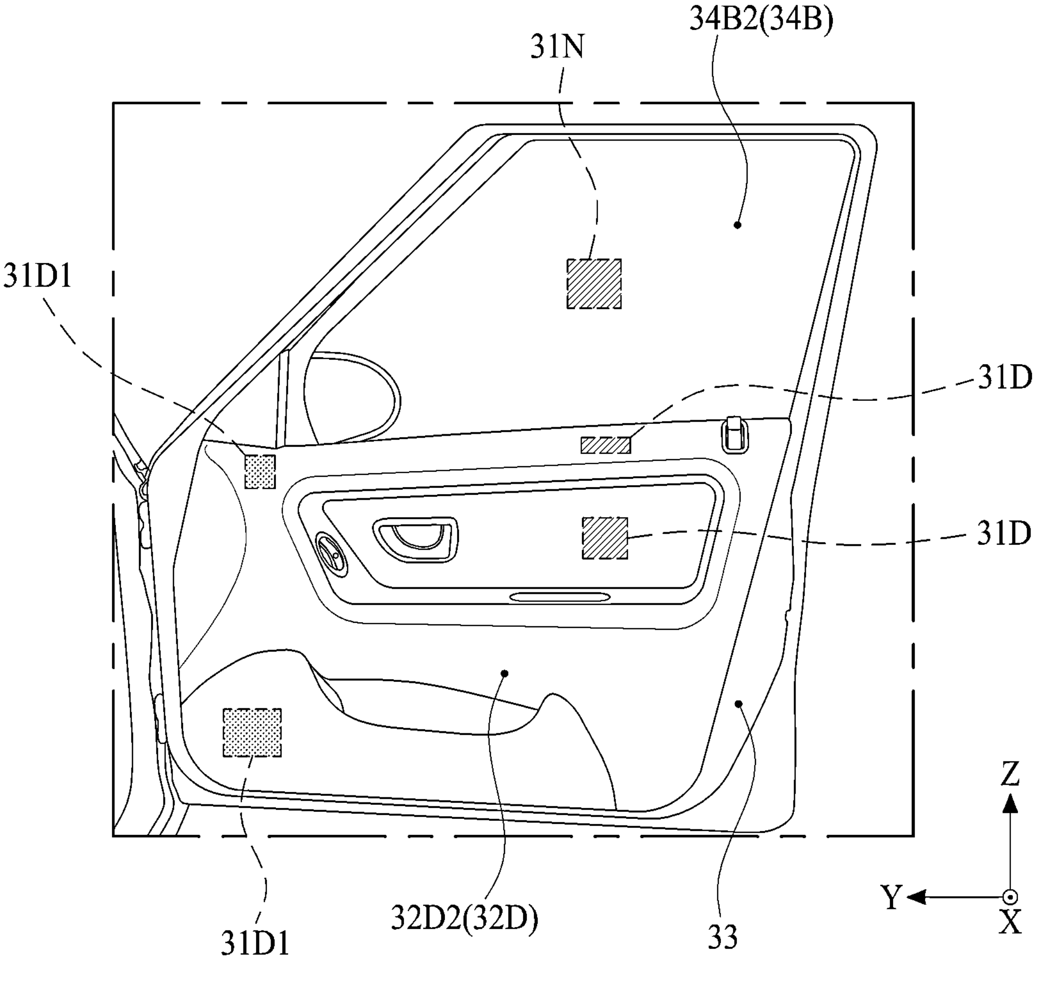
FIG. 25 illustrates a vibrator disposed at a door and a glass window of a vehicular apparatus according to an example embodiment of the present disclosure.
Figure 26:
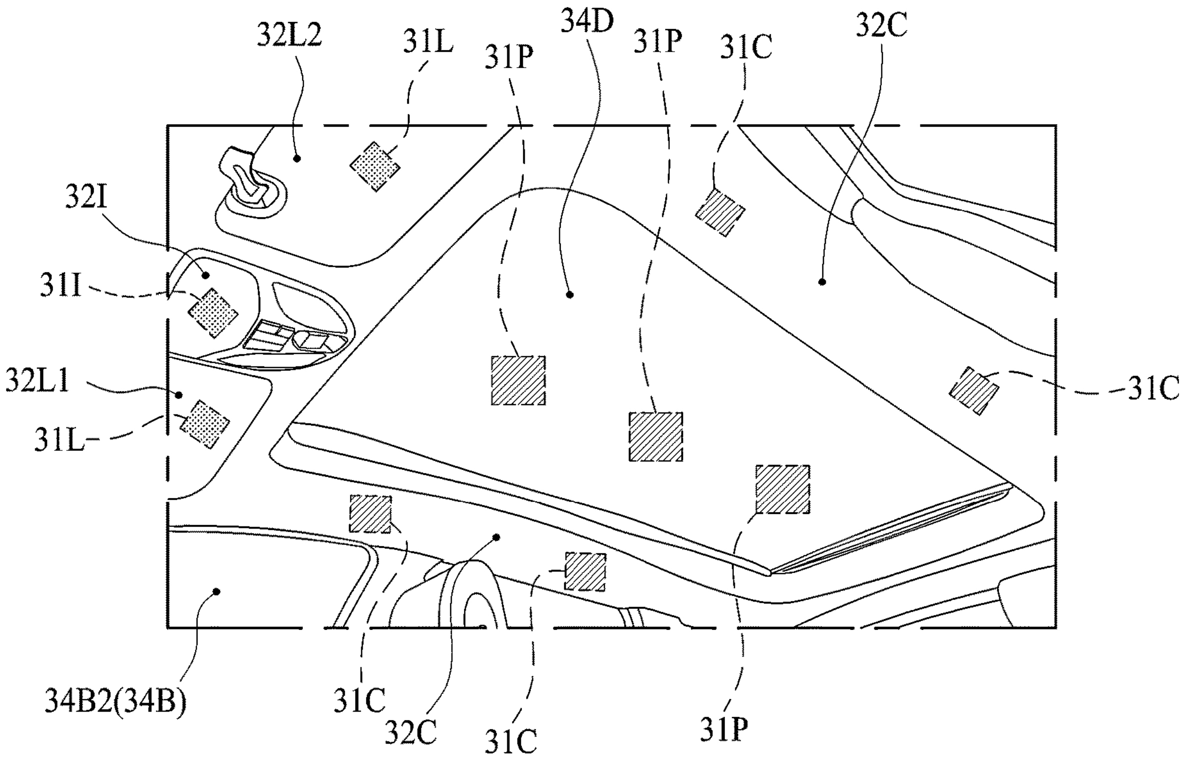
FIG. 26 illustrates a vibrator disposed at a roof panel of a vehicular apparatus according to an example embodiment of the present disclosure.
Figure 27:
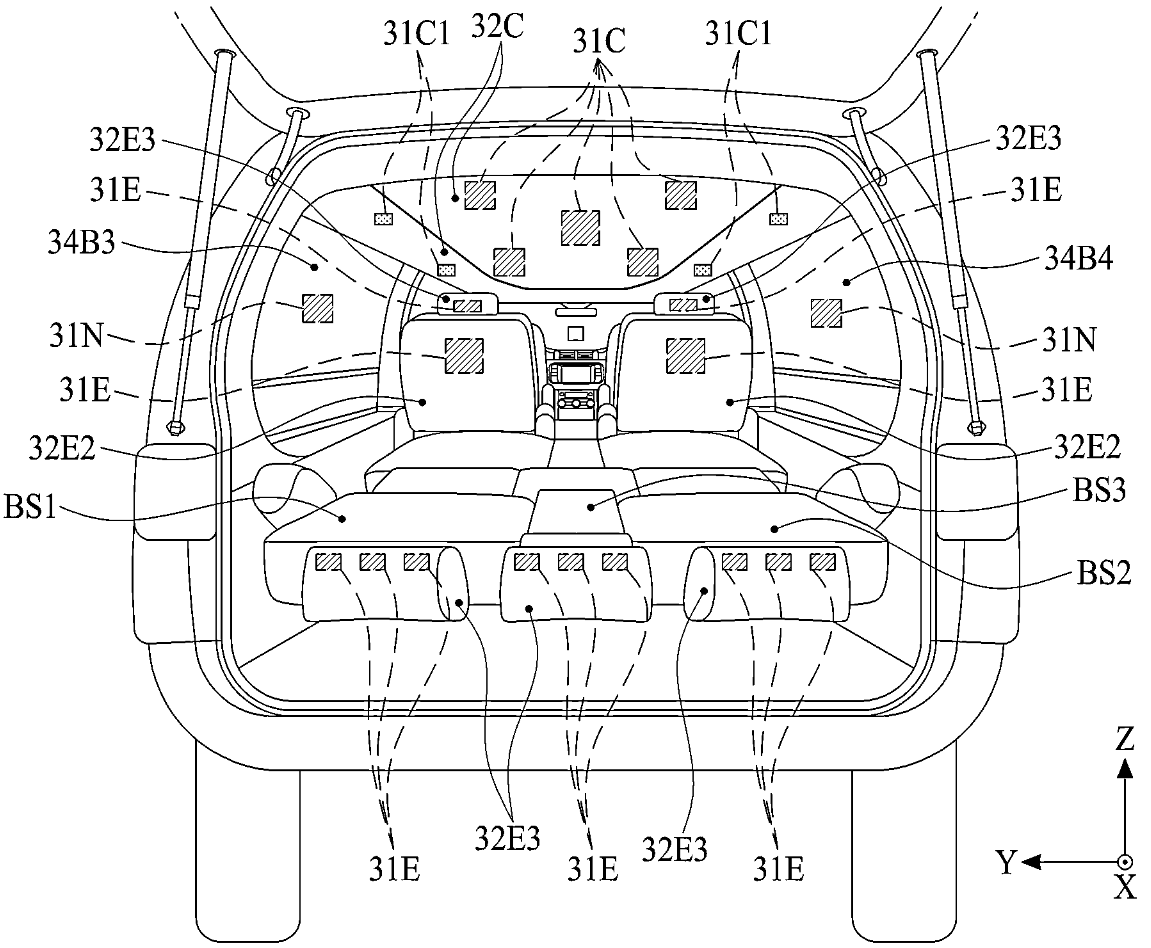
FIG. 27 illustrates a vibrator disposed at a roof panel, a glass window, and a seat of a vehicular apparatus according to an example embodiment of the present disclosure.

FIG. 22 illustrates a vehicular apparatus according to an example embodiment of the present disclosure. FIG. 23 illustrates a vehicular apparatus according to an example embodiment of the present disclosure. FIG. 24 illustrates a vibrator disposed near a driver seat and a passenger seat of FIGS. 22 and 23. FIG. 25 illustrates a vibrator disposed at a door and a glass window of FIGS. 22 and 23. FIG. 26 illustrates a vibrator disposed at a roof panel of FIGS. 22 and 23. FIG. 27 illustrates a vibrator disposed at a roof panel, a glass window, and a seat of FIGS. 22 and 23.

With reference to FIGS. 22 to 27, the vehicular apparatus according to an example embodiment of the present disclosure may include a main structure, an exterior material, and an interior material 32.

The main structure (or a frame structure) may include a main frame, a sub-frame, a side frame, a door frame 33, an under-frame, and a seat frame, or the like, but embodiments of the present disclosure are not limited thereto.

The exterior material may be configured to cover the main structure. For example, the exterior material may be configured to cover an outer portion of the main structure. The exterior material according to an example embodiment of the present disclosure may include a hood panel, a front fender panel, a dash panel, a pillar panel, a trunk panel, a roof panel, a floor panel, a door inner panel, and a door outer panel, or the like, but embodiments of the present disclosure are not limited thereto. The exterior material according to an example embodiment of the present disclosure may include at least one or more of a planar portion and a curved portion. For example, the exterior material may have a surface structure corresponding to a surface structure of a corresponding main structure, or may have a surface structure which is different from the surface structure of the corresponding main structure.

The interior material 32 may include all elements configuring an inner portion of the vehicular apparatus, or may include all elements disposed at an indoor space of the vehicular apparatus. For example, the interior material 32 may be an interior member or an inner finishing material of the vehicular apparatus, but embodiments of the present disclosure are not limited thereto.

The interior material 32 according to an example embodiment of the present disclosure may cover one or more of the main structure and the exterior material in the indoor space of the vehicular apparatus and may be configured to be exposed at the indoor space of the vehicular apparatus. For example, the interior material 32 may include one or more of a dashboard, a pillar interior material (or a pillar trim), a floor interior material (or a floor carpet), a roof interior material (or a headliner), a door interior material (or a door trim), a handle interior material (or a steering cover), a seat interior material, a rear package interior material (or a back seat shelf), an overhead console (or an indoor illumination interior material), a rear view mirror, a glove box, and a sun visor, or the like, but embodiments of the present disclosure are not limited thereto.

The interior material 32 according to an example embodiment of the present disclosure may include one or more materials of plastic, fiber, leather, cloth, rubber, wood, paper, carbon, glass, a mirror, and metal, but embodiments of the present disclosure are not limited thereto. For example, the paper may be conge for speakers. For example, the conge may be pulp or foamed plastic, or the like, but embodiments of the present disclosure are not limited thereto.

The interior material 32 according to another example embodiment of the present disclosure may include a base member and a surface member. For example, the base member may be an injection material, a first interior material, an inner interior material, or a rear interior material, but embodiments of the present disclosure are not limited thereto. The surface member may be a second interior material, an outer interior material, a front interior material, an outer surface member, a reinforcement member, or a decoration member, but embodiments of the present disclosure are not limited thereto.

The interior material 32 or the base member may include a plastic material. For example, the interior material 32 or the base member may be an injection material which is implemented by an injection process (or injection molding process) using a thermoplastic resin or a thermosetting resin, but embodiments of the present disclosure are not limited thereto. The interior material 32 or the base member may be configured to cover one or more of the main structure and the exterior material in the indoor space of the vehicular apparatus. For example, the interior material 32 or the base member may be configured to cover one or more one surfaces (or an inner surface) of at least one or more of a main frame, a side frame, a door frame 33, and a handle frame, which are exposed at the indoor space of the vehicular apparatus.

The surface member may be disposed to cover the base member. The surface member may cover the base member in the indoor space of the vehicular apparatus and may be configured to be exposed at the indoor space. For example, the surface member may be disposed at or coupled to a front surface of the base member exposed at the indoor space of the vehicular apparatus. For example, the surface member may include one or more materials of plastic, fiber, leather, cloth, rubber, wood, paper, carbon, and a metal, but embodiments of the present disclosure are not limited thereto.

The interior material 32 or the surface member may be a fiber material. For example, the interior material 32 or the surface member may include at least one or more of a synthetic fiber, a carbon fiber (or an aramid fiber), and a natural fiber. For example, the interior material 32 or the surface member may be a textile sheet, a knit sheet, or a nonwoven fabric, but embodiments of the present disclosure are not limited thereto. For example, the interior material 32 or the surface member may be a fabric member, but embodiments of the present disclosure are not limited thereto. The synthetic fiber may be a thermoplastic resin and may include a polyolefin-based fiber which is an eco-friendly material which does not relatively release a harmful substance, but embodiments of the present disclosure are not limited thereto. For example, the polyolefin-based fiber may include a polyethylene fiber, a polypropylene fiber, or a polyethylene terephthalate fiber. The polyolefin-based fiber may be a fiber of a single resin or a fiber of a core-shell structure. The natural fiber may be a composite fiber of any one or two or more of a jute fiber, a kenaf fiber, an abaca fiber, a coconut fiber, and a wood fiber, but embodiments of the present disclosure are not limited thereto.

The one or more vibration generating apparatuses 30 including one or more of first to third vibration generating apparatuses 30-1, 30-2, and 30-3 may be disposed at one or more of the main structure, the exterior material, and the interior material 32. For example, the one or more vibration generating apparatuses 30 including one or more of the first to third vibration generating apparatuses 30-1, 30-2, and 30-3 may be disposed at one or more of the exterior material, the interior material 32, between the main structure and the exterior material, and between the main structure and the interior material 32. For example, the one or more vibration generating apparatuses 30 may be disposed at one or more among between the main structure and the exterior material, between the main structure and the interior material 32, the exterior material, and the interior material 32, and may be configured to output a sound. For example, the one or more vibration generating apparatuses 30 may be disposed at one or more among (a) a region between the main structure and the exterior material, (b) a region between the main structure and the interior material 32, (c) the exterior material, and (d) the interior material 32. Furthermore, the one or more vibration generating apparatuses 30 may indirectly or directly vibrate one or more among (a) a region between the main structure and the exterior material, (b) a region between the main structure and the interior material 32, (c) the exterior material, and (d) the interior material 32 to output sound. For example, the one or more vibration generating apparatuses 30 may be disposed between the exterior material and the interior material, and may indirectly or directly vibrate one or more of the exterior material and the interior material to output sound. For example, a vibration member of the one or more vibration generating apparatuses 30 may be one or more of the exterior material and the interior material. According to an example embodiment of the present disclosure, one or more of the exterior material and the interior material may output a sound based on a vibration of the one or more vibration generating apparatuses 30.

One or more of the exterior material and the interior material of the vehicular apparatus may be a vibration plate, a sound vibration plate, or a sound generating plate, or the like for outputting a sound. For example, each of the exterior material and the interior material for outputting the sound may have a size which is greater than the one or more vibration generating apparatuses 30, and thus, may perform a function of a large-area vibration plate, a large-area sound vibration plate, or a large-area sound generating plate, thereby enhancing a sound characteristic and/or a sound pressure level characteristic of a low-pitched sound band generated by the one or more vibration generating apparatuses 30. For example, a frequency of a sound of the low-pitched sound band may be 500 Hz or less, but embodiments of the present disclosure are not limited thereto.

The one or more vibration generating apparatuses 30 according to an example embodiment of the present disclosure may output a sound between the exterior material and the interior material of the vehicular apparatus. For example, the one or more vibration generating apparatuses 30 may be connected to or coupled to one or more of the exterior material and the interior material in a region between the exterior material and the interior material, and may indirectly or directly vibrate one or more of the exterior material and the interior material to output sound.

A vehicular apparatus according to an example embodiment of the present disclosure may include a first vibration generating apparatus 30-1 which is configured to output a sound between the exterior material and the interior material 32. For example, the first vibration generating apparatus 30-1 may be disposed at one or more of the exterior material, the interior material 32, and a region between the exterior material and the interior material 32 to output a sound.

The first vibration generating apparatus 30-1 may include one or more vibrators 31A to 31G which are disposed at one or more of a dashboard 32A, a pillar interior material 32B, a roof interior material 32C, a door interior material 32D, a seat interior material 32E, a handle interior material 32F, and a floor interior material 32G. For example, the first vibration generating apparatus 30-1 may include one or more of the first to seventh vibrators 31A to 31G, and thus, may output sounds of one or more channels.

With reference to FIGS. 22 to 27, a first vibrator 31A according to an example embodiment of the present disclosure may be disposed between a dash panel and a dashboard 32A and may be configured to indirectly or directly vibrate the dashboard 32A to output a sound. For example, the first vibrator 31A may include a vibration device 130 described above with reference to FIGS. 3A to 6 and 18A to 21B, and thus, the repetitive description thereof may be omitted. For example, the first vibrator 31A may be configured as a vibration device where a sound of the low-pitched sound band is further enhanced in a direction distancing from a position of an object, receiving a sound source or a sound, or a position of an ear of a driver and/or an occupant (or a passenger) in the vehicular apparatus. For example, a vibration device may be configured so that a fraction (or a size) of a first vibration portion is greater than a fraction (or a size) of a second vibration portion. For example, the first vibrator 31A may be configured with a vibration device where a sound of the low-pitched sound band is further enhanced. For example, the first vibrator 31A may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the first vibrator 31A may be configured as two or more vibration devices. For example, the first vibrator 31A may be referred to as a term such as a dashboard speaker or a first speaker, or the like, but embodiments of the present disclosure are not limited thereto.

According to an example embodiment of the present disclosure, at least one or more of the dash panel and the dashboard 32A may include a first region corresponding to a driver seat DS, a second region corresponding to a passenger seat FPS, and a third region (or a middle region)

between the first region and the second region. At least one or more of the dash panel and the dashboard 32A may further include a fourth region which is inclined to face the passenger seat FPS. According to an example embodiment of the present disclosure, the first vibrator 31A may be configured to vibrate at least one or more among the first to fourth regions of the dashboard 32A. For example, the first vibrator 31A may be disposed at each of the first and second regions of the dashboard 32A, or may be disposed at each of the first to fourth regions of the dashboard 32A. For example, the first vibrator 31A may be disposed at each of the first and second regions of the dashboard 32A, or may be disposed at at least one or more of the first to fourth regions of the dashboard 32A. For example, the first vibrator 31A may be configured to output a sound of about 150 Hz to about 20 kHz. For example, the first vibrator 31A configured to vibrate at least one or more among the first to fourth regions of the dashboard 32A may have the same sound output characteristic or different sound output characteristics. For example, the first vibrator 31A configured to vibrate each of the first to fourth regions of the dashboard 32A may have the same sound output characteristic or different sound output characteristics.

The second vibrator 31B according to an example embodiment of the present disclosure may be disposed between the pillar interior material 32B and a pillar panel and may be configured to indirectly or directly vibrate the pillar interior material 32B to output a sound. For example, the second vibrator 31B may include a vibration device 130 described above with reference to FIGS. 3A to 6 and 18A to 21B, and thus, the repetitive description thereof may be omitted. For example, the second vibrator 31B may be configured as a vibration device where a sound of the high-pitched sound band is further enhanced in a direction closer to position of an object, receiving a sound source or a sound, or a position of an ear of a driver and/or an occupant (or a passenger) in the vehicular apparatus. For example, a vibration device may be configured so that a fraction (or a size) of a second vibration portion is greater than a fraction (or a size) of a first vibration portion. For example, the second vibrator 31B may be configured with a vibration device where a sound of the high-pitched sound band is further enhanced. For example, the second vibrator 31B may be arranged in the order of the second vibration device 130-2, the first vibration device 130-1, the sixth vibration device 130-6, and the fifth vibration device 130-5 along a first direction X (or from the left to the right in the drawing) in FIG. 18A, but embodiments of the present disclosure are not limited thereto. For example, the second vibrator 31B may be configured as two or more vibration devices. For example, the second vibrator 31B may be referred to as a term such as a pillar speaker, a tweeter speaker, or a second speaker, or the like, but embodiments of the present disclosure are not limited thereto.

According to an example embodiment of the present disclosure, the pillar panel may include a first pillar (or an A pillar) disposed at both sides of a front glass window, a second pillar (or a B pillar) disposed at both sides of a center of a vehicle body, and a third pillar (or a C pillar) disposed at both sides of a rear portion of the vehicle body. The pillar interior material 32B may include a first pillar interior material 32B1 covering the first pillar, a second pillar interior material 32B2 covering the second pillar, and a third pillar interior material 32B3 covering the third pillar. According to an example embodiment of the present disclosure, the second vibrator 31B may be disposed in at least one or more of a region between the first pillar and the first pillar interior material 32B1, a region between the second pillar and the second pillar interior material 32B2, and a region between the third pillar and the third pillar interior material 32B3, and thus, may vibrate at least one or more of the first to third pillar interior materials 32B1, 32B2, and 32B3. For example, the second vibrator 31B may include a vibration device 130 described above with reference to FIGS. 3A to 6 and 18A to 21B, and thus, the repetitive description thereof may be omitted. For example, the second vibrator 31B may be configured as a vibration device where a sound of the high-pitched sound band is further enhanced in a direction closer to position of an object, receiving a sound source or a sound, or a position of an ear of a driver and/or an occupant (or a passenger) in the vehicular apparatus. For example, a vibration device may be configured so that a fraction (or a size) of a second vibration portion is greater than a fraction (or a size) of a first vibration portion. For example, the second vibrator 31B may be configured with a vibration device where a sound of the high-pitched sound band is further enhanced. For example, the second vibrator 31B may be arranged in the order of the second vibration device 130-2, the first vibration device 130-1, the sixth vibration device 130-6, and the fifth vibration device 130-5 along a first direction X (or from the left to the right in the drawing) in FIG. 18A, but embodiments of the present disclosure are not limited thereto. For example, the second vibrator 31B may be configured as two or more vibration devices. For example, the second vibrator 31B may be configured to output a sound at about 2 kHz to about 20 kHz, but embodiments of the present disclosure are not limited thereto. For example, the second vibrator 31B may be configured to output a sound at about 150 Hz to about 20 kHz. For example, the second vibrator 31B configured to vibrate at least one or more of the first to third pillar interior materials 32B1, 32B2, and 32B3 may have the same sound output characteristic or different sound output characteristics.

With reference to FIGS. 22, 26, and 27, the third vibrator 31C and a 3-1$^{st}$ vibrator 31C1 according to an example embodiment of the present disclosure may be disposed between the roof interior material 32C and a roof panel and may be configured to indirectly or directly vibrate the pillar interior material 32C to output a sound. For example, the third vibrator 31C and the 3-1$^{st}$ vibrator 31C1 may include a vibration device 130 described above with reference to FIGS. 3A to 6 and 18A to 21B, and thus, the repetitive description thereof may be omitted. For example, the third vibrator 31C may be configured as a vibration device where a sound of the high-pitched sound band is further enhanced in a direction closer to position of an object, receiving a sound source or a sound, or a position of an ear of a driver and/or an occupant (or a passenger) in the vehicular apparatus. For example, a vibration device may be configured so that a fraction (or a size) of a second vibration portion is greater than a fraction (or a size) of a first vibration portion. For example, the third vibrator 31C may be configured with a vibration device where a sound of the high-pitched sound band is further enhanced. For example, the third vibrator 31C may be arranged in the order of the second vibration device 130-2, the first vibration device 130-1, the sixth vibration device 130-6, and the fifth vibration device 130-5 along a first direction X (or from the left to the right in the drawing) in FIG. 18A, but embodiments of the present disclosure are not limited thereto. For example, the third vibrator 31C may be configured as two or more vibration devices. For example, the third vibrator 31C may be configured as a vibrator that is the same or substantially the same as the second vibrator 31B, but embodiments of the present disclosure are not limited thereto. For example, the 3-1$^{st}$ vibrator 31C1 may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the 3-1$^{st}$ vibrator 31C1 may be configured with a vibration device where a sound of the low-pitched sound band is further enhanced. For example, the 3-1$^{st}$ vibrator 31C1 may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the 3-1$^{st}$ vibrator 31C1 may be configured as two or more vibration devices. For example, the 3-1$^{st}$ vibrator 31C1 may be configured as a vibrator that is the same or substantially the same as the first vibrator 31A, but embodiments of the present disclosure are not limited thereto. For example, the third vibrator 31C and the 3-1$^{st}$ vibrator 31C1 may be referred to as a term such as a roof speaker or a third speaker, or the like, but embodiments of the present disclosure are not limited thereto.

According to an example embodiment of the present disclosure, at least one or more of the roof panel and the roof interior material 32C covering the roof panel may include a first region to a seventh region. For example, at least one or more of the roof panel and the roof interior material 32C covering the roof panel may include the first region corresponding to the driver seat DS, the second region corresponding to the passenger seat FPS, a third region corresponding to a region between the driver seat DS and the passenger seat FPS, a fourth region corresponding to a first rear seat BS1 behind the driver seat DS, a fifth region corresponding to a second rear seat BS2 behind the passenger seat FPS, a sixth region corresponding to a region between the first rear seat BS1 and the second rear seat BS2, and a seventh region between the third region and the sixth region. For example, the third vibrator 31C and the 3-1$^{st}$ vibrator 31C1 may be configured to vibrate at least one or more among the first to seventh regions of the roof interior material 32C. For example, the third vibrator 31C and the 3-1$^{st}$ vibrator 31C1 may be configured to output a sound of about 150 Hz to about 20 kHz. For example, the third vibrator 31C and the 3-1$^{st}$ vibrator 31C1 configured to vibrate at least one or more among the first to seventh regions of the roof interior material 32C may have the same sound output characteristic or different sound output characteristics. For example, the third vibrator 31C and the 3-1$^{st}$ vibrator 31C1 configured to vibrate each of the first to seventh regions of the roof interior material 32C may have the same sound output characteristic or different sound output characteristics. For example, at least one or more of the third vibrator 31C and the 3-1$^{st}$ vibrator 31C1 configured to vibrate at least one or more among the first to seventh regions of the roof interior material 32C may be configured to output a sound of about 2 kHz to about 20 kHz, and the other vibrator may be configured to output a sound at about 150 Hz to about 20 kHz. For example, at least one or more of the third vibrator 31C and the 3-1$^{st}$ vibrator 31C1 configured to vibrate each of the first to seventh regions of the roof interior material 32C may be configured to output a sound of about 2 kHz to about 20 kHz, and the other vibrator may be configured to output a sound at about 150 Hz to about 20 kHz.

With reference to FIGS. 22 to 25, the fourth vibrator 31D and a 4-1$^{st}$ vibrator 31D1 according to an example embodiment of the present disclosure may be disposed between the door frame 33 and the door interior material 32D and may be configured to indirectly or directly vibrate the door interior material 32D to output a sound. For example, the fourth vibrator 31D and the 4-1$^{st}$ vibrator 31D1 may include a vibration device 130 described above with reference to FIGS. 3A to 6 and 18A to 21B, and thus, the repetitive description thereof may be omitted. For example, the fourth vibrator 31D may be configured as a vibration device where a sound of the high-pitched sound band is further enhanced in a direction closer to position of an object, receiving a sound source or a sound, or a position of an ear of a driver and/or an occupant (or a passenger) in a vehicular apparatus. For example, a vibration device may be configured so that a fraction (or a size) of a second vibration portion is greater than a fraction (or a size) of a first vibration portion. For example, the fourth vibrator 31D may be configured with a vibration device where a sound of the high-pitched sound band is further enhanced. For example, the fourth vibrator 31D may be arranged in the order of the second vibration device 130-2, the first vibration device 130-1, the sixth vibration device 130-6, and the fifth vibration device 130-5 along a first direction X (or from the left to the right in the drawing) in FIG. 18A, but embodiments of the present disclosure are not limited thereto. For example, the fourth vibrator 31D may be configured as two or more vibration devices. For example, the fourth vibrator 31D may be configured as a vibrator that is the same or substantially the same as at least one or more of the second vibrator 31B and the third vibrator 31C, but embodiments of the present disclosure are not limited thereto. For example, the 4-1$^{st}$ vibrator 31D1 may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the 4-1$^{st}$ vibrator 31D1 may be configured with a vibration device where a sound of the low-pitched sound band is further enhanced. For example, the 4-1$^{st}$ vibrator 31D1 may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the 4-1$^{st}$ vibrator 31D1 may be configured as two or more vibration devices. For example, the 4-1$^{st}$ vibrator 31D1 may be configured as a vibrator that is the same or substantially the same as at least one or more of the first vibrator 31A and the 3-1$^{st}$ vibrator 31C1, but embodiments of the present disclosure are not limited thereto. For example, the fourth vibrator 31D and the 4-1$^{st}$ vibrator 31D1 may be referred to as a term such as a door speaker or a fourth speaker, or the like, but embodiments of the present disclosure are not limited thereto.

According to an example embodiment of the present disclosure, at least one or more of the door frame and the door interior material 32D may include an upper region, a middle region, and a lower region with respect to a height direction Z. For example, the fourth vibrator 31D and the 4-$1^{st}$ vibrator 31D1 may be disposed at at least one or more among an upper region, a middle region, and a lower region between the door frame and the door interior material 32D, and thus, may vibrate at least one or more among an upper region, a middle region, and a lower region of the door interior material 32D.

According to an example embodiment of the present disclosure, the upper region of the door interior material 32D may include a curved portion having a relatively small curvature radius. As described above with reference to FIGS. 3A to 6 and 18A to 21B, the fourth vibrator 31D and the 4-$1^{st}$ vibrator 31D1 for vibrating the upper region of the door interior material 32D may be bent in an equiangular shape based on a shape (or a surface shape) of the curved portion of the upper region of the door interior material 32D by a second portion 131*b* and 132*b* having flexibility of the vibration device 130.

According to an example embodiment of the present disclosure, the door frame may include a first door frame (or a left front door frame), a second door frame (or a right front door frame), a third door frame (or a left rear door frame), and a fourth door frame (or a right rear door frame). According to an example embodiment of the present disclosure, the door interior material 32D may include a first door interior material (or a left front door interior material) 32D1 covering the first door frame, a second door interior material (or a right front door interior material) 32D2 covering the second door frame, a third door interior material (or a left rear door interior material) 32D3 covering the third door frame, and a fourth door interior material (or a right rear door interior material) 32D4 covering the fourth door frame. For example, the fourth vibrator 31D and the 4-$1^{st}$ vibrator 31D1 may be disposed at at least one or more among an upper region, a middle region, and a lower region between each of the first to fourth door frames and the first to fourth door interior materials 32D1 to 32D4 and may vibrate at least one or more among an upper region, a middle region, and a lower region of each of the first to fourth door interior materials 32D1 to 32D4.

According to an example embodiment of the present disclosure, the fourth vibrator 31D and the 4-$1^{st}$ vibrator 31D1 configured to vibrate the upper region of each of the first to fourth door interior materials 32D1 to 32D4 may be configured to output a sound of about 2 kHz to about 20 kHz, or may be configured to output a sound of about 150 Hz to about 20 kHz. For example, the fourth vibrator 31D and the 4-$1^{st}$ vibrator 31D1 configured to vibrate the upper regions of at least one or more among the first to fourth door interior materials 32D1 to 32D4 may be configured to output a sound of about 2 kHz to about 20 kHz, or may be configured to output a sound of about 150 Hz to about 20 kHz.

According to an example embodiment of the present disclosure, the fourth vibrator 31D and the 4-$1^{st}$ vibrator 31D1 configured to vibrate the middle regions or/and the lower regions of at least one or more among the first to fourth door interior materials 32D1 to 32D4 may be configured to output a sound of about 150 Hz to about 20 kHz. For example, the fourth vibrator 31D and the 4-$1^{st}$ vibrator 31D1 configured to vibrate the middle region or/and the lower region of each of the first to fourth door interior materials 32D1 to 32D4 may be configured to output a sound of about 150 Hz to about 20 kHz. For example, the fourth vibrator 31D and the 4-$1^{st}$ vibrator 31D1 configured to vibrate the middle regions or/and the lower regions of at least one or more among the first to fourth door interior materials 32D1 to 32D4 may be one or more of a woofer, a mid-woofer, and a sub-woofer, but embodiments of the present disclosure are not limited thereto. For example, the fourth vibrator 31D and the 4-$1^{st}$ vibrator 31D1 configured to vibrate the middle region or/and the lower region of each of the first to fourth door interior materials 32D1 to 32D4 may be referred to as a term such as one or more of a woofer, a mid-woofer, and a sub-woofer, but embodiments of the present disclosure are not limited thereto.

Sounds, which are respectively output from the fourth vibrator 31D and the 4-$1^{st}$ vibrator 31D1 disposed at the first door interior material 32D1 and the fourth vibrator 31D and the 4-$1^{st}$ vibrator 31D1 disposed at the second door interior material 32D2, may be combined and output. For example, sounds, which are output from at least one or more of the fourth vibrator 31D and the 4-$1^{st}$ vibrator 31D1 disposed at the first door interior material 32D1 and the fourth vibrator 31D and the 4-$1^{st}$ vibrator 31D1 disposed at the second door interior material 32D2, may be combined and output. Further, a sound output from the fourth vibrator 31D and the 4-$1^{st}$ vibrator 31D1 disposed at the third door interior material 32D3 and a sound output from the fourth vibrator 31D and the 4-$1^{st}$ vibrator 31D1 disposed at the fourth door interior material 32D4 may be combined and output.

According to an example embodiment of the present disclosure, an upper region of each of the first to fourth door interior materials 32D1 to 32D4 may include a first upper region adjacent to the dashboard 32A, a second upper region adjacent to the rear seats BS1, BS2, and BS3, and a third upper region between the first upper region and the second upper region. For example, the fourth vibrator 31D and the 4-$1^{st}$ vibrator 31D1 may be disposed at one or more among the first to third upper regions of each of the first to fourth door interior materials 32D1 to 32D4. For example, the fourth vibrator 31D and the 4-$1^{st}$ vibrator 31D1 may be disposed at the first upper region of each of the first and second door interior materials 32D1 and 32D2 and may be disposed at one or more among the second and third upper regions of each of the first and second door interior materials 32D1 and 32D2. For example, the fourth vibrator 31D and the 4-$1^{st}$ vibrator 31D1 may be disposed at one or more among the first to third upper regions of one or more among the first to fourth door interior materials 32D1 to 32D4. For example, the fourth vibrator 31D and the 4-$1^{st}$ vibrator 31D1 configured to vibrate the first upper regions of one or more among the first and second door interior materials 32D1 and 32D2 may be configured to output a sound of about 2 kHz to about 20 kHz, and the fourth vibrator 31D and the 4-$1^{st}$ vibrator 31D1 configured to vibrate one or more among the second and third upper regions of each of the first and second door interior materials 32D1 and 32D2 may be configured to output a sound of about 2 kHz to about 20 kHz, or may be configured to output a sound of about 150 Hz to about 20 kHz. For example, the fourth vibrator 31D and the 4-$1^{st}$ vibrator 31D1 configured to vibrate one or more among the second and third upper regions of one or more among the first and second door interior materials 32D1 and 32D2 may be configured to output a sound of about 2 kHz to about 20 kHz, or may be configured to output a sound of about 150 Hz to about 20 kHz.

With reference to FIGS. 22, 24, and 27, the fifth vibrator 31E according to an example embodiment of the present disclosure may be disposed between a seat frame and the seat interior material 32E and may be configured to indirectly or directly vibrate the seat interior material 32E to output a sound. For example, the fifth vibrator 31E may include a vibration device 130 described above with reference to FIGS. 3A to 6 and 18A to 21B, and thus, the repetitive description thereof may be omitted. For example, the fifth vibrator 31E may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the fifth vibrator 31E may be configured with a vibration device where a sound of the low-pitched sound band is further enhanced. For example, the fifth vibrator 31E may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the fifth vibrator 31E may be configured as two or more vibration devices. For example, the fifth vibrator 31E may be configured as a vibrator that is the same or substantially the same as at least one or more of the first vibrator 31A, the 3-$1^{st}$ vibrator 31C1, and the 4-$1^{st}$ vibrator 31D1, but embodiments of the present disclosure are not limited thereto. For example, the fifth vibrator 31E may be referred to as a term such as a sheet speaker, a headrest speaker, or a fifth speaker, or the like, but embodiments of the present disclosure are not limited thereto.

According to an example embodiment of the present disclosure, the seat frame may include a first seat frame (or a driver seat frame), a second seat frame (or a passenger seat frame), a third seat frame (or a first rear seat frame), a fourth seat frame (or a second rear seat frame), and a fifth seat frame (or a third rear seat frame). According to an example embodiment of the present disclosure, the seat interior material 32E may include a first seat interior material surrounding the first seat frame, a second seat interior material surrounding the second seat frame, a third seat interior material surrounding the third seat frame, a fourth seat interior material surrounding the fourth seat frame, and a fifth seat interior material surrounding the fifth seat frame.

According to an example embodiment of the present disclosure, at least one or more among the first to fifth seat frames may include a seat bottom frame, a seat back frame, and a headrest frame. The seat interior material 32E may include a seat bottom interior material 32E1 surrounding the seat bottom frame, a seat back interior material 32E2 surrounding the seat back frame, and a headrest interior material 32E3 surrounding the headrest frame. At least one or more among the seat bottom interior material 32E1, the seat back interior material 32E2, and the headrest interior material 32E3 may include a seat inner interior material and a seat outer interior material. The seat inner interior material may include a foam layer. The seat outer interior material may include a surface layer including a fiber or leather. The outer seat interior material may further include a base layer including a plastic material which supports the surface layer.

According to an example embodiment of the present disclosure, the fifth vibrator 31E may be disposed at at least one or more among a region between the seat back frame and the seat back interior material 32E2 and a region between the headrest frame and the headrest interior material 32E3, and thus, may vibrate at least one or more among the seat outer interior material of the seat back interior material 32E2 and the seat outer interior material of the headrest interior material 32E3.

According to an example embodiment of the present disclosure, the fifth vibrator 31E disposed at at least one or more of the driver seat DS and the passenger seat FPS may be disposed at at least one or more among the region between the seat back frame and the seat back interior material 32E2 and the region between the headrest frame and the headrest interior material 32E3.

According to an example embodiment of the present disclosure, the fifth vibrator 31E disposed at at least one or more among the first to third rear seats BS1, BS2, and BS3 may be disposed between the headrest frame and the headrest interior material 32E3. For example, at least one or more among the first to third rear seats BS1, BS2, and BS3 may include at least one or more fifth vibrator 31E disposed between the headrest frame and the headrest interior material 32E3.

According to an example embodiment of the present disclosure, the fifth vibrator 31E vibrating the seat back interior materials 32E2 of at least one or more among the driver seat DS and the passenger seat FPS may be configured to output a sound of about 150 Hz to about 20 kHz.

According to an example embodiment of the present disclosure, the fifth vibrator 31E vibrating the headrest interior materials 32E3 of at least one or more among the driver seat DS, the passenger seat FPS, and the first to third rear seats BS1, BS2, and BS3 may be configured to output a sound of about 2 kHz to about 20 kHz, or may be configured to output a sound of about 150 Hz to about 20 kHz.

With reference to FIGS. 22 to 25, the sixth vibrator 31F according to an example embodiment of the present disclosure may be disposed between a handle frame and the handle interior material 32F and may be configured to indirectly or directly vibrate the handle interior material 32F to output a sound. For example, the sixth vibrator 31F may include a vibration device 130 described above with reference to FIGS. 3A to 6 and 18A to 21B, and thus, the repetitive description thereof may be omitted. For example, the sixth vibrator 31F may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the sixth vibrator 31F may be configured with a vibration device where a sound of the low-pitched sound band is further enhanced. For example, the sixth vibrator 31F may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the sixth vibrator 31F may be configured as two or more vibration devices. For example, the sixth vibrator 31F may be configured as a vibrator that is the same or substantially the same as at least one or more of the first vibrator 31A and the fifth vibrator 31E, but embodiments of the present disclosure are not limited thereto. For example, the sixth vibrator 31F may be referred to as a term such as a handle speaker, a steering speaker, or a sixth speaker, or the like, but embodiments of the present disclosure are not limited thereto.

According to an example embodiment of the present disclosure, the sixth vibrator 31F may be configured to indirectly or directly vibrate the handle interior material 32F to provide a driver with a sound. For example, a sound output by the sixth vibrator 31F may be a sound which is the same as or different from a sound output from each of the first to fifth vibrators 31A to 31E. For example, a sound output by the sixth vibrator 31F may be a sound which is the same as or different from sounds output from at least one or more among the first to fifth vibrators 31A to 31E. As an example embodiment of the present disclosure, the sixth vibrator 31F may output a sound which is to be provided to only the driver. In another embodiment of the present disclosure, the sound output by the sixth vibrator 31F and a sound output by each of the first to fifth vibrators 31A to 31E may be combined and output. For example, the sound output by the sixth vibrator 31F and the sound output by at least one or more among the first to fifth vibrators 31A to 31E may be combined and output.

With reference to FIGS. 22 and 23, the seventh vibrator 31G may be disposed between the floor panel and the floor interior material 32G and may be configured to indirectly or directly vibrate the floor internal material 32G to output a sound. The seventh vibrator 31G may be disposed between the floor interior material 32G and the floor panel disposed between the front seats DS and FPS and the third rear seat BS3. For example, the seventh vibrator 31G may include a vibration device 130 described above with reference to FIGS. 3A to 6 and 18A to 21B, and thus, the repetitive description thereof may be omitted. For example, the seventh vibrator 31G may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the seventh vibrator 31G may be configured with a vibration device where a sound of the low-pitched sound band is further enhanced. For example, the seventh vibrator 31G may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the seventh vibrator 31G may be configured as two or more vibration devices. For example, the seventh vibrator 31G may be configured as a vibrator that is the same or substantially the same as at least one or more of the first vibrator 31A, the fifth vibrator 31E, and the sixth vibrator 31F, but embodiments of the present disclosure are not limited thereto. For example, the seventh vibrator 31G may be configured to output a sound of about 150 Hz to about 20 kHz. For example, the seventh vibrator 31G may be referred to as a term such as a floor speaker, a bottom speaker, an under speaker, or a seventh speaker, or the like, but embodiments of the present disclosure are not limited thereto.

With reference to FIGS. 22 to 26, the vehicular apparatus according to an example embodiment of the present disclosure may further include a second vibration generating apparatus 30-2 which is disposed at the interior material 32 exposed at an indoor space. For example, the vehicular apparatus according to an example embodiment of the present disclosure may include only the second vibration generating apparatus 30-2 instead of the first vibration generating apparatus 30-1, or may include all of the first vibration generating apparatus 30-1 and the second vibration generating apparatus 30-2.

According to an example embodiment of the present disclosure, the interior material 32 may further include a rear view mirror 32H, an overhead console 32I, a rear package interior material 32J, a glove box 32K, and a sun visor 32L, or the like.

The second vibration generating apparatus 30-2 according to an example embodiment of the present disclosure may include one or more vibrators 31H to 31L which are disposed at at least one among the rear view mirror 32H, the overhead console 32I, the rear package interior material 32J, the glove box 32K, and the sun visor 32L. For example, the second vibration generating apparatus 30-2 may include at least one or more among eighth to twelfth vibrators 31H to 31L, and thus, may output sounds of one or more channels.

With reference to FIGS. 22 to 26, the eighth vibrator 31H may be disposed at the rear view mirror 32H and may be configured to indirectly or directly vibrate the rear view mirror 32H to output a sound. The eighth vibrator 31H may be disposed between a mirror housing connected to the main structure and the rear view mirror 32H supported by the mirror housing. For example, the eighth vibrator 31H may include a vibration device 130 described above with reference to FIGS. 3A to 6 and 18A to 21B, and thus, the repetitive description thereof may be omitted. For example, the eighth vibrator 31H may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the eighth vibrator 31H may be configured with a vibration device where a sound of the low-pitched sound band is further enhanced. For example, the eighth vibrator 31H may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the eighth vibrator 31H may be configured as two or more vibration devices. For example, the eighth vibrator 31H may be configured as a vibrator that is the same or substantially the same as at least one or more of the first vibrator 31A, the fifth vibrator 31E, the sixth vibrator 31F, and the seventh vibrator 31G, but embodiments of the present disclosure are not limited thereto. For example, the eighth vibrator 31H may be configured to output a sound of about 150 Hz to about 20 kHz. For example, the eighth vibrator 31H may be referred to as a term such as a mirror speaker or an eighth speaker, or the like, but embodiments of the present disclosure are not limited thereto.

With reference to FIGS. 23, 24, and 26, the ninth vibrator 31I may be disposed at the overhead console 32I and may be configured to indirectly or directly vibrate a console cover of the overhead console 32I to output a sound. According to an example embodiment of the present disclosure, the overhead console 32I may include a console box buried (or embedded) into the roof panel, a lighting device disposed at the console box, and a console cover covering the lighting device and the console box.

The ninth vibrator 31I may be disposed between the console box of the overhead console 32I and the console cover and may vibrate the console cover. For example, the ninth vibrator 31I may be disposed between the console box of the overhead console 32I and the console cover and may directly vibrate the console cover. For example, the ninth vibrator 31I may include a vibration device 130 described above with reference to FIGS. 3A to 6 and 18A to 21B, and thus, the repetitive description thereof may be omitted. For example, the ninth vibrator 31I may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the ninth vibrator 31I may be configured with a vibration device where a sound of the low-pitched sound band is further enhanced. For example, the ninth vibrator 31I may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the ninth vibrator 31I may be configured as two or more vibration devices. For example, the ninth vibrator 31I may be configured as a vibrator that is the same or substantially the same as at least one or more of the first vibrator 31A, the fifth vibrator 31E, the sixth vibrator 31F, the seventh vibrator 31G, and the eighth vibrator 31H, but embodiments of the present disclosure are not limited thereto. For example, the ninth vibrator 31I may be configured to output a sound of about 150 Hz to about 20 kHz. For example, the ninth vibrator 31I may be referred to as a term such as a console speaker, a lighting speaker, or a ninth speaker, or the like, but embodiments of the present disclosure are not limited thereto.

The vehicular apparatus according to thirteenth embodiment of the present disclosure may further include a center lighting box disposed at a center region of the roof interior material 32C, a center lighting device disposed at the center lighting box, and a center lighting cover covering the center lighting device. In this case, the ninth vibrator 31I may be further disposed between the center lighting box and the center lighting cover of the center lighting device and may additionally vibrate the center lighting cover.

With reference to FIGS. 22 and 23, the tenth vibrator 31J may be disposed at the rear package interior material 32J and may be configured to indirectly or directly vibrate the rear package interior material 32J to output a sound. The rear package interior material 32J may be disposed behind the first to third rear seats BS1, BS2, and BS3. For example, a portion of the rear package interior material 32J may be disposed under a rear glass window 34C.

The tenth vibrator 31J may be disposed at a rear surface of the rear package interior material 32J and may vibrate the rear package interior material 32J. For example, the tenth vibrator 31J may include a vibration device 130 described above with reference to FIGS. 3A to 6 and 18A to 21B, and thus, the repetitive description thereof may be omitted. For example, the tenth vibrator 31J may be configured as a vibration device where a sound of the high-pitched sound band is further enhanced in a direction closer to position of an object, receiving a sound source or a sound, or a position of an ear of a driver and/or an occupant (or a passenger) in a vehicular apparatus. For example, a vibration device may be configured so that a fraction (or a size) of a second vibration portion is greater than a fraction (or a size) of a first vibration portion. For example, the tenth vibrator 31J may be configured with a vibration device where a sound of the high-pitched sound band is further enhanced. For example, the tenth vibrator 31J may be arranged in the order of the second vibration device 130-2, the first vibration device 130-1, the sixth vibration device 130-6, and the fifth vibration device 130-5 along a first direction X (or from the left to the right in the drawing) in FIG. 18A, but embodiments of the present disclosure are not limited thereto. For example, the tenth vibrator 31J may be configured as two or more vibration devices. For example, the tenth vibrator 31J may be configured as a vibrator that is the same or substantially the same as at least one or more of the second vibrator 31B, the third vibrator 31C, and the fourth vibrator 31D, but embodiments of the present disclosure are not limited thereto. For example, the tenth vibrator 31J may be referred to as a term such as a rear speaker or a tenth speaker, or the like, but embodiments of the present disclosure are not limited thereto.

According to an example embodiment of the present disclosure, the rear package interior material 32J may include a first region corresponding to a rear portion of the first rear seat BS1, a second region corresponding to a rear portion of the second rear seat BS2, and a third region corresponding to a rear portion of the third passenger seat BS3. According to an example embodiment of the present disclosure, the tenth vibrator 31J may be disposed to vibrate at least one or more among the first to third regions of the rear package interior material 32J. For example, the tenth vibrator 31J may be disposed at each of the first and second regions of the rear package interior material 32J, or may be disposed at each of the first to third regions of the rear package interior material 32J. For example, the tenth vibrator 31J may be disposed at at least one or more among the first and second regions of the rear package interior material 32J, or may be disposed at at least one or more among the first to third regions of the rear package interior material 32J. For example, the tenth vibrator 31J may be configured to output a sound at about 150 Hz to about 20 kHz. For example, the tenth vibrator 31J configured to vibrate each of the first to third regions of the rear package interior material 32J may have the same sound output characteristic or different sound output characteristics. For example, the tenth vibrator 31J configured to vibrate at least one or more among the first to third regions of the rear package interior material 32J may have the same sound output characteristic or different sound output characteristics.

With reference to FIGS. 22 to 24, the eleventh vibrator 31K may be disposed at a glove box 32K and may be configured to indirectly or directly vibrate the glove box 32K to output a sound. The glove box 32K may be disposed at a dashboard 32A corresponding to a front portion of the passenger seat FPS.

The eleventh vibrator 31K may be disposed at an inner surface of the glove box 32K and may vibrate the glove box 32K. For example, the eleventh vibrator 31K may include a vibration device 130 described above with reference to FIGS. 3A to 6 and 18A to 21B, and thus, the repetitive description thereof may be omitted. For example, the eleventh vibrator 31K may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the eleventh vibrator 31K may be configured with a vibration device where a sound of the low-pitched sound band is further enhanced. For example, the eleventh vibrator 31K may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the eleventh vibrator 31K may be configured as two or more vibration devices. For example, the eleventh vibrator 31K may be configured as a vibrator that is the same or substantially the same as at least one or more of the first vibrator 31A, the fifth vibrator 31E, the sixth vibrator 31F, the seventh vibrator 31G, the eighth vibrator 31H, and the ninth vibrator 31I, but embodiments of the present disclosure are not limited thereto. For example, the eleventh vibrator 31K may be configured to output a sound of about 150 Hz to about 20 kHz, or may be one or more of a woofer, a mid-woofer, and a sub-woofer, but embodiments of the present disclosure are not limited thereto. For example, the eleventh vibrator 31K may be referred to as a term such as a glove box speaker or an eleventh speaker, or the like, but embodiments of the present disclosure are not limited thereto.

With reference to FIG. 24, the twelfth vibrator 31L may be disposed at the sun visor 32L and configured to indirectly or directly vibrate the sun visor 32L to output a sound. The sun visor 32L may include a first sun visor 32L1 corresponding to the driver seat DS and a second sun visor 32L2 corresponding to the passenger seat FPS.

The twelfth vibrator 31L may be disposed at at least one or more among the first sun visor 32L1 and the second sun visor 32L2 and may indirectly or directly vibrate at least one or more among the first sun visor 32L1 and the second sun visor 32L2. For example, the twelfth vibrator 31L may include a vibration device 130 described above with reference to FIGS. 3A to 6 and 18A to 21B, and thus, the repetitive description thereof may be omitted. For example, the twelfth vibrator 31L may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the twelfth vibrator 31L may be configured with a vibration device where a sound of the low-pitched sound band is further enhanced. For example, the twelfth vibrator 31L may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the twelfth vibrator 31L may be configured as two or more vibration devices. For example, the twelfth vibrator 31L may be configured as a vibrator that is the same or substantially the same as at least one or more of the first vibrator 31A, the fifth vibrator 31E, the sixth vibrator 31F, the seventh vibrator 31G, the eighth vibrator 31H, the ninth vibrator 31I, and the eleventh vibrator 31K, but embodiments of the present disclosure are not limited thereto. For example, the twelfth vibrator 31L may be configured to output a sound of about 150 Hz to about 20 kHz. For example, the twelfth vibrator 31L may be referred to as a term such as a sun visor speaker or a twelfth speaker, or the like, but embodiments of the present disclosure are not limited thereto.

According to an example embodiment of the present disclosure, at least one or more among the first sun visor 32L1 and the second sun visor 32L2 may further include a sun visor mirror. In this case, the twelfth vibrator 31L may be configured to indirectly or directly vibrate a sun visor mirror of at least one or more among the first sun visor 32L1 and the second sun visor 32L2. The twelfth vibrator 31L vibrating the sun visor mirror may include a vibration device 130 described above with reference to FIGS. 3A to 6 and 18A to 21B, and thus, the repetitive description thereof may be omitted.

With reference to FIGS. 22 to 26, the vehicular apparatus according to an example embodiment of the present disclosure may further include a third vibration generating apparatus 30-3 at the glass window 34. For example, the vehicular apparatus according to an example embodiment of the present disclosure may include the third vibration generating apparatus 30-3 instead of at least one or more of the first and second vibration generating apparatuses 30-1 and 30-2, or may include all of the first to third vibration generating apparatuses 30-1, 30-2, and 30-3.

The third vibration generating apparatus 30-3 may include at least one or more vibrators 31M to 31P disposed at the glass window 34. For example, the third vibration generating apparatus 30-3 may include at least one or more among thirteenth to sixteenth vibrators 31M to 31P, and thus, may output sounds of one or more channels. For example, the third vibration generating apparatus 30-3 may be referred to as a term such as a window speaker, a transparent sound generating apparatus, a transparent speaker, or an opaque speaker, or the like, but embodiments of the present disclosure are not limited thereto.

At least one or more among the thirteenth to sixteenth vibrators 31M to 31P according to an example embodiment of the present disclosure may be configured to indirectly or directly vibrate the glass window 34. For example, at least one or more among the thirteenth to sixteenth vibrators 31M to 31P may include one or more of the vibration device 130 described above with reference to FIGS. 3A to 6 and 18A to 21B, may be configured to be transparent, semitransparent, or opaque, and thus, the repetitive description thereof may be omitted.

According to an example embodiment of the present disclosure, the glass window 34 may include a front glass window 34A, a side glass window 34B, and a rear glass window 34C. According to an example embodiment of the present disclosure, the glass window 34 may further include a roof glass window 34D. For example, when the vehicular apparatus includes the roof glass window 34D, a portion of a region of the roof frame and the roof interior material 32C may be replaced with the roof glass window 34D. For example, when the vehicular apparatus includes the roof glass window 34D, the third vibrator 31C may be configured to indirectly or directly vibrate a periphery portion of the roof interior material 32C surrounding the roof glass window 34D.

With reference to FIGS. 22 to 24, the thirteenth vibrator 31M according to an example embodiment of the present disclosure may be disposed at the front glass window 34A and may be configured to output a sound by vibrating itself or may be configured to indirectly or directly vibrate the front glass window 34A to output a sound. For example, the thirteenth vibrator 31M may include a vibration device 130 described above with reference to FIGS. 3A to 6 and 18A to 21B, and thus, the repetitive description thereof may be omitted. For example, the thirteenth vibrator 31M may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the thirteenth vibrator 31M may be configured with a vibration device where a sound of the low-pitched sound band is further enhanced. For example, the thirteenth vibrator 31M may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the thirteenth vibrator 31M may be configured as two or more vibration devices. For example, the thirteenth vibrator 31M may be configured as a vibrator that is the same or substantially the same as at least one or more of the first vibrator 31A, the fifth vibrator 31E, the sixth vibrator 31F, the seventh vibrator 31G, the eighth vibrator 31H, the ninth vibrator 31I, and the eleventh vibrator 31K, but embodiments of the present disclosure are not limited thereto. For example, the thirteenth vibrator 31M may be configured to be transparent, semitransparent, or opaque.

According to an example embodiment of the present disclosure, the front glass window 34A may include a first region corresponding to the driver seat DS, a second region corresponding to the passenger seat FPS, and a third region (or a middle region) between the first region and the second region. For example, the thirteenth vibrator 31M may be disposed at at least one or more among the first to third regions of the front glass window 34A. For example, the thirteenth vibrator 31M may be disposed at each of the first and second regions of the front glass window 34A, or may be disposed at each of the first to third regions of the front glass window 34A. For example, the thirteenth vibrator 31M may be disposed at at least one or more among the first and second regions of the front glass window 34A, or may be disposed at at least one or more among the first to third regions of the front glass window 34A. For example, the thirteenth vibrator 31M disposed in each of the first to third regions of the front glass window 34A may have the same sound output characteristic or different sound output characteristics. For example, the thirteenth vibrator 31M disposed at at least one or more among the first to third regions of the front glass window 34A may have the same sound output characteristic or different sound output characteristics. For example, the thirteenth vibrator 31M may be configured to output a sound of about 150 Hz to about 20 kHz. For example, the thirteenth vibrator 31M may be referred to as a term such as a front window speaker or a thirteenth speaker, or the like, but embodiments of the present disclosure are not limited thereto.

With reference to FIGS. 23 to 25 and 27, the fourteenth vibrator 31N according to an example embodiment of the present disclosure may be disposed at the side glass window 34B and may be configured to output a sound by vibrating itself or may be configured to indirectly or directly vibrate the side glass window 34B to output a sound.

According to an example embodiment of the present disclosure, the side glass window 34B may include a first side glass window (or a left front window) 34B1, a second side glass window (or a right front window) 34B2, a third side glass window (or a left rear window) 34B3, and a fourth side glass window (or a right rear window) 34B4.

According to an example embodiment of the present disclosure, the fourteenth vibrator 31N may be disposed at at least one or more among the first to fourth side glass windows 34B1 to 34B4. For example, at least one or more among the first to fourth side glass windows 34B1 to 34B4 may include at least one or more fourteenth vibrators 31N.

According to an example embodiment of the present disclosure, the fourteenth vibrator 31N may be disposed at at least one or more among the first to fourth side glass windows 34B1 to 34B4 and may be configured to output a sound by vibrating itself or may be configured to indirectly or directly vibrate a corresponding side glass window to output the sound. For example, the fourteenth vibrator 31N may include a vibration device 130 described above with reference to FIGS. 3A to 6 and 18A to 21B, and thus, the repetitive description thereof may be omitted. For example, the fourteenth vibrator 31N may be configured as a vibration device where a sound of the high-pitched sound band is further enhanced in a direction closer to position of an object, receiving a sound source or a sound, or a position of an ear of a driver and/or an occupant (or a passenger) in a vehicular apparatus. For example, a vibration device may be configured so that a fraction (or a size) of a second vibration portion is greater than a fraction (or a size) of a first vibration portion. For example, the fourteenth vibrator 31N may be configured with a vibration device where a sound of the high-pitched sound band is further enhanced. For example, the fourteenth vibrator 31N may be arranged in the order of the second vibration device 130-2, the first vibration device 130-1, the sixth vibration device 130-6, and the fifth vibration device 130-5 along a first direction X (or from the left to the right in the drawing) in FIG. 18A, but embodiments of the present disclosure are not limited thereto. For example, the fourteenth vibrator 31N may be configured as two or more vibration devices. For example, the fourteenth vibrator 31N may be configured as a vibrator that is the same or substantially the same as at least one or more of the second vibrator 31B, the third vibrator 31C, the fourth vibrator 31D, and the tenth vibrator 31J, but embodiments of the present disclosure are not limited thereto. For example, the fourteenth vibrator 31N may be configured to be transparent, semitransparent, or opaque. For example, the fourteenth vibrator 31N may be configured to output a sound of about 150 Hz to about 20 kHz. For example, the fourteenth vibrator 31N disposed at at least one or more among the first to fourth side glass windows 34B1 to 34B4 may have the same sound output characteristic or different sound output characteristics. For example, the fourteenth vibrator 31N may be a side window speaker or a fourteenth speaker, or the like, but embodiments of the present disclosure are not limited thereto.

With reference to FIG. 22, the fifteenth vibrator 31O according to an example embodiment of the present disclosure may be disposed at the rear glass window 34C and may be configured to output a sound by vibrating itself or may be configured to indirectly or directly vibrate the rear glass window 34C to output a sound.

According to an example embodiment of the present disclosure, the rear glass window 34C may include a first region corresponding to a rear portion of the first rear seat BS1, a second region corresponding to a rear portion of the second rear seat BS2, and a third region corresponding to a rear portion of the third rear seat BS3. According to an example embodiment of the present disclosure, the fifteenth vibrator 31O may be disposed at each of first to third regions of the rear glass window 34C. For example, the fifteenth vibrator 31O may be disposed at at least one or more among the first to third regions of the rear glass window 34C. For example, the fifteenth vibrator 31O may be disposed at each of the first and second regions of the rear glass window 34C, or may be disposed at each of the first to third regions of the rear glass window 34C. For example, the fifteenth vibrator 31O may be disposed at at least one or more among the first and second regions of the rear glass window 34C, or may be disposed at at least one or more among the first to third regions of the rear glass window 34C. For example, the fifteenth vibrator 31O may include a vibration device 130 described above with reference to FIGS. 3A to 6 and 18A to 21B, and thus, the repetitive description thereof may be omitted. For example, the fifteenth vibrator 31O may be configured as a vibration device where a sound of the low-pitched sound band is further enhanced in a direction distancing from a position of an object, receiving a sound source or a sound, or a position of an ear of a driver and/or an occupant (or a passenger) in a vehicular apparatus. For example, a vibration device may be configured so that a fraction (or a size) of a first vibration portion is greater than a fraction (or a size) of a second vibration portion. For example, the fifteenth vibrator 31O may be configured with a vibration device where a sound of the low-pitched sound band is further enhanced. For example, the fifteenth vibrator 31O may be arranged in the order of the sixth vibration device 130-6, the fifth vibration device 130-5, the first vibration device 130-1, and the second vibration device 130-2 along a first direction X (or from the left to the right in the drawing) in FIG. 18A, but embodiments of the present disclosure are not limited thereto. For example, the fifteenth vibrator 31O may be configured as two or more vibration devices. For example, the fifteenth vibrator 31O may be configured as a vibrator that is the same or substantially the same as at least one or more of the first vibrator 31A, the fifth vibrator 31E, the sixth vibrator 31F, the seventh vibrator 31G, the eighth vibrator 31H, the ninth vibrator 31I, the eleventh vibrator 31K, and the thirteenth vibrator 31M, but embodiments of the present disclosure are not limited thereto. For example, the fifteenth vibrator 31O may be configured to be transparent, semitransparent, or opaque. For example, the fifteenth vibrator 31O may be configured to output a sound of about 150 Hz to about 20 kHz. For example, the fifteenth vibrator 31O disposed at each of the first to third regions of the rear glass window 34C may have the same sound output characteristic or different sound output characteristics. For example, the fifteenth vibrator 31O disposed at at least one or more among the first to third regions of the rear glass window 34C may have the same sound output characteristic or different sound output characteristics. For example, the fifteenth vibrator 31O disposed at at least one or more among the first to third regions of the rear glass window 34C may be configured to output a sound of about 150 Hz to about 20 kHz, or may be one or more of a woofer, a mid-woofer, and a sub-woofer, or the like, but embodiments of the present disclosure are not limited thereto. For example, the fifteenth vibrator 31O may be referred to as a term such as a rear window speaker or a fifteenth speaker, or the like, but embodiments of the present disclosure are not limited thereto.

With reference to FIG. 27, the sixteenth vibrator 31P according to an example embodiment of the present disclosure may be disposed at the roof glass window 34D and may output a sound by vibrating itself or may be configured to indirectly or directly vibrate the roof glass window 34D to output a sound.

The roof glass window 34D according to an example embodiment of the present disclosure may be disposed over the front seats DS and FPS. For example, the sixteenth vibrator 31P may be disposed at a middle region of the roof glass window 34D. For example, the sixteenth vibrator 31P may include a vibration device 130 described above with reference to FIGS. 3A to 6 and 18A to 21B, and thus, the repetitive description thereof may be omitted. For example, the sixteenth vibrator 31P may be configured as a vibration device where a sound of the high-pitched sound band is further enhanced in a direction closer to position of an object, receiving a sound source or a sound, or a position of an ear of a driver and/or an occupant (or a passenger) in a vehicular apparatus. For example, a vibration device may be configured so that a fraction (or a size) of a second vibration portion is greater than a fraction (or a size) of a first vibration portion. For example, the sixteenth vibrator 31P may be configured with a vibration device where a sound of the high-pitched sound band is further enhanced. For example, the sixteenth vibrator 31P may be arranged in the order of the second vibration device 130-2, the first vibration device 130-1, the sixth vibration device 130-6, and the fifth vibration device 130-5 along a first direction X (or from the left to the right in the drawing) in FIG. 18A, but embodiments of the present disclosure are not limited thereto. For example, the sixteenth vibrator 31P may be configured as two or more vibration devices. For example, the sixteenth vibrator 31P may be configured as a vibrator that is the same or substantially the same as at least one or more of the second vibrator 31B, the third vibrator 31C, the fourth vibrator 31D, the tenth vibrator 31J, and the fourteenth vibrator 31N, but embodiments of the present disclosure are not limited thereto. For example, the sixteenth vibrator 31P may be configured to be transparent, semitransparent, or opaque. For example, the sixteenth vibrator 31P may be configured to output a sound of about 150 Hz to about 20 kHz. For example, the sixteenth vibrator 31P may be referred to as a term such as a roof window speaker or a sixteenth speaker, or the like, but embodiments of the present disclosure are not limited thereto.

The roof glass window 34D according to another example embodiment of the present disclosure may be disposed over the front seats DS and FPS or may be disposed over the front seats DS and FPS and the rear seats BS1, BS2, and BS3. For example, the roof glass window 34D may include a first region corresponding to the front seats DS and FPS and a second region corresponding to the rear seats BS1, BS2, and BS3. Further, the roof glass window 34D may include a third region between the first region and the second region. For example, the sixteenth vibrator 31P may be disposed at at least one or more among the first and second regions of the roof glass window 34D or may be disposed at at least one or more among the first to third regions of the roof glass window 34D. For example, the sixteenth vibrator 31P may be configured to output a sound of about 150 Hz to about 20 kHz. For example, the sixteenth vibrator 31P disposed at at least one or more among the first to third regions of the roof glass window 34D may have the same sound output characteristic or different sound output characteristics.

With reference to FIGS. 22 to 25, the vehicular apparatus according to an example embodiment of the present disclosure may further include a woofer speaker WS which is disposed at at least one or more among a dashboard 32A, a door frame 33, and a rear package interior material 32J.

The woofer speaker WS according to an example embodiment of the present disclosure may include at least one or more among a woofer, a mid-woofer, and a sub-woofer. For example, the woofer speaker WS may be referred to as a term such as a speaker or the like which outputs a sound of about 60 Hz to about 150 Hz, but embodiments of the present disclosure are not limited thereto. Therefore, the woofer speaker WS may output a sound of about 60 Hz to about 150 Hz, and thus, may enhance a low-pitched sound band characteristic of a sound which is output to an indoor space.

According to an example embodiment of the present disclosure, the woofer speaker WS may be disposed at at least one or more among first and second regions of the dashboard 32A. According to an example embodiment of the present disclosure, the woofer speaker WS may be disposed at each of first to fourth door frames of the door frame 33 and may be exposed at a lower region of each of the first to fourth door interior materials 32D1 to 32D4 of the door interior material 32D. For example, the woofer speaker WS may be disposed at at least one or more among the first to fourth door frames of the door frame 33 and may be exposed at the lower regions of at least one or more among the first to fourth door interior materials 32D1 to 32D4 of the door interior material 32D. According to another example embodiment of the present disclosure, the woofer speaker WS may be disposed at at least one or more among the first and second regions of the rear package interior material 32J. For example, the fourth vibrator 31D disposed at the lower region of each of the first to fourth door interior materials 32D1 to 32D4 may be replaced by the woofer speaker WS. For example, the fourth vibrator 31D disposed at the lower regions of at least one or more among the first to fourth door interior materials 32D1 to 32D4 may be replaced by the woofer speaker WS.

With reference to FIGS. 22 to 24, the vehicular apparatus according to an example embodiment of the present disclosure may further include an instrument panel apparatus 160 and an infotainment apparatus 170.

The instrument panel apparatus 160 according to an example embodiment of the present disclosure may be disposed in a first region of the dashboard 32A to face the driver seat DS. The instrument panel apparatus 160 may include a display (or a first display) 161 which is disposed in the first region of the dashboard 32A to face the driver seat DS.

The first display 161 may include any one of the apparatus described above with reference to FIGS. 1, 2, and 9, and thus, the repetitive description thereof may be omitted. For example, the instrument panel apparatus 160 may output a sound, generated by a vibration of a vibration member (or a display panel) based on a vibration of one or more vibration generating apparatus 30 included in the first display 161, toward the driver seat DS. For example, the vibration generating apparatus 30 disposed in the first display 161 of the instrument panel apparatus 160 may be configured to output a sound of about 150 Hz to about 20 kHz.

The infotainment apparatus 170 may be disposed at a third region of the dashboard 32A.

The infotainment apparatus 170 according to an example embodiment of the present disclosure may be fixed at the third region of the dashboard 32A in an upright state.

According to another example embodiment of the present disclosure, the infotainment apparatus 170 may be installed to be raised and lowered at the third region of the dashboard 32A. For example, the infotainment apparatus 170 may be received or accommodated into the dashboard 32A based on the power turn-off of the vehicular apparatus or the manipulation of a vehicle passenger and may protrude to a region on the dashboard 32A based on the power turn-on of the vehicular apparatus or the manipulation of the vehicle passenger.

The infotainment apparatus 170 according to an example embodiment of the present disclosure may include a display (or a second display) 171 disposed at the third region of the dashboard 32A, and a display elevation device.

The second display 171 may include any one of the apparatus described above with reference to FIGS. 1, 2, and 9, and thus, the repetitive description thereof may be omitted. For example, the infotainment apparatus 170 may output a sound, generated by a vibration of a vibration member (or a display panel) based on a vibration of one or more vibration generating apparatuses 30 included in the second display 171 toward the driver seat DS. For example, the one or more vibration generating apparatuses 30 disposed at the second display 171 of the infotainment apparatus 170 may be configured to output a sound of about 150 Hz to about 20 kHz.

The display elevation device may be disposed into the third region of the dashboard 32A and may support the second display 171 so as to be raised and lowered. For example, the display elevation device may raise the second display 171 based on the power turn-on of the vehicular apparatus or the manipulation of the vehicle passenger, thereby allowing the second display 171 to protrude to a region on the dashboard 32A. Further, the display elevation device may lower the second display 171 based on the power turn-off of the vehicular apparatus or the manipulation of the vehicle passenger, thereby allowing the second display 171 to be received or accommodated into the dashboard 32A.

The vehicular apparatus according to thirteenth embodiment of the present disclosure may output a sound to one or more of the indoor space and the outdoor space through at least one or more among the first vibration generating apparatus 30-1 disposed between the main structure and the interior material 32, and the second vibration generating apparatus 30-2 disposed at the interior material 32 exposed at the indoor space, the third vibration generating apparatus 30-3 disposed at the glass window 34, and thus, may output the sound by one or more of the exterior material and the interior material 32 as a sound vibration plate, thereby outputting sounds of one or more channels and/or a multichannel surround stereo sound. Further, the vehicular apparatus according to an example embodiment of the present disclosure may output a sound by, as a sound vibration plate, a display panel of at least one or more among the displays 161 and 171 of at least one or more among the instrument panel apparatus 160 and the infotainment apparatus 170 and may output a more realistic multi-channel sound and/or multi-channel surround stereo sound through each of the first to third vibration generating apparatuses 30-1, 30-2, and 30-3, the instrument panel apparatus 160, and the infotainment apparatus 170.

Figure 28:
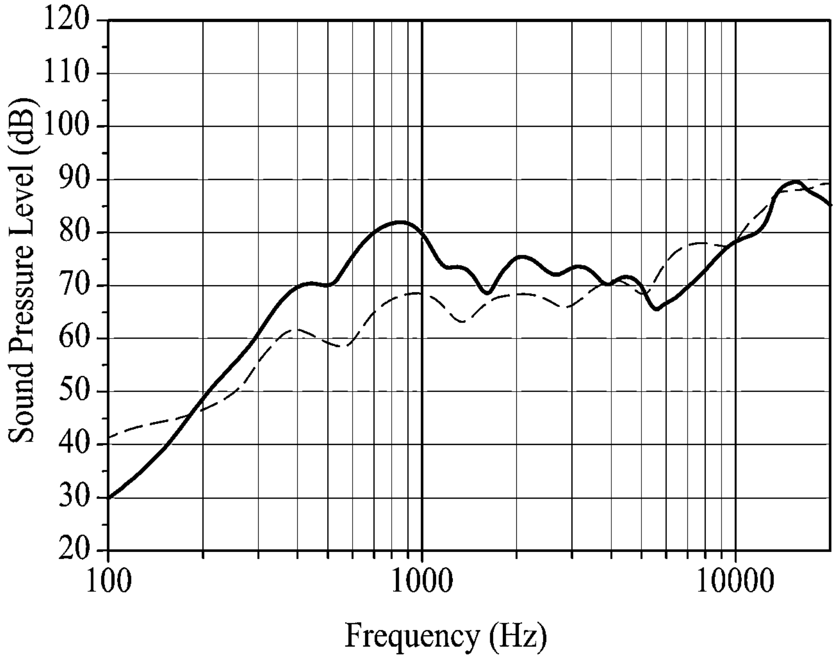
FIG. 28 illustrates a sound output characteristic of an apparatus according to an example embodiment of the present disclosure.

FIG. 28 illustrates a sound output characteristic of an apparatus according to an example embodiment of the present disclosure.

A sound output characteristic may be measured by a sound measuring equipment. The sound analysis apparatus may be configured to include a sound card that may transmit or receive sound to or from a control personal computer (PC), an amplifier that may amplify a signal generated from the sound card and transfer the amplified signal to a vibration device, and a microphone that may collect sound generated by an apparatus based on driving of the vibration device. For example, a microphone may be disposed at a center of a vibration device, and a distance between a display panel and the microphone may be 30 cm. A sound may be measured in state where the microphone is vertical to a vibration device. The sound collected through the microphone may be input to the control PC through the sound card, and a control program may check the input sound to analyze the sound output characteristic of the apparatus. For example, a frequency response characteristic of a frequency range of 20 Hz to 20 kHz may be measured by a pulse program. A frequency response characteristic may be measured by applying ⅓ octave smoothing in sine sweep at a frequency of 0.15 kHz to 20 kHz. The electrode portion of the vibration device was configured with silver (Ag).

In FIG. 28, the abscissa axis represents a frequency in hertz (Hz), and the ordinate axis represents a sound pressure level (SPL) in decibels (dB). A dotted line of FIG. 28 represents a sound output characteristic when a first vibration portion having a single crystal is provided, and a solid line represents a sound output characteristic when a second vibration portion having a poly-crystal is provided.

With reference to FIG. 28, comparing with the poly-crystal represented by the solid line, in the single crystal represented by the dotted line, it may be seen that a sound pressure level increases in 1 kHz or less. For example, comparing with the poly-crystal represented by the solid line, in the single crystal represented by the dotted line, it may be seen that a sound pressure level increases in 300 Hz to 1 kHz. For example, comparing with the poly-crystal represented by the solid line, in the single crystal represented by the dotted line, it may be seen that a sound pressure level increases by about 11.5 dB in 300 Hz to 1 kHz.

Comparing with the poly-crystal represented by the solid line, in the single crystal represented by the dotted line, it may be seen that a sound pressure level increases in 1 kHz to 8 kHz. For example, comparing with the poly-crystal represented by the solid line, in the single crystal represented by the dotted line, it may be seen that a sound pressure level increases by about 2.7 dB in 1 kHz to 8 kHz.

According to an example embodiment of the present disclosure, comparing with the poly-crystal represented by the solid line, in the single crystal represented by the dotted line, it may be seen that a sound pressure level increases in 300 Hz to 8 kHz. For example, comparing with the poly-crystal represented by the solid line, in the single crystal represented by the dotted line, it may be seen that a sound pressure level increases by about 5.9 dB in 300 Hz to 8 kHz.

Accordingly, according to an example embodiment of the present disclosure, a vibration device may be configured with a first vibration portion including a single crystal, thereby providing an apparatus including a vibration device where a sound pressure level of the low-pitched sound band is enhanced.

Figure 29:
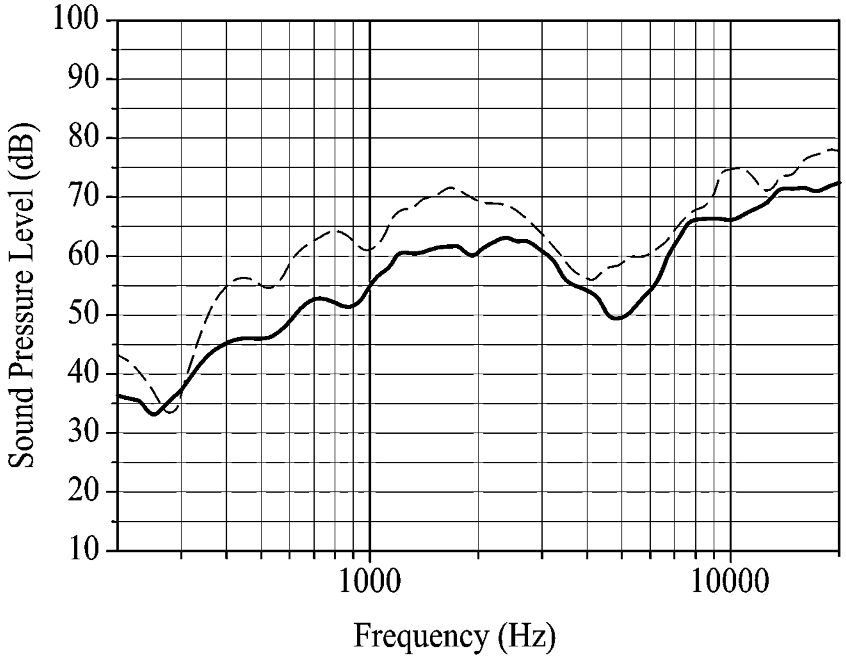
FIG. 29 illustrates a sound output characteristic of an apparatus according to an example embodiment of the present disclosure.

FIG. 29 illustrates a sound output characteristic of an apparatus according to an example embodiment of the present disclosure.

A method of measuring a sound output characteristic may be the same or substantially the same as the description given above with reference to FIG. 28, and thus, its repetitive description may be omitted.

A dotted line of FIG. 29 represents a sound output characteristic when a second vibration portion having a poly-crystal is provided, and a solid line represents a sound output characteristic when a first vibration portion and a second vibration portion are provided. For example, the solid line represents a sound output characteristic of the vibration device of FIG. 5D.

With reference to FIG. 29, comparing with the solid line, in the dotted line, it may be seen that a sound pressure level increases in 1 kHz or less. For example, comparing with the solid line, in the dotted line, it may be seen that a sound pressure level increases in 300 Hz to 1 kHz. For example, comparing with the solid line, in the dotted line, it may be seen that a sound pressure level increases by about 8.9 dB in 300 Hz to 1 kHz.

Comparing with the solid line, in the dotted line, it may be seen that a sound pressure level increases in 1 kHz to 10 kHz. For example, comparing with the solid line, in the dotted line, it may be seen that a sound pressure level increases by about 5.8 dB in 1 kHz to 10 kHz.

Comparing with the solid line, in the dotted line, it may be seen that a sound pressure level increases in 10 kHz to 20 kHz. For example, comparing with the solid line, in the dotted line, it may be seen that a sound pressure level increases by about 4.8 dB in 8 kHz to 10 kHz.

According to an example embodiment of the present disclosure, comparing with the solid line, in the dotted line, it may be seen that a sound pressure level increases in 300 Hz to 20 kHz. For example, comparing with the solid line, in the dotted line, it may be seen that a sound pressure level increases by about 6.5 dB in 300 Hz to 8 kHz.

Accordingly, according to an example embodiment of the present disclosure, a vibration device may be configured with a first vibration portion including a single crystal and a second vibration portion including a poly-crystal, thereby providing an apparatus including a vibration device where a sound pressure level of the low-pitched sound band is enhanced. For example, a sound pressure level of the low-pitched sound band and the high-pitched sound band may be enhanced, and an apparatus including a vibration device where a sound pressure level of a uniform pitched sound band is enhanced may be provided.

A vibration device according to one or more example embodiments of the present disclosure may be applied to a vibration device disposed at an apparatus. The apparatus according to one or more example embodiments of the present disclosure may be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, and home appliances, or the like. In addition, a vibration device according to one or more example embodiments of the present disclosure may be applied to organic light-emitting lighting apparatuses or inorganic light-emitting lighting apparatuses. When a vibration device according to one or more example embodiments of the present disclosure is applied to lighting apparatuses, the lighting apparatuses may act as lighting and a speaker. In addition, when a vibration device according to one or more example embodiments of the present disclosure is applied to a mobile device, or the like, the vibration device may be one or more of a speaker, a receiver, and a haptic device, but embodiments of the present disclosure are not limited thereto.

An apparatus and features according to one or more example embodiments of the present disclosure are described below.

An apparatus according to one or more example embodiments of the present disclosure may comprise a vibration member, and a vibration device configured to vibrate the vibration member, the vibration device may be configured to comprise a first vibration portion and a second vibration portion which is different from the first vibration portion.

According to one or more example embodiments of the present disclosure, the first vibration portion may comprise a plurality of first portions and a second portion between the plurality of first portions, and the second vibration portion may comprise a plurality of first portions and a second portion between the plurality of first portions.

According to one or more example embodiments of the present disclosure, the plurality of first portions of the first vibration portion may be configured to comprise a piezoelectric material which is different from a material of each of the plurality of first portions of the second vibration portion.

According to one or more example embodiments of the present disclosure, the first vibration portion may comprise single-crystalline ceramic, and the second vibration portion may comprise polycrystalline ceramic.

According to one or more example embodiments of the present disclosure, the second portion of the first vibration portion may be configured with a material having a modulus which is different from a modulus of the second portion of the second vibration portion.

According to one or more example embodiments of the present disclosure, a modulus of the second portion of the first vibration portion may be lower than a modulus of the second portion of the second vibration portion.

According to one or more example embodiments of the present disclosure, the second portion of the first vibration portion may be configured with a material which is different from a material of the second portion of the second vibration portion.

According to one or more example embodiments of the present disclosure, the second portion of the first vibration portion may be configured with a material which is softer than a material of the second portion of the second vibration portion.

According to one or more example embodiments of the present disclosure, the second portion of the first vibration portion may comprise silicone resin, and the second portion of the second vibration portion may comprise epoxy resin.

According to one or more example embodiments of the present disclosure, the vibration device may comprise a first electrode portion at a first surface of each of the first vibration portion and the second vibration portion, and a second electrode portion at a surface different from the first surface of each of the first vibration portion and the second vibration portion.

According to one or more example embodiments of the present disclosure, the vibration device may further comprise a first cover member at the first electrode portion, and a second cover member at the second electrode portion.

According to one or more example embodiments of the present disclosure, the apparatus may further comprise a first adhesive layer between the first cover member and the first electrode portion, and a second adhesive layer between the second cover member and the second electrode portion.

According to one or more example embodiments of the present disclosure, each of the first adhesive layer and second adhesive layer may include an electrically insulating material.

According to one or more example embodiments of the present disclosure, the vibration device may comprise at least two or more vibration generating portions, and each of the at least two or more vibration generating portions may comprise the first vibration portion, the second vibration portion, the first electrode portion, and the second electrode portion.

According to one or more example embodiments of the present disclosure, the vibration member may comprise a first region and a second region, the vibration device may comprise a first vibration device disposed at the first region and a second vibration device disposed at the second region, and each of the first vibration device and the second vibration device may comprise the first vibration portion and the second vibration portion.

According to one or more example embodiments of the present disclosure, the vibration device may comprise at least two or more vibration generators configured to vibrate in a same direction, and each of the at least two or more vibration generators may comprise the first vibration portion and the second vibration portion.

According to one or more example embodiments of the present disclosure, the vibration member may comprise a plate, and the vibration member may be configured to have a same size as a size of the plate.

According to one or more example embodiments of the present disclosure, the vibration member may comprise a metal material, or may comprise a single nonmetal material or a composite nonmetal material of one or more of wood, plastic, glass, fiber, cloth, paper, rubber, carbon, a mirror, and leather.

According to one or more example embodiments of the present disclosure, the vibration member may comprise one or more of a display panel including a pixel configured to display an image, a light emitting diode lighting panel, an organic light emitting lighting panel, and an inorganic light emitting lighting panel.

According to one or more example embodiments of the present disclosure, the vibration member may comprise any one of a display panel including a pixel configured to display an image, a screen panel on which an image is to be projected from a display apparatus, a lighting panel, a signage panel, a vehicular interior material, a vehicular glass window, a vehicular exterior material, a building ceiling material, a building interior material, a building glass window, an aircraft interior material, an aircraft glass window, metal, wood, rubber, plastic, glass, fiber, cloth, paper, leather, carbon, and a mirror.

According to one or more example embodiments of the present disclosure, the apparatus may further comprise a first layer between the first vibration portion and the second vibration portion.

According to one or more example embodiments of the present disclosure, the first layer may be spaced apart from the first vibration portion, and the first layer may be spaced apart from the second vibration portion.

According to one or more example embodiments of the present disclosure, a first distance between the first vibration portion and the first layer may be adjusted not to restrain a vibration of the first vibration portion, and a second distance between the second vibration portion and the first layer may be adjusted not to restrain a vibration of the second vibration portion.

According to one or more example embodiments of the present disclosure, the vibration member may comprise first to $n^{th}$ regions, wherein n of the first to $n^{th}$ regions is a natural number of 2 or more. The apparatus according to one or more embodiments of the present disclosure may comprise a vibration generating apparatus disposed at a rear surface of the vibration member to vibrate the vibration member. The vibration generating apparatus may comprise first to $n^{th}$ vibration devices connected to the first to $n^{th}$ regions of the vibration member, respectively, wherein n of the first to $n^{th}$ vibration devices is a natural number of 2 or more. Each of the first to $n^{th}$ vibration devices may comprise the vibration device. One or more of the first to $n^{th}$ regions of the vibration member may be configured to output a sound having a pitched sound band which is different from a pitched sound band of a sound output from other one or more regions of the first to $n^{th}$ regions of the vibration member.

According to one or more example embodiments of the present disclosure, a size of the second vibration portion in each of the first to $n^{th}$ vibration devices may increase progressively toward a center of the vibration member from a respective one of the first region and the $n^{th}$ region of the vibration member.

According to one or more example embodiments of the present disclosure, the first vibration portion, rather than the second vibration portion, of each of the first to $n^{th}$ vibration devices may be closer to a periphery of the vibration member. Further, the second vibration portion, rather than the first vibration portion, of each of the first to $n^{th}$ vibration devices may be closer to a center of the vibration member.

According to one or more example embodiments of the present disclosure, a size of the first vibration portion in each of the first to $n^{th}$ vibration devices may increase progressively toward a periphery of the vibration member from a center of the vibration member.

According to one or more example embodiments of the present disclosure, when a position of an object listening to a sound of the vibration generating apparatus is a center of the vibration member, the center of the vibration member may be configured so that a size of the second vibration portion of each of the first to $n^{th}$ vibration devices, located closer to the center than a periphery of the vibration member, is greater than a size of the first vibration portion of a respective one of the first to $n^{th}$ vibration devices, and a size of the first vibration portion may be configured to become greater than a size of the second vibration portion in a direction distancing from the position of the object.

According to one or more example embodiments of the present disclosure, each of the first to $n^{th}$ vibration devices disposed close to an object of the apparatus may be configured so that a size of the second vibration portion of each of the first to $n^{th}$ vibration devices disposed close to the object is greater than a size of the first vibration portion of a respective one of the first to $n^{th}$ vibration devices disposed close to the object. Further, each of the first to $n^{th}$ vibration devices disposed far away from a position of the object of the apparatus may be configured so that a size of the first vibration portion of each of the first to $n^{th}$ vibration devices disposed far away from the position of the object is greater than a size of the second vibration portion of a respective one of the first to $n^{th}$ vibration devices disposed far away from the position of the object.

According to one or more example embodiments of the present disclosure, an exterior material may cover a main structure of a vehicular apparatus. An interior material may cover one or more of the main structure and the exterior material. One or more vibration generating apparatuses may be disposed at one or more among a region between the main structure and the exterior material, a region between the main structure and the interior material, the exterior material, and the interior material. The one or more vibration generating apparatuses may comprise the vibration device. The vibration member may be one or more of the exterior material and the interior material. One or more of the exterior material and the interior material may be configured to output sound based on vibrations of the one or more vibration generating apparatuses.

According to one or more example embodiments of the present disclosure, the interior material may comprise one or more materials of wood, rubber, plastic, glass, fiber, cloth, paper, metal, carbon, a mirror, and leather.

According to one or more example embodiments of the present disclosure, the interior material may comprise one or more of a dashboard, a pillar interior material, a roof interior material, a door interior material, a seat interior material, a handle interior material, a floor interior material, a rear view mirror, an overhead console, a glove box, a sun visor, and a rear package interior material of the vehicular apparatus; and the one or more vibration generating apparatuses may be configured to vibrate at least one or more of the dashboard, the pillar interior material, the roof interior material, the door interior material, the seat interior material, the handle interior material, the floor interior material, the rear view mirror, the overhead console, the glove box, the sun visor, and the rear package interior material.

According to one or more example embodiments of the present disclosure, the apparatus may further comprise a glass window, and a transparent vibration generating apparatus disposed at the glass window.

According to one or more example embodiments of the present disclosure, the glass window may include at least one or more of a front glass window, a side glass window, a rear glass window, and a roof glass window of the vehicular apparatus, and the transparent vibration generating apparatus may be configured to vibrate at least one or more of the front glass window, the side glass window, the rear glass window, and the roof glass window.

According to one or more example embodiments of the present disclosure, each of the one or more vibration generating apparatuses may comprise the vibration device. First one or more apparatuses of the one or more vibration generating apparatuses disposed at one or more positions close to an ear of a passenger of the vehicular apparatus may be configured so that a size of the second vibration portion of each of the first one or more apparatuses is greater than a size of the first vibration portion of a respective one of the first one or more apparatuses. Second one or more apparatuses of the one or more vibration generating apparatuses disposed at one or more positions far away from an ear of the passenger may be configured so that a size of the first vibration portion of each of the second one or more apparatuses is greater than a size of the second vibration portion of a respective one of the second one or more apparatuses.

It will be apparent to those skilled in the art that various modifications and variations can be made in the present disclosure without departing from the technical idea or scope of the present disclosure. Thus, it is intended that the present disclosure covers the modifications and variations of this disclosure provided they come within the scope of the appended claims and their equivalents.

What is claimed is:

1. An apparatus, comprising:
a vibration member; and
a vibration device configured to vibrate the vibration member,
wherein the vibration device is configured to comprise a first vibration portion and a second vibration portion which is different from the first vibration portion,
wherein the vibration device comprises:
a first electrode portion at a first surface of each of the first vibration portion and the second vibration portion; and
a second electrode portion at a second surface different from the first surface of each of the first vibration portion and the second vibration portion,
wherein the vibration device comprises at least two or more vibration generating portions, and
wherein each of the at least two or more vibration generating portions comprises the first vibration portion, the second vibration portion, the first electrode portion, and the second electrode portion.

2. The apparatus of claim 1, wherein:
the first vibration portion comprises a plurality of first portions and a second portion between the plurality of first portions; and
the second vibration portion comprises a plurality of first portions and a second portion between the plurality of first portions.

3. The apparatus of claim 2, wherein the plurality of first portions of the first vibration portion are configured to comprise a piezoelectric material which is different from a material of each of the plurality of first portions of the second vibration portion.

4. The apparatus of claim 2, wherein the second portion of the first vibration portion is configured with a material having a modulus which is different from a modulus of the second portion of the second vibration portion.

5. The apparatus of claim 2, wherein a modulus of the second portion of the first vibration portion is lower than a modulus of the second portion of the second vibration portion.

6. The apparatus of claim 2, wherein the second portion of the first vibration portion is configured with a material which is different from a material of the second portion of the second vibration portion.

7. The apparatus of claim 2, wherein the second portion of the first vibration portion is configured with a material which is softer than a material of the second portion of the second vibration portion.

8. The apparatus of claim 7, wherein:
the second portion of the first vibration portion comprises silicone resin; and
the second portion of the second vibration portion comprises epoxy resin.

9. The apparatus of claim 1, wherein:
the first vibration portion comprises single-crystalline ceramic; and
the second vibration portion comprises polycrystalline ceramic.

10. The apparatus of claim 1, wherein the vibration device further comprises:
a first cover member at the first electrode portion; and
a second cover member at the second electrode portion.

11. The apparatus of claim 10, further comprising:
a first adhesive layer between the first cover member and the first electrode portion; and
a second adhesive layer between the second cover member and the second electrode portion.

12. The apparatus of claim 11, wherein each of the first adhesive layer and the second adhesive layer includes an electrically insulating material.

13. The apparatus of claim 1, wherein:
the vibration member comprises a first region and a second region;
the vibration device comprises a first vibration device disposed at the first region and a second vibration device disposed at the second region; and
each of the first vibration device and the second vibration device comprises the first vibration portion and the second vibration portion.

14. The apparatus of claim 1, wherein:
the vibration device comprises at least two or more vibration generators configured to vibrate in a same direction; and
each of the at least two or more vibration generators comprises the first vibration portion and the second vibration portion.

15. The apparatus of claim 1, wherein:
the vibration member comprises a plate; and
the vibration member is configured to have a same size as a size of the plate.

16. The apparatus of claim 1, wherein the vibration member comprises a metal material, or comprises a single nonmetal material or a composite nonmetal material of one or more of wood, plastic, glass, fiber, cloth, paper, rubber, carbon, a mirror, and leather.

17. The apparatus of claim 1, wherein the vibration member comprises one or more of a display panel including a pixel configured to display an image, a light emitting diode lighting panel, an organic light emitting lighting panel, and an inorganic light emitting lighting panel.

18. The apparatus of claim 1, wherein the vibration member comprises any one of a display panel including a pixel configured to display an image, a screen panel on which an image is to be projected from a display apparatus, a lighting panel, a signage panel, a vehicular interior material, a vehicular glass window, a vehicular exterior material, a building ceiling material, a building interior material, a building glass window, an aircraft interior material, an aircraft glass window, metal, wood, rubber, plastic, glass, fiber, cloth, paper, leather, carbon, and a mirror.

19. The apparatus of claim 1, further comprising a first layer between the first vibration portion and the second vibration portion.

20. The apparatus of claim 1, wherein:
an exterior material covers a main structure of a vehicular apparatus;
an interior material covers one or more of the main structure and the exterior material;
one or more vibration generating apparatuses are disposed at one or more among a region between the main structure and the exterior material, a region between the main structure and the interior material, the exterior material, and the interior material;
the one or more vibration generating apparatuses comprise the vibration device;
the vibration member is one or more of the exterior material and the interior material; and
one or more of the exterior material and the interior material are configured to output sound based on vibrations of the one or more vibration generating apparatuses.

21. The apparatus of claim 20, wherein the interior material comprises one or more materials of wood, rubber, plastic, glass, fiber, cloth, paper, metal, carbon, a mirror, and leather.

22. The apparatus of claim 20, wherein:

the interior material comprises one or more of a dashboard, a pillar interior material, a roof interior material, a door interior material, a seat interior material, a handle interior material, a floor interior material, a rear view mirror, an overhead console, a glove box, a sun visor, and a rear package interior material of the vehicular apparatus; and the one or more vibration generating apparatuses are configured to vibrate at least one or more of the dashboard, the pillar interior material, the roof interior material, the door interior material, the seat interior material, the handle interior material, the floor interior material, the rear view mirror, the overhead console, the glove box, the sun visor, and the rear package interior material.

23. The apparatus of claim 20, further comprising:

a glass window; and a transparent vibration generating apparatus disposed at the glass window.

24. The apparatus of claim 23, wherein:

the glass window includes at least one or more of a front glass window, a side glass window, a rear glass window, and a roof glass window of the vehicular apparatus; and the transparent vibration generating apparatus is configured to vibrate at least one or more of the front glass window, the side glass window, the rear glass window, and the roof glass window.

25. The apparatus of claim 20, wherein:

each of the one or more vibration generating apparatuses comprises the vibration device;

first one or more apparatuses of the one or more vibration generating apparatuses disposed at one or more positions close to an ear of a passenger of the vehicular apparatus are configured so that a size of the second vibration portion of each of the first one or more apparatuses is greater than a size of the first vibration portion of a respective one of the first one or more apparatuses; and second one or more apparatuses of the one or more vibration generating apparatuses disposed at one or more positions far away from an ear of the passenger are configured so that a size of the first vibration portion of each of the second one or more apparatuses is greater than a size of the second vibration portion of a respective one of the second one or more apparatuses.

26. An apparatus, comprising:

a vibration member; and a vibration device configured to vibrate the vibration member, wherein the vibration device is configured to comprise a first vibration portion and a second vibration portion which is different from the first vibration portion, wherein the apparatus further comprises a first layer between the first vibration portion and the second vibration portion, and wherein the first layer is spaced apart from the first vibration portion, and the first layer is spaced apart from the second vibration portion.

27. The apparatus of claim 26, wherein a first distance between the first vibration portion and the first layer is adjusted not to restrain a vibration of the first vibration portion, and a second distance between the second vibration portion and the first layer is adjusted not to restrain a vibration of the second vibration portion.

28. An apparatus, comprising:

a vibration member; and a vibration device configured to vibrate the vibration member, wherein the vibration device is configured to comprise a first vibration portion and a second vibration portion which is different from the first vibration portion, and wherein:

the vibration member comprises first to $n^{th}$ regions, wherein n of the first to $n^{th}$ regions is a natural number of 2 or more;

the apparatus comprises a vibration generating apparatus disposed at a rear surface of the vibration member to vibrate the vibration member;

the vibration generating apparatus comprises first to $n^{th}$ vibration devices connected to the first to $n^{th}$ regions of the vibration member, respectively, wherein n of the first to $n^{th}$ vibration devices is a natural number of 2 or more;

each of the first to $n^{th}$ vibration devices comprises the vibration device; and one or more of the first to $n^{th}$ regions of the vibration member are configured to output a sound having a pitched sound band which is different from a pitched sound band of a sound output from other one or more regions of the first to $n^{th}$ regions of the vibration member.

29. The apparatus of claim 28, wherein a size of the second vibration portion in each of the first to $n^{th}$ vibration devices increases progressively toward a center of the vibration member from a respective one of the first region and the $n^{th}$ region of the vibration member.

30. The apparatus of claim 28, wherein:

the first vibration portion, rather than the second vibration portion, of each of the first to $n^{th}$ vibration devices is closer to a periphery of the vibration member; and the second vibration portion, rather than the first vibration portion, of each of the first to $n^{th}$ vibration devices is closer to a center of the vibration member.

31. The apparatus of claim 28, wherein a size of the first vibration portion in each of the first to $n^{th}$ vibration devices increases progressively toward a periphery of the vibration member from a center of the vibration member.

32. The apparatus of claim 28, wherein when a position of an object listening to a sound of the vibration generating apparatus is a center of the vibration member:

the center of the vibration member is configured so that a size of the second vibration portion of each of the first to $n^{th}$ vibration devices, located closer to the center than a periphery of the vibration member, is greater than a size of the first vibration portion of a respective one of the first to $n^{th}$ vibration devices; and a size of the first vibration portion is configured to become greater than a size of the second vibration portion in a direction distancing from the position of the object.

33. The apparatus of claim 28, wherein:

each of the first to $n^{th}$ vibration devices disposed close to an object of the apparatus is configured so that a size of the second vibration portion of each of the first to $n^{th}$ vibration devices disposed close to the object is greater than a size of the first vibration portion of a respective one of the first to $n^{th}$ vibration devices disposed close to the object; and each of the first to $n^{th}$ vibration devices disposed far away from a position of the object of the apparatus is configured so that a size of the first vibration portion of each of the first to $n^{th}$ vibration devices disposed far away from the position of the object is greater than a size of the second vibration portion of a respective one of the first to $n^{th}$ vibration devices disposed far away from the position of the object.

* * * * *